(12) United States Patent
Shchukin et al.

(10) Patent No.: US 7,949,031 B2
(45) Date of Patent: May 24, 2011

(54) OPTOELECTRONIC SYSTEMS PROVIDING HIGH-POWER HIGH-BRIGHTNESS LASER LIGHT BASED ON FIELD COUPLED ARRAYS, BARS AND STACKS OF SEMICONDUTOR DIODE LASERS

(75) Inventors: Vitaly Shchukin, Berlin (DE); Nikolai Ledentsov, Berlin (DE)

(73) Assignee: PBC Lasers GmbH, Berlin (DE)

( * ) Notice: Subject to any disclaimer, the term of this patent is extended or adjusted under 35 U.S.C. 154(b) by 322 days.

(21) Appl. No.: 12/200,127

(22) Filed: Aug. 28, 2008

(65) Prior Publication Data
US 2009/0116525 A1    May 7, 2009

Related U.S. Application Data

(63) Continuation-in-part of application No. 11/453,980, filed on Jun. 16, 2006, now Pat. No. 7,421,001, and a continuation-in-part of application No. 11/648,551, filed on Jan. 3, 2007, now Pat. No. 7,583,712.

(51) Int. Cl.
*H01S 3/08* (2006.01)
(52) U.S. Cl. ............... 372/92; 372/98; 372/99
(58) Field of Classification Search ............ 372/18, 372/29.016, 43.01, 50.12, 50.123, 20.124, 372/92, 97–99
See application file for complete search history.

(56) References Cited

U.S. PATENT DOCUMENTS

| | | | |
|---|---|---|---|
| 6,097,742 A | 8/2000 | Caprara et al. | |
| 6,239,901 B1 | 5/2001 | Kaneko | |
| 6,643,305 B2 * | 11/2003 | Bewley et al. | 372/45.01 |
| 6,928,099 B2 * | 8/2005 | Ledentsov et al. | 372/97 |
| 7,421,001 B2 * | 9/2008 | Shchukin et al. | 372/64 |
| 7,477,670 B2 * | 1/2009 | Abeles et al. | 372/50.12 |
| 2001/0033590 A1 * | 10/2001 | Yuri et al. | 372/45 |
| 2005/0018743 A1 * | 1/2005 | Volodin et al. | 372/102 |
| 2005/0040410 A1 | 2/2005 | Ledentsov et al. | |
| 2006/0103380 A1 | 5/2006 | Kochergin et al. | |
| 2006/0251134 A1 * | 11/2006 | Volodin et al. | 372/22 |
| 2006/0256832 A1 * | 11/2006 | Volodin et al. | 372/102 |
| 2008/0267246 A1 * | 10/2008 | Volodin et al. | 372/102 |

OTHER PUBLICATIONS

Novel concepts for injection lasers, Nikolai N. Ledentsov and Vitaly A. Shchukin, Opt. Eng. 41 (12), pp. 3919-3203, Dec. 2002.

(Continued)

*Primary Examiner* — Minsun Harvey
*Assistant Examiner* — Phillip Nguyen
(74) *Attorney, Agent, or Firm* — Ked & Associates LLP

(57) ABSTRACT

A semiconductor diode laser having a broad vertical waveguide and a broad lateral waveguide is disclosed emitting laser-light in a single vertical mode and a single lateral mode narrow beam. The vertical waveguide comprises a coupled cavity structure, wherein light, generated in the active medium placed in the first cavity leaks into the second cavity and returns back. Phase matching conditions govern the selection of a single vertical mode. A multi-stripe lateral waveguide comprises preferably a lateral photonic band crystal with a lateral optical defect created by selected pumping of multistripes. This approach allows the selection of a single lateral mode having a higher optical confinement factor and/ or a lower absorption loss and/or a lower leakage loss compared to the rest lateral optical modes. This enables a single lateral mode lasing from a broad area field coupled laser array. A laser system comprised of multiple field coupled laser arrays on a single wafer and a set of external mirrors enables an ultra-broad field coupled laser bar emitting a coherent laser light in a single vertical optical mode and a single lateral optical mode. A laser system comprised of multiple ultra-broad field coupled laser bars on different wafers and a set of external mirrors enables an ultra-broad field coupled laser stack emitting coherent laser light in a single vertical optical mode and a single lateral optical mode. This allows realization of ultrahigh power ultrahigh brightness laser systems based on semiconductor diode lasers.

70 Claims, 40 Drawing Sheets

OTHER PUBLICATIONS

Tilted Cavity Laser, V.A. Shchukin et al., Nanomodeling, edited by Akhlesh Lakhtakia, Sergey A. Maksimenko, Proceedings of SPIE vol. 5508, pp. 61-71, 2004.

Wavelength-stabilized tilted cavity quantum dot laser, N.N. Ledentsov et al., Institute of Physics Publishing, Semiconductor Science and Technology, pp. 1183-1188, 2004.

Edge and Surface-Emitting Tilted Cavity Lasers, N.N. Ledentsov et al., Physicians and Simulation of Optoelectric Devices XIII, Proc. Of SPIE vol. 5722, pp. 130-146, 2005.

High brilliance photonic band crystal lasers, V.A. Shchukin et al., Workshop on Optical Components for Broadband Communication, edited by Pierre-Yves Fonjallaz, Thomas P. Pearsall, Proc. of SPIE vol. 6350, pp. 635005-1-635005-15, 2006.

Wavelength-stabilized tilted wave lasers with a narrow vertical beam divergence, I.I. Novikov et al., IOP Publishing, Semiconductor Science and Technology, pp. 1-5, Apr. 23, 2008.

Large-area, single transverse-mode semiconductor laser with diffraction-limited super-Gaussian output, Greg Mowry and James R. Leger, Appl. Phys. Lett. 66(13), Mar. 27, 1995, pp. 1614-1616.

* cited by examiner (a)

(b)

(a)

(b)

(a)

(b)

(a)
Metal contacts on top of ridge stripes (b)
Dielectric in between contact pads (c)
Metal on top of dielectric (d)
Metal deposit covering the entire surface upon the contact annealing

OPTOELECTRONIC SYSTEMS PROVIDING HIGH-POWER HIGH-BRIGHTNESS LASER LIGHT BASED ON FIELD COUPLED ARRAYS, BARS AND STACKS OF SEMICONDUTOR DIODE LASERS

REFERENCE TO RELATED APPLICATIONS

This is a continuation-in-part of U.S. patent application Ser. No. 11/453,980, filed Jun. 16, 2006, now U.S. Pat. No. 7,421,001 entitled "EXTERNAL CAVITY OPTOELECTRONIC DEVICE", U.S. patent application Ser. No. 11/648,551, filed Jan. 3, 2007, now U.S. Pat. No. 7,583,712 entitled "OPTOELECTRONIC DEVICE AND METHOD OF MAKING SAME", and PCT Patent Application PCT/IB2007/1004283, filed Jun. 6, 2007, entitled "OPTOELECTRONIC DEVICE AND METHOD OF MAKING SAME". The aforementioned applications are hereby incorporated herein by reference.

BACKGROUND OF THE INVENTION

1. Field of the Invention

The invention pertains to the field of semiconductor optoelectronic devices. More particularly, the invention pertains to high-power high-brightness semiconductor diode lasers with a narrow beam divergence and to arrays, bars and stacks based thereupon.

2. Description of Related Art

There is a need in high-power semiconductor diode lasers for numerous application including, but not limited to welding, material processing, projection television, frequency conversion, etc. For these applications high power and high brilliance (power emitted in a unit solid angle) are of key importance.

Conventional prior art edge emitting laser have severe limitations. First, the output power is limited by the catastrophic optical mirror damage, and all technological improvements including facet passivation, zinc diffusion, or proton bombardment still have limitations in optical power density. To achieve higher power by keeping the same power density one needs using broad area lasers. However, the lasing from broad area lasers is typically multimode and also suffers from beam filamentation which renders the laser radiation not focusable.

Using semiconductor diode laser as pump source for pumping solid state laser is extremely expensive. Therefore there is a need in the art in semiconductor diode laser allowing high power narrow beam divergence single vertical mode single lateral mode lasing. The present application discloses an approach enabling the required solution.

Referring to prior art laser, the following should be noted. To ensure lasing in a single vertical mode, a laser with a narrow vertical waveguide is typically used. FIG. 1(a) shows schematically a cross-section of a prior art broad area edge-emitting laser (100) having a narrow vertical waveguide (103). By a narrow waveguide we mean a waveguide, the thickness of which does not exceed three times the wavelength of the emitted laser light in the vacuum. The narrow waveguide (103) in FIG. 1(a) is sandwiched between a bottom cladding layer (102) and a top cladding layer (109). The laser (100) is typically grown epitaxially on a substrate (101), which is preferably n-doped. Then the bottom cladding layer (102) is preferably n-doped, and the top cladding layer (109) is preferably p-doped. The waveguide (103) preferably comprises an n-doped part (104), an undoped or weakly n-doped part (105), an undoped active region (106), an undoped or weakly p-doped part (107), and a p-doped part (108). The active region comprises a double heterostructure, one or multiple quantum well, one or multiple layers of quantum wires, one or multiple layers of quantum dots, or any combination thereof. The active region generates light, when a forward bias (113) is applied. The bias is applied via a bottom n-type contact (111) mounted on a back side of the substrate (101) and a top p-type contact (112) which is preferably mounted on a heavily p-doped contact layer (110) grown on top of the top cladding layer (109). To ensure that the laser light (115) comes out from the front facet (116) and does not come out from the rear facet (117), an antireflecting coat formed from a multilayer dielectric structure is preferably deposited on the front facet (116), and a highly reflecting coat formed from a multilayer dielectric structure is preferably deposited on the rear facet (117).

FIG. 1(b) show schematically a view from the facet on the edge-emitting laser (100). A ridge stripe (118) is formed by selective etching on the top cladding layer (109), and the top contact (119) remains only on top of the ridge. To ensure a high output power, a broad area laser is typically fabricated, wherein the stripe width is about 50 micrometer or more.

Although a narrow waveguide can typically support only one vertical optical mode, a plurality of lateral optical modes can be present in the laser radiation. FIG. 2(a) shows schematically a view from the facet on the laser (100) showing schematically a fundamental lateral mode (221) and one of high-order lateral modes (222). Due to multi-mode lasing, the beam quality of the laser radiation from a broad area laser is low. In addition, filamentation can occur which even more deteriorates the beam quality and renders the laser beam not focusable.

Different approaches have been proposed to stabilize lateral modes, particularly in broad area lasers, by selective etching and overgrowth resulting in the resonant-antiguided array (so called ROW array) and the antiresonant reflecting optical waveguide (ARROW) concepts. One of such approaches is illustrated in FIG. 2(b) wherein dielectric insertions (231) in the waveguide are introduced to stabilize the lateral optical modes. FIG. 2(b) shows schematically a view from a facet on a prior art edge-emitting laser (200), in which insertions (231) of a foreign material are introduced into the waveguide. These insertions can have the refractive index either lower or higher than that of the waveguide and they serve to stabilize the lateral field of the optical mode emitted from the laser. Such approach includes complex and expensive technological steps, i.e. etching and overgrowth and in fact does not prevent multi-mode lasing.

Conventional multistripe processing, which is cost-effective, does not enable single mode operation either. Moreover, if conventional laser structures with a narrow waveguide are used, the optical field becomes localized separately under each stripe as shown in FIG. 3(a). FIG. 3(a) shows schematically a view from a facet on a prior art edge-emitting laser (300) with multiple ridges (318). Top contact is usually mounted on the ridges. The profile of the injection current in the active region depends on the particular current spreading profile. Typically, optical gain in the active region is generated underneath the stripes, and in the other parts of the active region, the active medium remains absorbing. The lateral optical modes in a waveguide narrow in the vertical direction are generated under each of the stripes, as is shown schematically (321). The lateral optical modes generated under neighboring stripes, do not overlap. This hinders the formation of a single coherent optical field and thus leads to filamentation of the emitted laser light, and no benefit in brightness or focuseability may be expected.

Thus, there exists a strong need in the art for broad area filament-free, single lateral mode lasers having a narrow lateral beam divergence. Solving the above problem is possible with the present invention.

SUMMARY OF THE INVENTION

The present invention discloses a semiconductor optoelectronic system providing high power narrow beam single vertical mode single lateral mode laser light.

In one embodiment of the present invention, a semiconductor optoelectronic device operating in a single lateral mode up to effective lateral output apertures is proposed. The device is based on an multilayer epitaxial structure operating as an effective broad vertical waveguide, which enables extension of the vertical near field up to a size exceeding three times the wavelength of light in the vacuum and beyond. In a preferred embodiment, the selection of a single vertical optical mode in a broad vertical waveguide is based on the phase matching effect. The vertical waveguide comprises two coupled cavities connected by a reflector. Light is generated in an active region placed in a first, thin cavity and partially leaks into a second, thick cavity, is reflected from the back side of the second cavity and returns to the active region, where it undergoes interference with light propagating in the first cavity. Phase matching conditions, and, hence, constructive interference are met for only one vertical mode which enables single vertical mode operation of the device. In one embodiment, the second thick cavity is just a substrate having preferably a mirror-like back side. In another embodiment, the second cavity is a thick epitaxially grown layer or a multilayer structure.

On top of a broad single mode vertical waveguide, multi stripe pattern is formed by partial etching of the top cladding layer. In one group of embodiments, only part of the stripes is pumped, and optical gain is generated only in the part of the active medium underneath the pumped stripes. Light generated in the pumped region of the active medium leaks in the lateral plane to the neighboring regions, is reflected back and undergoes interference with light propagating along the stripes in the pumped region. Phase matching conditions, and, hence, constructive interference are met for only one vertical mode which enables single lateral mode operation of a broad area device.

In another group of embodiments, a lateral photonic band crystal is formed by etching on top of the top cladding layer of the device representing a periodic or quasi-periodic array of ridges. A deviation from the periodic profile, a so called optical defect is introduced, which is capable to localize lateral optical modes. Such localizing optical defect can be formed by one or a few ridges which are broader than the rest of the ridges, or comprise additional dielectric layers selectively deposited. The strength of the optical defect is preferably selected such that only one, preferably fundamental optical mode is localized at the optical defect and decays away from the optical defect whereas the rest of the optical modes are extended throughout the entire lateral photonic band crystal. Then the optical confinement factor of the lateral optical mode in the gain region is significantly larger for the fundamental lateral mode than for the other lateral modes which enables single lateral mode lasing from a broad area device.

In yet another group of embodiments, the specific optical defect is formed by selective injection of current to the light-generating layer only within the part of the photonic crystal structure and not injecting current in the rest of the structure. The optical gain is generated in the part of the light-generating layer within the optical defect, and the current is not injected in the light generating layer in the rest part.

The leakage regions can be additionally formed on the sides from the lateral photonic band crystal. The lateral optical modes are discriminated in leakage loss and/or absorption loss. The single lateral mode light radiation can be obtained, upon a particular selection of a lateral photonic band crystal and a lateral optical defect, either in a fundamental optical mode providing a triple-lobe lateral far-field pattern, or in one of high-order lateral optical mode, providing a symmetric two-lobe far-field pattern, depending on the design. Special selection of a part of the lateral photonic band crystal close to its edge can enhance the discrimination of the lateral modes in leakage loss.

The preferred embodiment combines a lateral photonic band crystal with the particular design of the epitaxial structure providing a large spatial vertical extension of the vertical optical mode. This ensures radiation of light having a single vertical mode, a low vertical beam divergence, a single lateral mode, and a low lateral beam divergence.

Further groups of embodiments refer to laser systems which allow using ultrabroad lateral waveguides and obtaining ultra high power of the laser radiation. A laser system is disclosed, comprising at least two optoelectronic devices with ultrabroad optical waveguides, wherein the waveguides are preferably broader than five times the wavelength of light in the vacuum, and at least one external mirror. Each of the optoelectronic devices emits light preferably in a single optical mode. The optoelectronic devices alone can operate as gain chips, light-emitting diodes, or superluminescent light-emitting diodes. The optoelectronic devices alone can also operate as diode lasers, each of which emits laser light in one or in a plurality of optical modes, but the light emitted by different optoelectronic devices is not optically coupled. At least one external mirror provides positive feedback for the combined optical modes of the system such, that the system emits laser light in a single mode. A broad waveguide of each optoelectronic device is highly preferable to ensure effective coupling of the devices. In addition, the far-field pattern of the light emitted by each of the optoelectronic devices should preferably contain two narrow side lobes, to ensure effective optical coupling of neighboring devices.

In one set of embodiments of the present invention, a system comprises an array of optoelectronic devices on a single wafer, wherein each of the devices emits a single lateral mode light having a low lateral beam divergence, and an array of external mirrors. The system operates in an edge-emitting geometry. Each optoelectronic device can be realized as a device having a lateral broad waveguide, a lateral flared waveguide, or a lateral photonic band crystal. In one embodiment of the present invention, each optoelectronic device operates as a gain chip. Each device comprises a lateral photonic band crystal. The gain chip emits light preferably in a single lateral mode, wherein emitted light has a three-lobe lateral far-field pattern. Light coming out in the side lobes from each pair of neighboring gain chips, impinges on a single mirror, thus providing optical coupling between light emitted by different gain chips. The array of gain chips and the array of external mirrors are selected such that the system emits laser light in a single lateral mode having a single-lobe far-field pattern with a narrow lateral beam divergence. Both a broad lateral waveguide and a thick vertical waveguide of each optoelectronic device in the system are preferred to ensure effective coupling of light emitted by each device and the formation of a single mode coherent laser light. This approach allows fabrication of an ultrabroad field coupled laser bar enabling ultrahigh power ultrahigh brightness lasing.

In another embodiment of the present invention, each optoelectronic device emits light in a single lateral mode, wherein the emitted light has a two-lobe lateral far field. The array of mirrors is selected such that the system is capable to emit laser light in a single lateral optical mode, this emitted laser light also having a two-lobe lateral far field pattern.

In yet another embodiment of the present invention, the feedback between light emitted by each optoelectronic device is provided by one or two external mirrors extended over the entire width of the lateral waveguide.

Further embodiments of the present invention are possible wherein a laser system comprises a few bars each of which is fabricated on a separate epitaxial wafer, and an array of external mirrors which couples both light emitted by optoelectronic devices on the same wafer and light emitted by optoelectronic devices on neighboring wafers. The devices and the external mirrors are selected such that the laser system provides laser light in a single lateral optical mode extended throughout all bars.

And yet another embodiment of the present invention includes a laser system comprising a stack of a few bars each of which is fabricated on a separated epitaxial wafer, and an array of external mirrors which couples both light emitted by optoelectronic devices on the same wafer and light emitted by optoelectronic devices on neighboring wafers. The devices and the external mirrors are selected such that the laser system provides coherent laser light in a single lateral optical mode extended throughout the entire stack. This approach allows fabrication of a field coupled laser stack enabling ultrahigh power ultrahigh brightness lasing.

Laser systems disclosed allow obtaining an ultra-high output power and ultra-high output power density, which is of high importance for numerous applications, including, but not limited to welding, material processing, projection television, frequency conversion (including intracavity frequency conversion), telecom applications, etc.

Additionally, an electrooptical modulator element can be used in a laser of the present disclosure, wherein modulation of the refractive index in a part of the waveguide results in a frequency modulation of the emitted light, i.e. in modulation of the wavelength of the emitted laser light. This approach can provide an efficient speckle reduction.

DETAILED DESCRIPTION OF THE INVENTION

Figure 1:
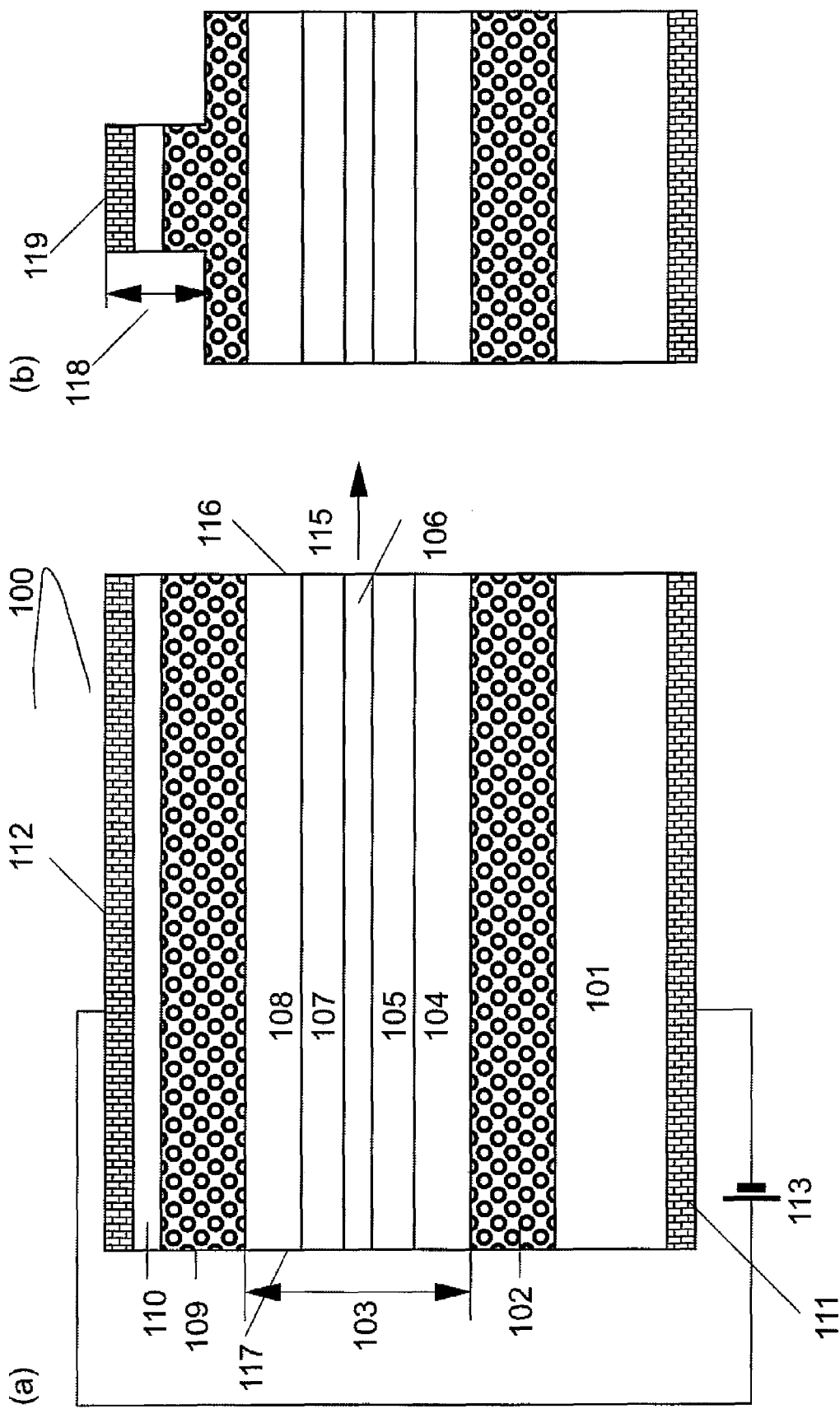
FIG. 1(a). Schematic cross sectional view of a prior art conventional edge-emitting laser.
FIG. 1(b). Schematic view from the facet of a prior art conventional edge emitting laser.
Figure 2A:
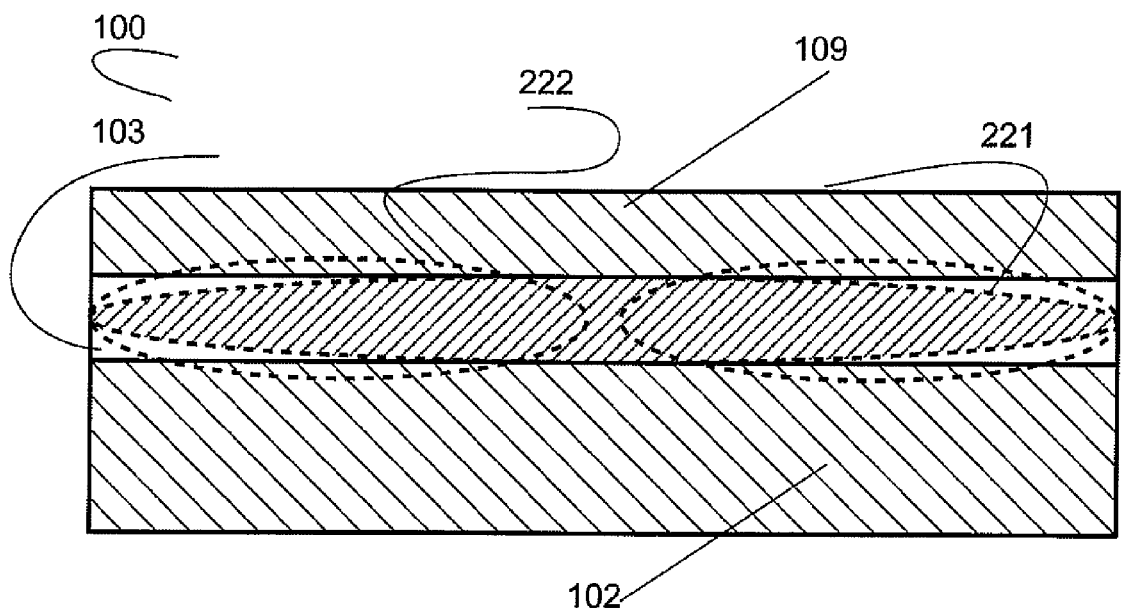
FIG. 2(a). Schematic view from the facet on a prior art edge-emitting laser showing multimode behavior.
Figure 2B:
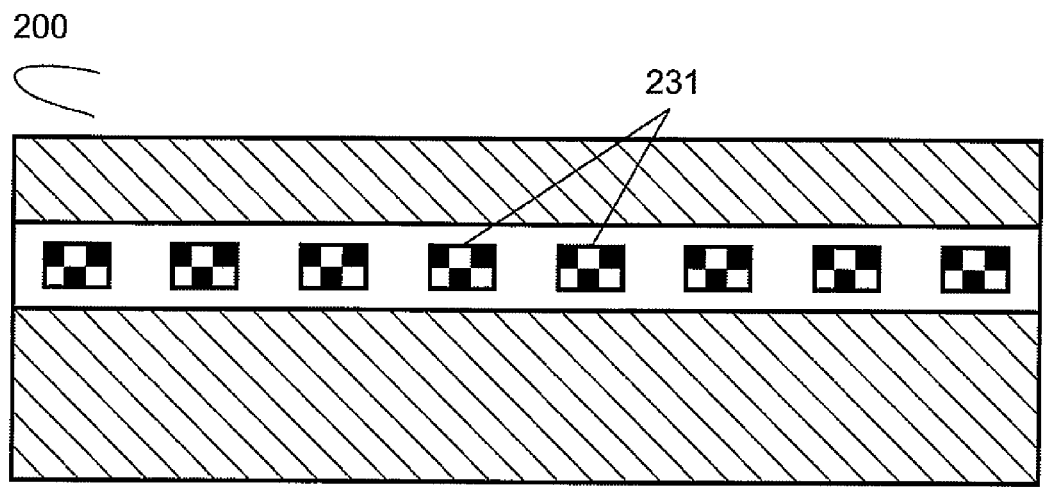
FIG. 2(b). Schematic view from the facet on a prior art edge emitting laser comprising insertions having a different refractive index for stabilizing the lateral optical field.
Figure 3:
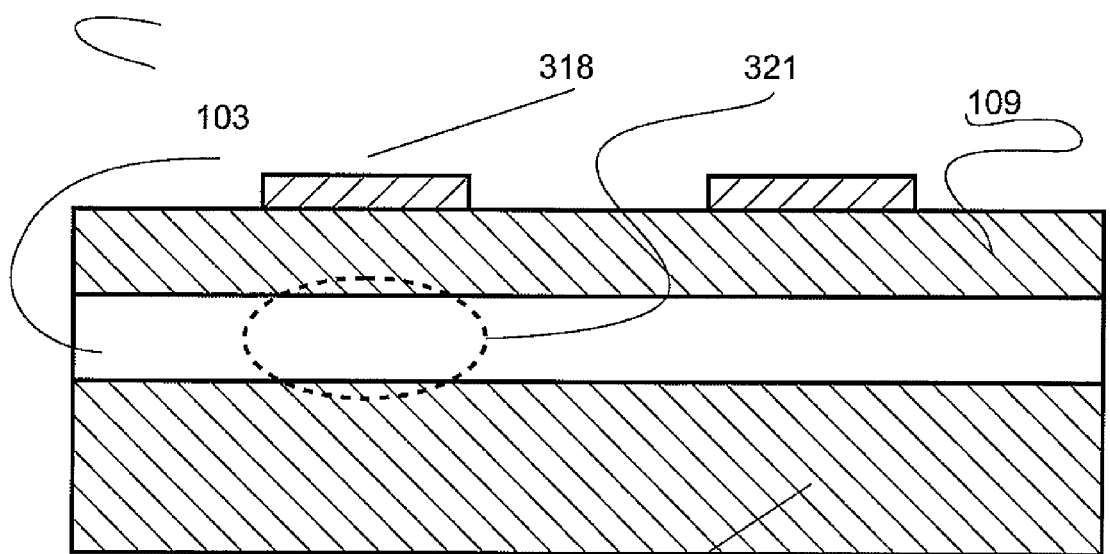
FIG. 3(a). Array of ridge stripes on top of a conventional edge-emitting laser with a narrow vertical waveguide.
FIG. 3(b). Array of ridge stripes on top of a conventional edge-emitting laser with a broad vertical waveguide where optical fields generating under each stripe overlap creating a coherent lateral optical field throughout the entire laser structure.
Figure 3:
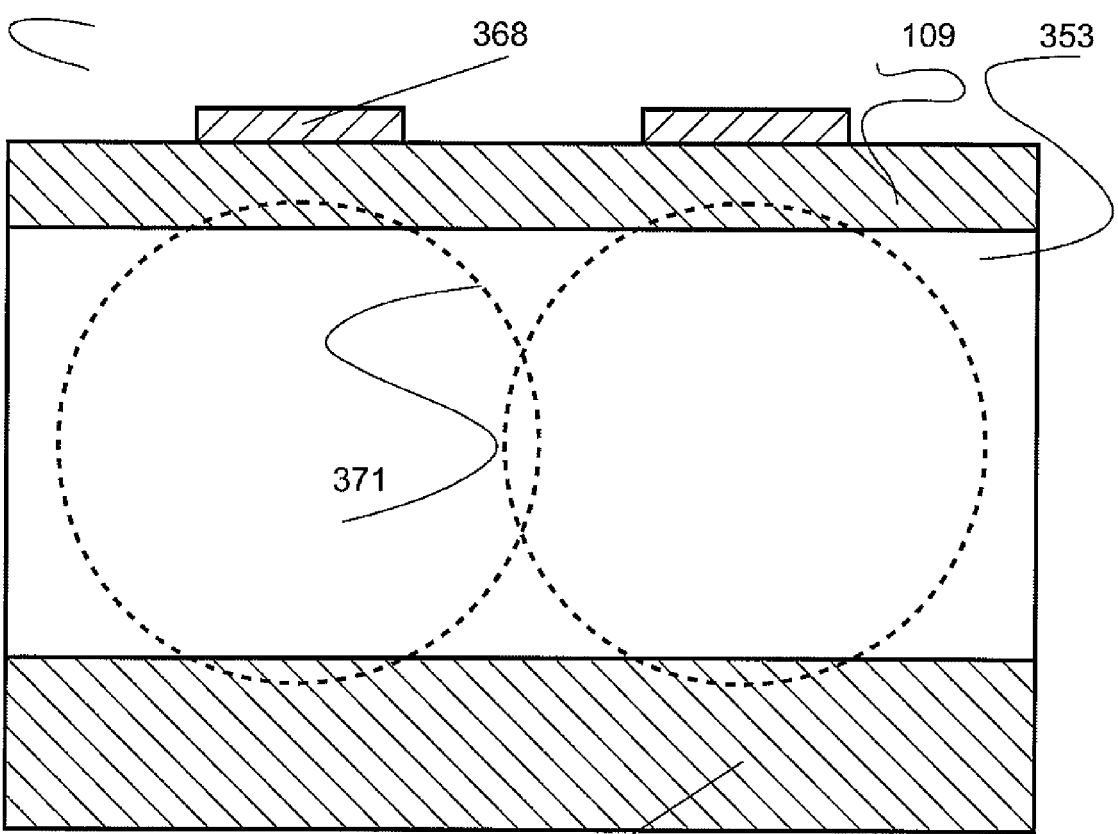

FIG. 3(b) shows a different situation as compared to FIG. 3(a). The laser (350) contains a waveguide (353) which is broad in the vertical direction. This means that the waveguide is preferably broader than three times the wavelength of the generated laser light in the vacuum. Let, for example, the waveguide have a width of 10 micrometers. This can be comparable with the lateral distance between the centers of neighboring ridges (368). In this case, the profile of the optical field generated underneath each ridge has a shape close to the round shape (371), and optical fields generated underneath neighboring ridges, can overlap. Then, a coherent lateral optical field can be created across the laser.

A serious obstacle which typically hinders using a broad vertical waveguide is connected with the fact that the lasing from a broad waveguide is usually multi-mode. Special new concepts have to be implemented in order to ensure a single vertical mode lasing from a broad vertical waveguide. Such concept has been proposed in co-pending patent application Ser. Nos. 11/453,980, filed Jun. 16, 2006, entitled "EXTERNAL CAVITY OPTOELECTRONIC DEVICE", U.S. patent application Ser. No. 11/648,551, filed Jan. 3, 2007, entitled "OPTOELECTRONIC DEVICE AND METHOD OF MAKING SAME", by the inventors of the present invention, whereas these applications are incorporated herein by reference.

Figure 4:
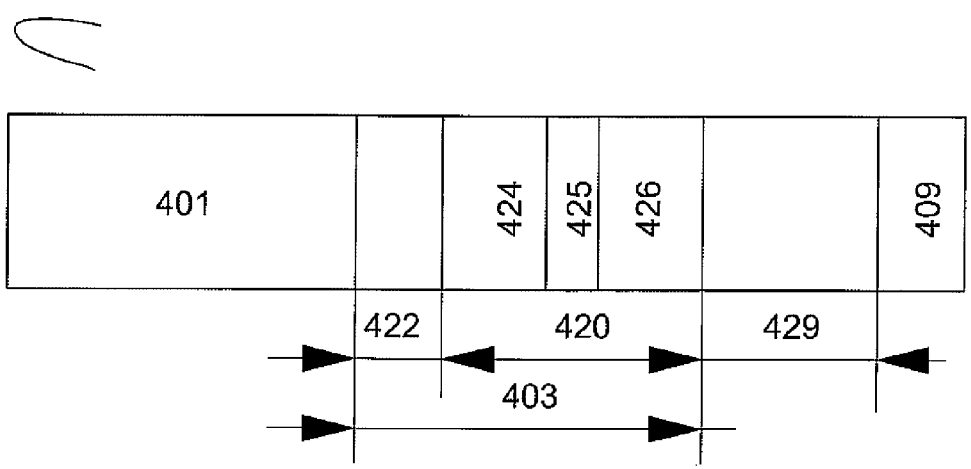
FIG. 4(a). Schematic diagram of an edge emitting laser with a strong leakage of the optical mode to the substrate.
FIG. 4(b). Refractive index profile of the structure of FIG. 4(a).
Figure 4:
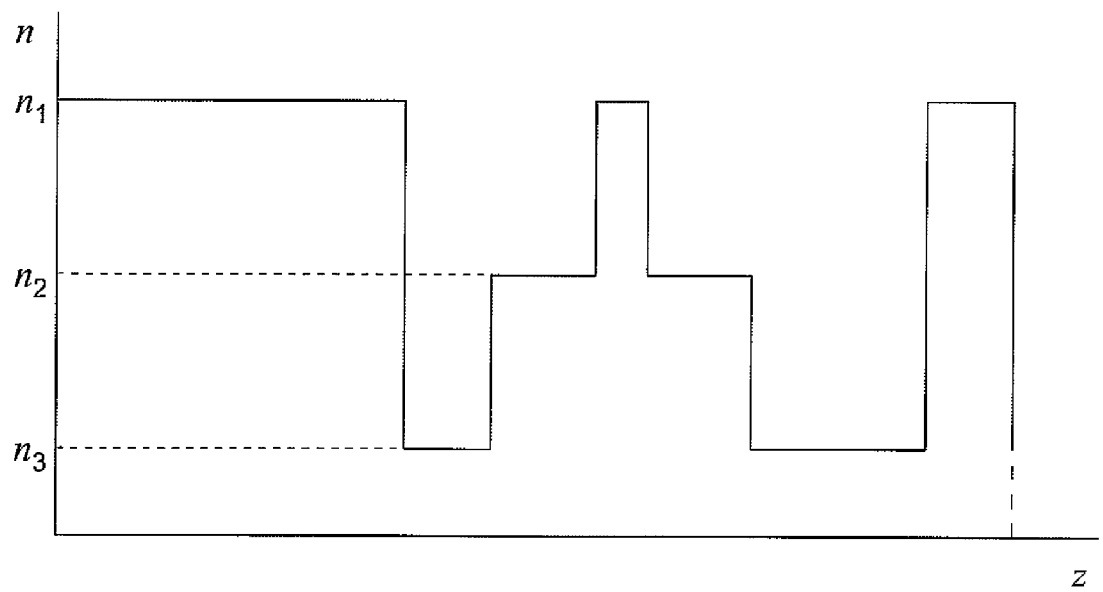

FIG. 4 illustrates means to ensure a single vertical mode lasing from a broad waveguide. The device employs a leaky waveguide, wherein light generated in the active region placed within the waveguide leaks essentially to a substrate or to a second waveguide, or a second cavity, is reflected back, and returns to the active region. FIG. 4(*a*) shows schematically an optical structure (400) of an edge-emitting laser. The device comprises a substrate (401), a waveguide (403), a top cladding layer (429), and a top contact layer (409). The waveguide (403) further comprises a narrow bottom cladding layer (422), and a central part (420) of the waveguide (403), wherein this central part (420) contains a layer (424), an active region (425), and a layer (426). FIG. 4(*b*) shows schematically the refractive index profile of the structure of FIG. 4(*a*).

A decrease of the thickness of the bottom cladding layer (422) leads to an increase in leaky loss as the tunneling of the optical mode to the substrate becomes stronger. A decrease of the thickness of the central part (420) of the waveguide also results in an increase in leaky loss as the optical mode is squeezed out of the waveguide. A decrease of the refractive index $n_2$ of the layers (424) and (426) also results in an increase of the leaky loss and an increase of the leaky angle $\vartheta_{leaky}$. In a more complicated waveguide structure, the leaky angle is governed by the relationship between the refractive index of the substrate (401) and the effective refractive index of the optical mode.

Figure 5:
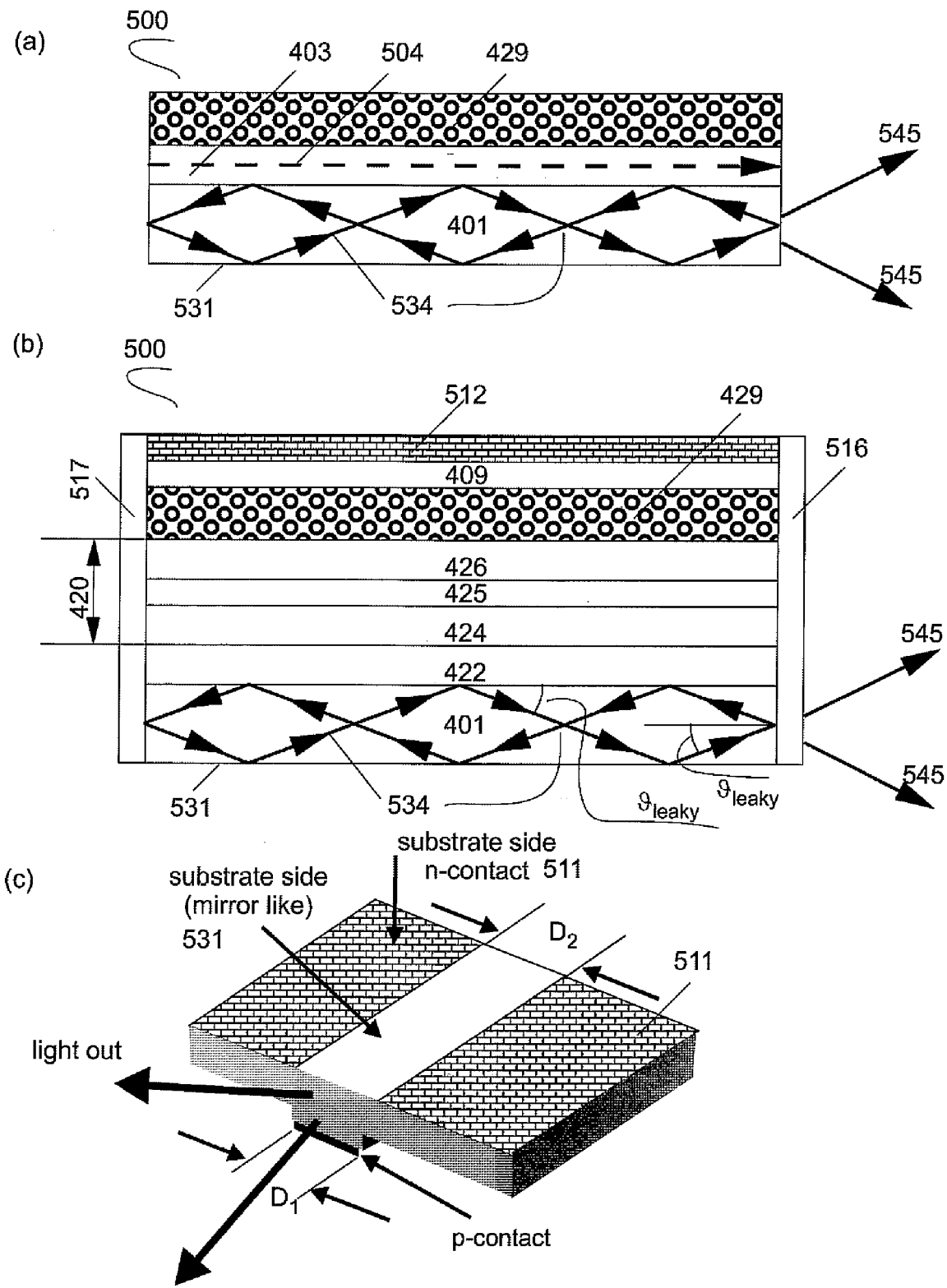
FIG. 5(a) shows a schematic diagram of a device employing the phase matching effect for the vertical optical modes based on the optical mode leaking to the substrate and reflecting from the back side of the substrate.
FIG. 5(b) shows a schematic diagram of the device of FIG. 5(a) in more detail.
FIG. 5(c) shows a schematic diagram of a device of FIG. 5(c) with an example of one of possible processing layouts.

FIG. 5(*a*) shows a schematic diagram of a laser (500) disclosed in the co-pending patent application U.S. Ser. No. 11/453,980, filed Jun. 16, 2006, entitled "EXTERNAL CAVITY OPTOELECTRONIC DEVICE", by the inventors of the present invention. The device comprises a substrate (401), a waveguide (403), and a top cladding layer (429). The light generated within the waveguide propagates along the waveguide, which is shown schematically by the dashed line (504). Light propagating along the waveguide leaks to the substrate (401), propagates through the substrate, is reflected back from the back surface (531) of the substrate, and returns to the waveguide (403). Light in the substrate forms a tilted optical mode, or tilted wave (534). As the substrate thickness, which typically ranges from 50 to 300 micrometers significantly exceeds the thickness of the waveguide (403), the output light comes mainly from the substrate. The output light is emitted in two vertical lobes (545).

FIG. 5(*b*) shows a schematic diagram of a device (500) in more detail. The substrate (401) is formed from any III-V semiconductor material or III-V semiconductor alloy. For example, GaAs, InP, GaSb. GaAs or InP are generally used depending on the desired emitted wavelength of laser radiation. Alternatively, sapphire, SiC or [111]-Si is used as a substrate for GaN-based lasers, i.e. laser structures, the layers of which are formed of GaN, AlN, InN, or alloys of these materials. The substrate (401) is preferably doped by an n-type, or donor impurity. Possible donor impurities include, but are not limited to S, Se, Te, and amphoteric impurities like Si, Ge, Sn, where the latter are introduced under such technological conditions that they are incorporated predominantly into the cation sublattice to serve as donor impurities.

The n-doped bottom cladding layer (422) is formed from a material lattice-matched or nearly lattice-matched to the substrate (401) is transparent to the generated light, and is doped by a donor impurity. In the case of a GaAs substrate (401), the n-doped cladding layer is preferably formed of a GaAlAs alloy.

The n-doped layer (424) of the waveguide (420) is formed from a material lattice-matched or nearly lattice-matched to the substrate (401), is transparent to the generated light, and is doped by a donor impurity. In the case of a GaAs substrate, the n-doped layer (424) of the waveguide is preferably formed of GaAlAs alloy having an Al content lower than that in the n-doped cladding layer (422).

The p-doped layer (426) of the waveguide (420) is formed from a material lattice-matched or nearly lattice-matched to the substrate (401), is transparent to the generated light, and is doped by an acceptor impurity. Preferably, the p-doped layer (426) of the waveguide is formed from the same material as the n-doped layer (424) but doped by an acceptor impurity. Possible acceptor impurities include, but are not limited to, Be, Mg, Zn, Cd, Pb, Mn and amphoteric impurities like Si, Ge, Sn, where the latter are introduced under such technological conditions that they are incorporated predominantly into the anion sublattice and serve as acceptor impurities.

The p-doped cladding layer (429) is formed from a material lattice-matched or nearly lattice-matched to the substrate (401), transparent to the generated light, and doped by an acceptor impurity.

The p-contact layer (409) is preferably formed from a material lattice-matched or nearly lattice matched to the substrate, is transparent to the generated light, and is doped by an acceptor impurity. The doping level is preferably higher than that in the p-cladding layer (429).

The metal contacts (511) and (512) are preferably formed from the multi-layered metal structures. The metal n-contact (511) is preferably formed from a structure including, but not limited to the structure Ni—Au—Ge. Metal p-contacts (512) are preferably formed from a structure including, but not limited to, the structure Ti—Pt—Au.

A window is formed on the back side of the substrate, where no bottom, or n-contact (511) is deposited, and the back substrate surface is mirror-like.

The confinement layer (425) is formed from a material lattice-matched or nearly lattice-matched to the substrate (401), is transparent to the generated light and is either undoped or weakly doped. The active region is preferably placed within the confinement layer (425) is preferably formed by any insertion, the energy band gap of which is narrower than that of the layers (422), (424), (426) and (429). Possible active regions include, but are not limited to, a double heterostructure, a single-layer or a multi-layer system of quantum wells, quantum wires, quantum dots, or any combination thereof. In the case of a device on a GaAs-substrate, examples of the active region include, but are not limited to, a system of insertions of InAs, $In_{1-x}Ga_xAs$, $In_xGa_{1-x-y}Al_yAs$, $In_xGa_{1-x}As_{1-y}N_y$ or similar materials.

Highly reflecting coat (517) is preferably mounted on the rear facet of the device, and an anti-reflecting coat (516) is preferably mounted on the front facet of the device.

The device operates as follows. The active region generates gain, when a forward bias is applied. Light (504) generated in the leaky waveguide (420) leaks to the substrate (401). Light in the substrate propagates (534) at a certain leaky angle $\vartheta_{leaky}$ to the plane of the substrate surface. Light is reflected back from the back surface (531) of the substrate. Thus, in addition to the central part of the waveguide (420), wherein (420) may be considered as a first cavity, a second cavity is formed between the leaky waveguide (420) and the back surface of the substrate (531). Since the thickness of the substrate significantly exceeds the wavelength of light in the vacuum (preferred wavelengths of light range between 300 nm and 3 µm), the propagation of light in the substrate obeys the laws of geometrical optics. Therefore, in order to allow the exit of light from the substrate through the facet, it is necessary that the leaky angle $\vartheta_{leaky}$ is below the angle of the total internal reflection at the semiconductor-air interface. Then, light comes out (545) through the front facet forming preferably a two-lobe far-field pattern with narrow lobes.

If the back surface of the substrate is polished, the light reflects back to the active region layer and no significant part of the light is lost. The threshold current density is low, even if the nominal leakage loss from the waveguide (420) is high. Moreover, the light coming back from the substrate to the waveguide (403), interferes with light (504) propagating just along the waveguide (403). When phase matching conditions hold, constructive interference between light propagating in the waveguide (403) and light returned from the substrate occurs. The phase matching conditions are met only at certain wavelengths which results in wavelength selectivity. In different approaches, the back side of the substrate may be coated, etching may be applied to enable wavelength adjustment, gratings can be deposited to additionally improve wavelength stabilization or enabling grating outcoupling of the light through the substrate, and so on. One or a few coatings can be deposited on the back surface of the substrate to protect the mirror-like quality of the surface.

FIG. 5(c) shows a schematic diagram of a device with a reflection from the substrate surface with an example of one of possible processing layouts, where selective deposition of the bottom n-type contact (511) leaves some parts of the back substrate surface (531) uncovered forming a mirror like semiconductor/air interface enabling a mirror like reflection of light from the back side of the substrate.

The lasing of the device (500) occurs, when the phase matching conditions between the light (504) propagating along the waveguide (403) and light leaking to the substrate, propagating in the substrate (534), reflecting back from the back surface of the substrate (531), and returning to the active region (425), are met. This occurs only for selected vertical optical modes and for selected wavelengths, which enables both single vertical mode operation and wavelength-selective operation.

FIG. 6(a) illustrates the principle of the wavelength selection. Both the waveguide (420) and the substrate (401) may be considered as cavities, each of which confines optical modes. Optical modes confined in each of the cavity may be described by dispersion laws relating the wavelength of light in the optical mode and the effective tilt angle of the mode. The wavelength of the optical mode confined in the waveguide (420), as a function of the mode angle α, is described by a solid curve in FIG. 6(a). The wavelength of the optical modes confined in the substrate, as a function of the mode angle $\vartheta$, is given by dashed curves. The phase matching condition for the device (500) is met at an intersection point of the two curves. As the thickness of the substrate (401) significantly exceeds the thickness of the waveguide (420), the spacing between the optical modes of the substrate (401) in FIG. 5(a) is smaller than the spacing between the modes of the waveguide (420). The laser (500) generates laser light at one or a few selected wavelengths, at which phase matching conditions are met, and a constructive interference and, hence, a positive feedback occurs. Namely, these are wavelengths $\lambda_1$, $\lambda_2$, and $\lambda_3$ in FIG. 5(a). The spectrum of laser radiation is also illustrated in FIG. 6(b). If only one selected wavelength overlaps with the luminescence spectrum of the light-emitting device (500), the laser will generate wavelength-stabilized laser light.

The interaction between the optical modes confined in the waveguide (420) and the modes of the substrate (401) determines the optical mode of the entire device (500) and, hence, the far field pattern of the laser radiation. The far field pattern is shown schematically in FIG. 6(c). Generally, the far field pattern contains two narrow lobes generated from the substrate and a broad angular spectrum from the waveguide (420). If narrow far field is targeted, the waveguide (420) and the leaky angle $\vartheta$ are engineered preferably in such a way, to ensure that most of the optical power is emitted in the narrow lobes. Preferably, more than eighty percent of the total optical power is emitted in the narrow lobes.

Figure 7:
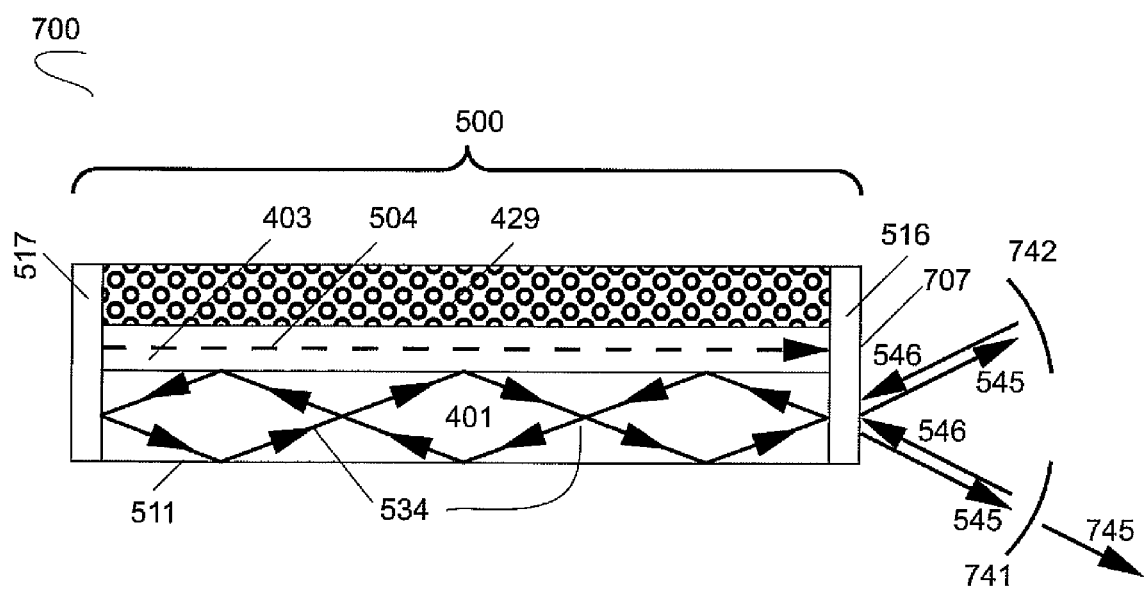
FIG. 7 shows a schematic representation of a laser employing phase matching effect for the vertical modes operating in the external cavity geometry allowing a single lobe vertical far field pattern.

If only a single lobe emission is targeted, this can be achieved by employing external mirrors. FIG. 7 shows a schematic diagram of an apparatus (700) enabling laser emission in a single narrow vertical lobe. Primarily, the laser (500) emits light which has a two-lobe far field (545). Correspondingly, two collecting mirrors (741) and (742) are used to reflect light back (546) to the facet. One of the mirrors (741) may be chosen semi-transparent to allow laser light coming out (745) having a single lobe far field. The apparatus (700) comprises an edge-emitting device (500), a first cavity between the facet (707) and the mirror (741), a second cavity between the facet (707) and the mirror (742), a non-transparent collecting mirror (742), and a semi-transparent collecting mirror (741).

Figure 8:
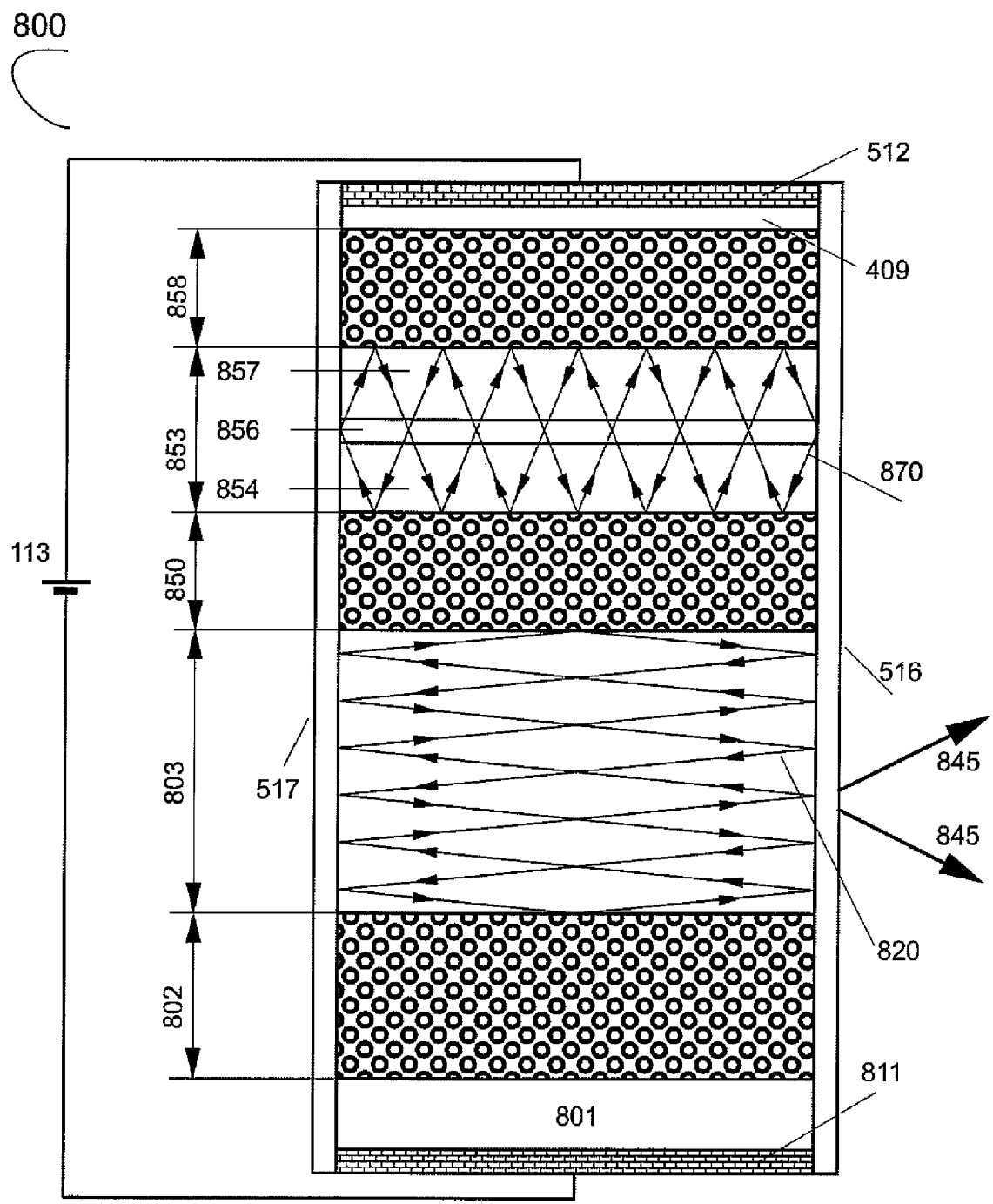
FIG. 8 shows a schematic diagram of a device employing the phase matching effect for the vertical optical modes in an epitaxial structure comprising two coupled cavities.

An alternative way of creating a single-mode vertical lasing from a broad vertical waveguide has been taught in the co-pending patent application Ser. No. 11/648,551, filed Jan. 3, 2007, entitled "OPTOELECTRONIC DEVICE AND METHOD OF MAKING SAME", by the inventors of the present invention, this application being incorporated herein by reference. Instead of leakage of light to the substrate, leakage of light into a second cavity is employed. FIG. 8 illustrates schematically a laser (800) comprising a first cavity (853) and a second cavity (803) separated by an intermediate cladding layer (850). The first cavity (853) is thus bounded by the top cladding layer (858) and the intermediate cladding layer (850). The second cavity is bounded by the bottom cladding layer (802) and the intermediate cladding layer (850). The active region (856) is placed within the first cavity (853). The device (800) is preferably grown on an n-doped substrate (801). The bottom cladding layer (802), the second cavity (803), the intermediate cladding layer (850), and the layer (854) are preferably n-doped. The layer (857) and the top cladding layer (858) are preferably p-doped. The heavily p-doped p-contact layer (409) is placed on top of the top cladding layer (858). The bottom n-type contact (811) is deposited on the back side of the substrate. The top p-type contact (512) is deposited on top of the p-contact layer (409).

The active region (856) generates light when a forward bias (113) is applied. Light generated in the active region leaks from the first cavity (853) through the intermediate cladding layer (850) into the second cavity (803), propagates in the second cavity (803), is reflected back from the bottom cladding layer (802) and returns back to the first cavity (853). Lasing occurs when the phase matching conditions are met between light propagating just in the first cavity (853) and light leaking to the second cavity (803) and returning back. Similar to FIG. 6(a), the phase matching conditions are met at such wavelengths and effective angles when a dispersion curve of an optical mode confined in the first cavity (853) and a dispersion curve of an optical mode confined in the second cavity (803) intersect. FIG. 8 illustrate a tilted optical mode (870) in the first cavity (853) and a tilted optical mode (820) in the second cavity (803). The interaction between the optical modes of two cavities results in the formation of a combined optical mode of the entire device (800). The first cavity (853) does not preferably exceed three times the wavelength of light in the vacuum, whereas the second cavity (803) is much broader, and can reach typical dimensions of 10 to 30 micrometers. Such extension of the second cavity leads to the laser emission in two narrow vertical lobes (845).

Using an external mirror, similar to FIG. 7, it is possible to obtain lasing in a single narrow vertical lobe.

Figure 9:
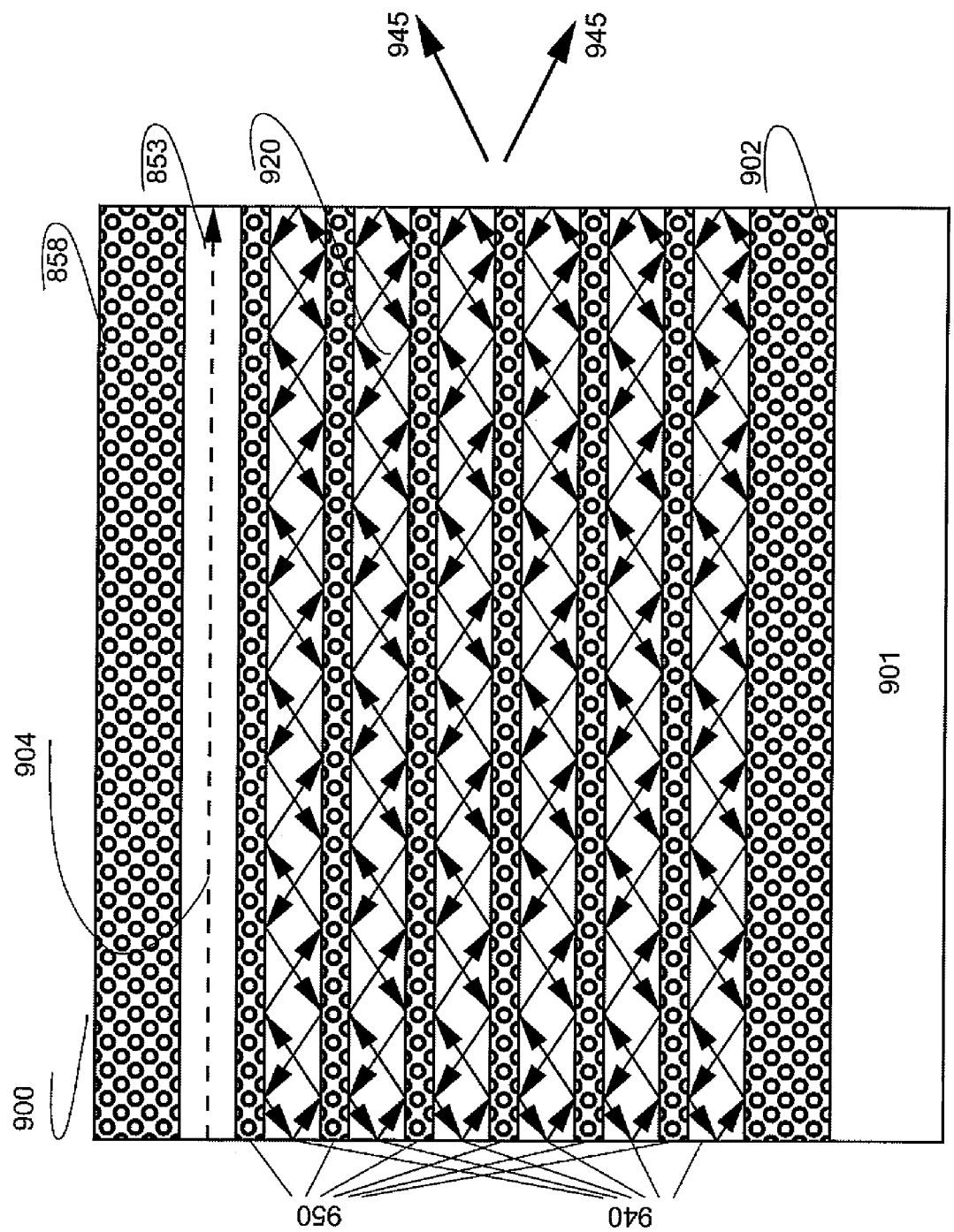
FIG. 9 shows a schematic diagram of a device employing the phase matching effect for the vertical optical modes in a multilayer epitaxial structure.

In order to enhance the selectivity of the vertical optical modes, a multiple cavity device can be used. FIG. 9 shows schematically a laser (900) grown on a substrate (901) and comprising a bottom cladding layer (902), a first cavity (853) into which an active region is placed, and a top cladding layer (858). A set of cavities (940) separated by intermediate cladding layers (950) are placed between the first cavity (853) and the bottom cladding layer (902). Light generated in the active region placed in the first cavity (853) propagates (904) in the cavity (853), leaks from the cavity and undergoes multiple reflections at the interfaces between additional cavities (940) and additional cladding layers (950). Lasing occurs in the vertical mode, for which the phase matching conditions are met. Engineering of a set of additional cavities (940) and cladding layers (950) allows enhancement of the vertical mode selectivity already provided by the device (800) in FIG. 8.

Thus, the laser disclosed in the copending patent applications U.S. Ser. No. 11/453,980, filed Jun. 16, 2006, entitled "EXTERNAL CAVITY OPTOELECTRONIC DEVICE", and U.S. Ser. No. 11/648,551, filed Jan. 3, 2007, entitled "OPTOELECTRONIC DEVICE AND METHOD OF MAKING SAME", by the inventors of the present invention, whereas these applications are incorporated herein by reference, allows selective single vertical mode lasing from an effectively broad vertical waveguide. The mode selection is based on the phase matching conditions which are met only for one vertical mode. The vertical extension of the optical mode can reach 10 micrometers or more. This approach allows fabrication of a multiple stripe laser, similar to FIG. 3(b), wherein the optical field created under neighboring stripes, overlap. This potentially allows formation of a coherent lateral optical mode from a multiple stripe laser.

The mechanism of the single vertical mode selection in the devices with a broad vertical waveguide, shown in FIGS. 5, 8, and 9 can be described in a single general form. The vertical waveguide comprises a first reflector, a first cavity, a second reflector, a second cavity and a third reflector. In this description, the top cladding layer which is the first reflector, and the bottom cladding layer which is the third reflector may be considered as parts of the waveguide. Active medium is preferably placed in the first cavity. Light generated in the active medium propagates in the first cavity and leaks partially into the second cavity. Light propagates in the second cavity, is reflected from the third reflector, propagates back and returns back to the first cavity. In the first cavity, interference between the light propagating just in the first cavity and light returned from the second cavity, occurs. When the phase matching conditions are met, constructive interference occurs, which determines the lasing vertical optical mode. Thus, the phase matching effect allows obtaining single vertical mode lasing from a broad vertical waveguide. Additionally, it allows wavelength-stabilized operation of the device.

Another realization of a vertical waveguide providing a single mode operation includes a coupled cavity geometry, wherein the active medium is introduced in a first cavity, and a second cavity is located on a side from the first cavity opposite to the substrate. Alternatively, the active medium can be placed in one of the reflectors surrounding the cavity or on a boundary between the cavity and one of the reflectors.

A further realization of a broad vertical waveguide providing a single mode operation includes coupled cavity geometry, wherein the active medium is located at a boundary between a cavity and one of the reflectors.

And yet another realization of a broad vertical waveguide providing a single mode operation includes coupled cavity geometry, wherein a second cavity is a single layer or a multiple layer structure grown epitaxially on a substrate, and a third reflector is just a substrate.

A broad vertical waveguide employing phase matching effect of the vertical optical modes and thus providing selection of a single vertical mode is a basis of all embodiments of the present invention. The advantages of this approach can be significantly extended by introducing a specific lateral waveguide in the lateral plane.

A single vertical mode broad waveguide allows a multiple stripe device wherein optical fields created beneath neighboring stripes, overlap, as shown in FIG. 3(b). However, this coherent lateral optical field, in broad area lasers, is typically multimode. Moreover, inevitable weak non-uniformities in the structure combined with non-linear optical effects can again cause filamentation. Thus, although a broad waveguide in the vertical direction allows obtaining a coherent optical field, additional means are necessary for efficient control of the lateral optical field.

Figure 10:
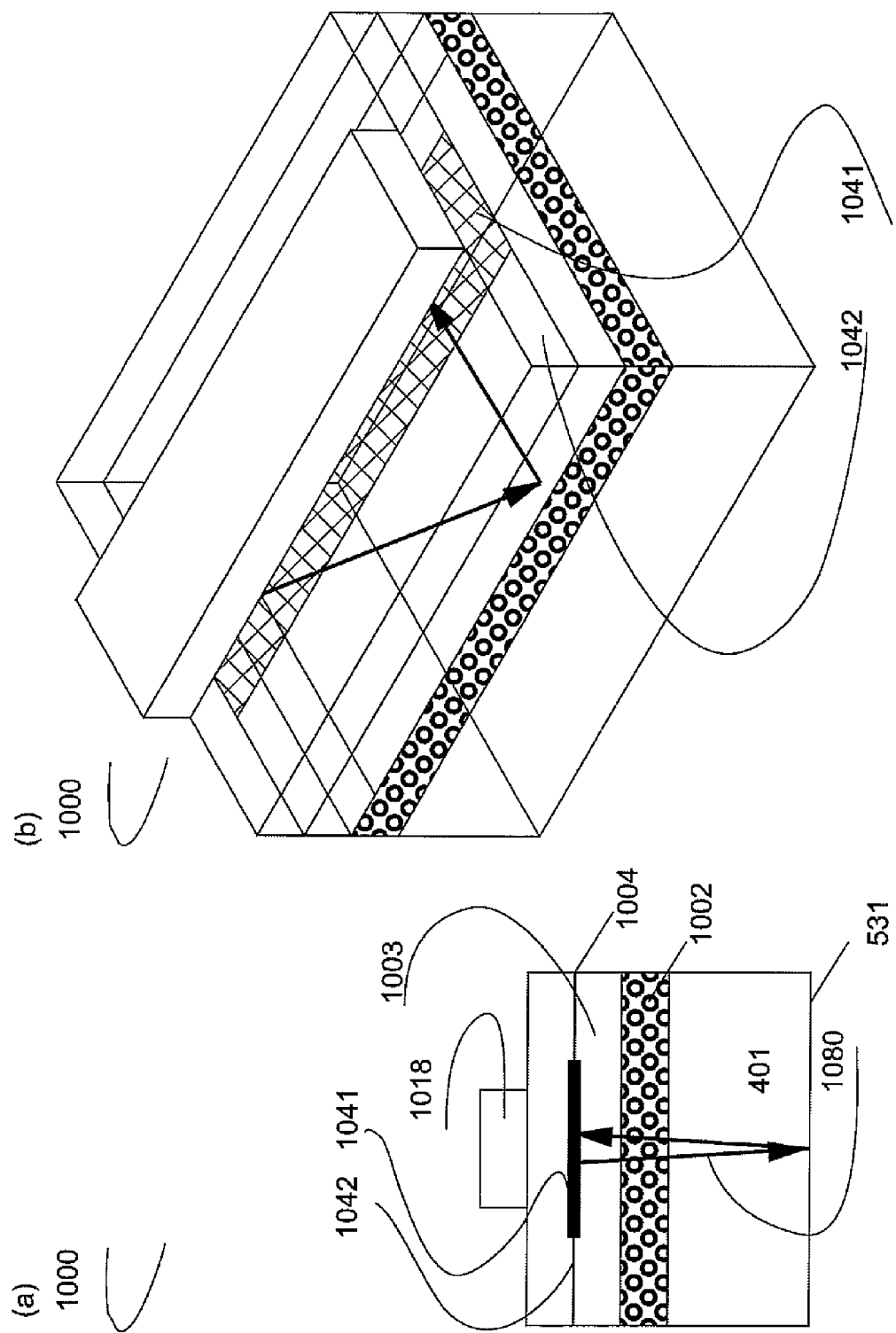
FIG. 10(a) shows a schematic cross sectional diagram of a device according to one embodiment of the present invention showing phase matching conditions realized for the fundamental lateral optical mode.
FIG. 10(b) shows a prospective view of the device of FIG. 10(a).

FIG. 10(a) shows schematically a view from the facet on a laser (1000) according to one embodiment of the present invention. The substrate (401), the bottom cladding layer (1002), and the vertical waveguide (1003) are shown. The top cladding layer is not shown for simplicity. The ridge stripe (1018) is formed on top of the structure. Once the injection current is applied, it flows through a part of the active region only. Thus, the active medium (1004) contains a pumped region (1041), wherein optical gain is generated, and an unpumped, absorbing region (1042). Due to certain current spreading, the pumped region (1041) can be slightly broader than the ridge stripe (1018).

The light in the vertical optical mode propagates through the substrate, is reflected back from the back surface (531) of the substrate, and returns back to the active region. The phase matching conditions strongly depend also on a lateral optical mode of light. FIG. 10(a) illustrates propagation of light in the fundamental lateral mode, for which the effective mode angle in the lateral plane is small, and projected path of light propagation is approximately parallel to the ridge. Then light generated in the pumped part of the active medium returns back to the pumped part of the active medium, as is shown schematically by the light path (1080). For such light, phase matching conditions occur.

FIG. 10(b) shows schematically a prospective view of the device (1000) again illustrating the path of the light in the fundamental lateral optical mode.

Figure 11:
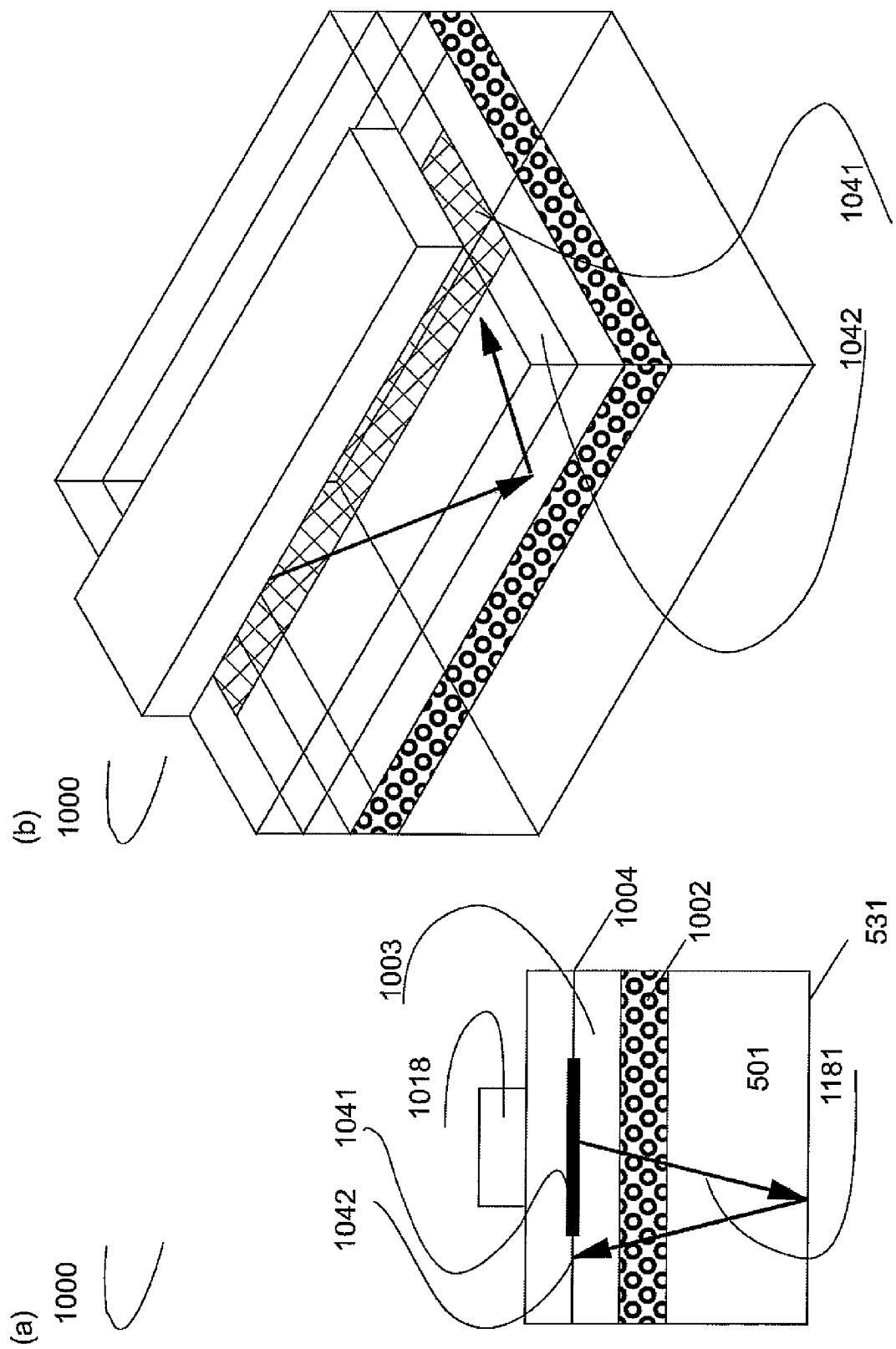
FIG. 11(a) shows a schematic cross sectional diagram of a device according to one embodiment of the present invention showing that phase matching conditions are not realized for a high order lateral optical mode.
FIG. 11(b) shows a prospective view of the device of FIG. 10(a) showing that phase matching conditions are not realized for a high order lateral optical mode.

FIG. 11(a) shows schematically the same device (1000), but is focused on the propagation of light in a high-order lateral mode. The light path (1181) starts from the pumped part (1041) of the active medium (1004), but when light returns back to the active region, it hits the unpumped part (1042). No phase matching conditions occur for this light.

FIG. 11(b) shows schematically a prospective view of the device (1000) illustrating the path of the light in a high order lateral optical mode.

Figure 12:
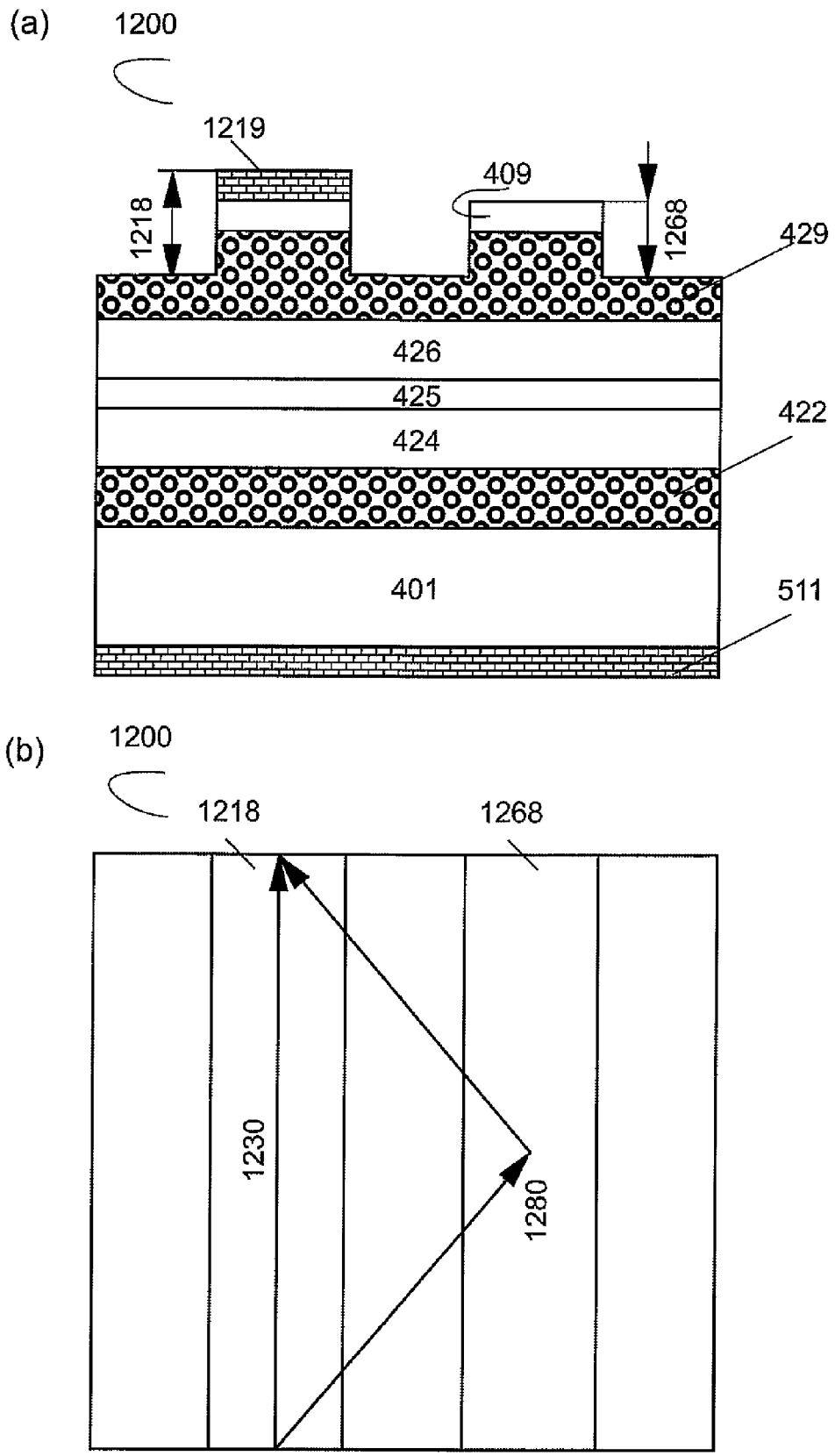
FIG. 12(a) shows a schematic view from the facet on a two-stripe device according to another embodiment of the present invention.
FIG. 12(b) shows a schematic top view of the device of FIG. 12(a) illustrating phase matching effect for lateral optical modes.

FIG. 12(a) shows schematically a laser (1200) according to another embodiment of the present invention (view from the facet). Two ridges are fabricated on top of the device. The contact (1219) is deposited on top of a first ridge (1218), whereas no contact is deposited on top of a second ridge (1268).

FIG. 12(b) shows schematically a top view on the device (1200) illustrating the propagation of light in the lateral optical modes. Light is generated in the active medium underneath the first ridge (1218). Light propagates along the ridge (1230), and partially leaks (1280) in the lateral plane. Since the second ridge (1268) creates a perturbation of the refractive index profile compared to the planar surface, leaking light (1280) is reflected back and returns to the active region underneath the first ridge (1218). Phase matching conditions between light (1230) and (1280) are met for certain lateral optical modes and are not met for the other modes thus providing selectivity of the lateral optical modes.

Figure 13:
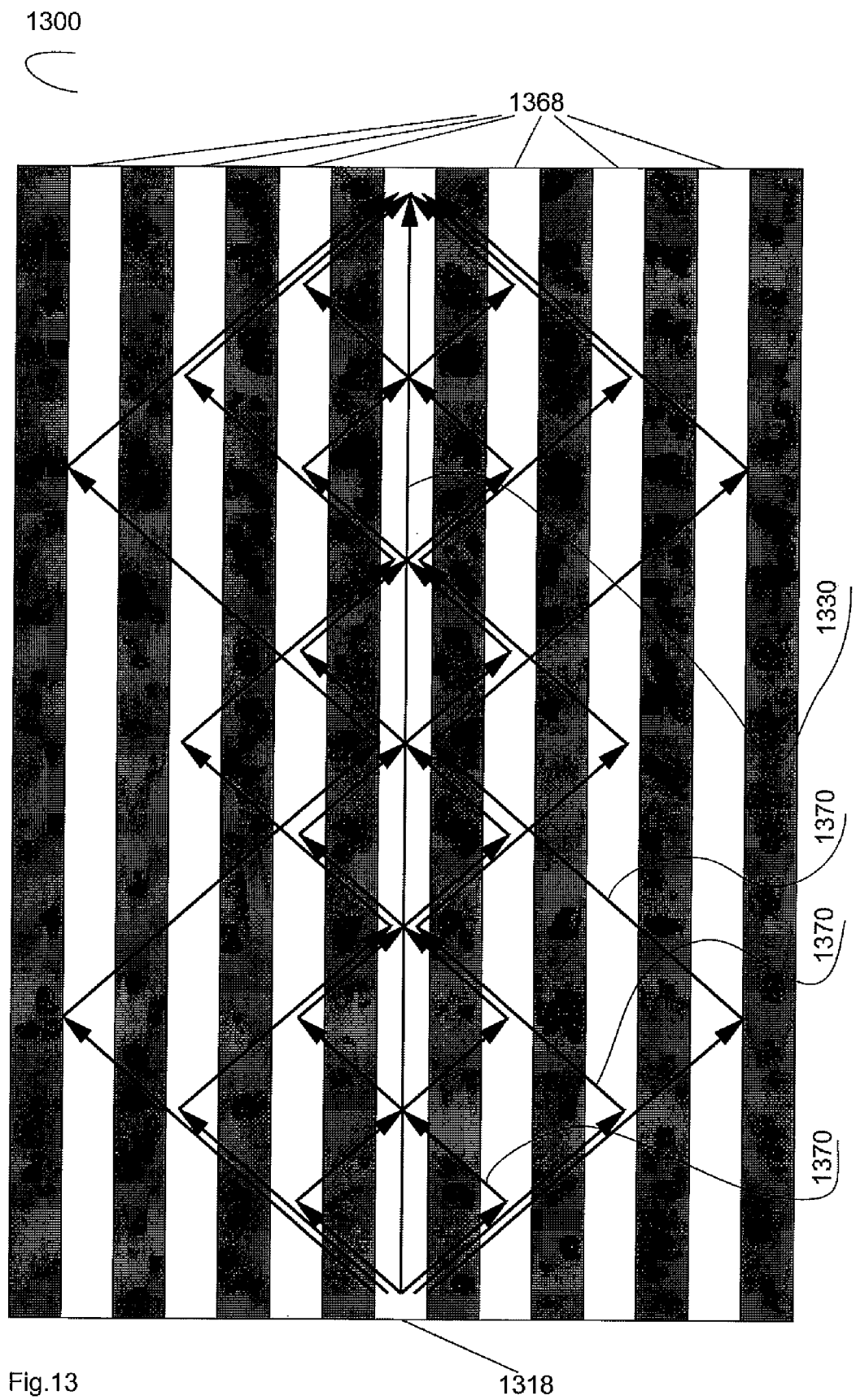
FIG. 13 shows a schematic top view on a multi-stripe device realizing the phase matching effect for the lateral optical modes.

FIG. 13 shows schematically a top view on a laser (1300) according to yet another embodiment of the present invention. Multiple ridges are formed on top of the device. One ridge (1318) has a contact on top, and the active region underneath is pumped. Other ridges (1368) have no contacts, and the active region underneath is unpumped. Light generated in the pumped part of the active region partially propagates along the ridges (1330) and partially leaks away and is reflected back by the neighboring ridges (1370) and returns back. Phase matching conditions are met for certain lateral optical modes and are not met for other lateral optical modes, which allows selection of the lateral optical modes, and, ultimately, a single lateral optical mode operation of the device. To ensure a narrow lateral beam divergence, a lateral waveguide should be rather broad, preferably broader than five times the wavelength of light in the vacuum.

Further embodiments of the present invention employ the concept of a lateral photonic band crystal for efficient selection of the lateral optical modes. This extends the approach of a vertical photonic band crystal disclosed in an earlier patent "SEMICONDUCTOR LASER BASED ON THE EFFECT OF PHOTONIC BAND GAP CRYSTAL-MEDIATED FILTRATION OF HIGHER MODES OF LASER RADIATION AND METHOD OF MAKING THE SAME", U.S. Pat. No. 6,804,280, filed Sep. 4, 2001, issued Oct. 12, 2004, by the inventors of the present invention. The lateral photonic band crystal is, preferably, a periodic pattern created on the surface, wherein a periodic modulation occurs in the lateral direction perpendicular to the direction of the propagation of light in the lateral plane. This periodic modulation of the surface creates a periodic modulation of the refractive index profile. Further, an optical defect is introduced, wherein the periodicity is broken within this optical defect. The optical defect is preferably selected such, that it is capable to localize lateral optical modes of laser radiation. More specifically, the strength of the optical defect is selected such, that only one mode, preferably the fundamental mode is localized at the optical defect and decays away from the defect, wherein all high order lateral modes are extended throughout the entire lateral photonic band crystal.

Figure 14:
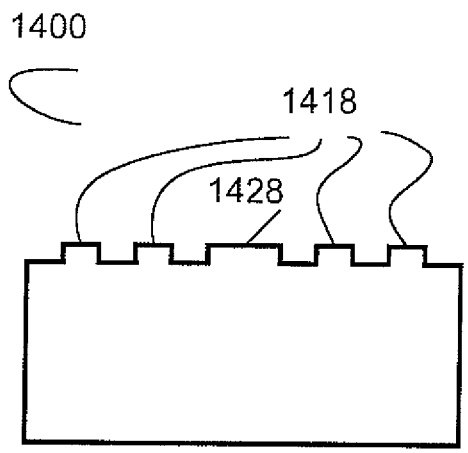
FIG. 14(a) shows schematically a view from the facet on a device comprising a lateral photonic band crystal according to yet another embodiment of the present invention.
FIG. 14(b) shows schematically a prospective view of a device of FIG. 14(a).
Figure 14:
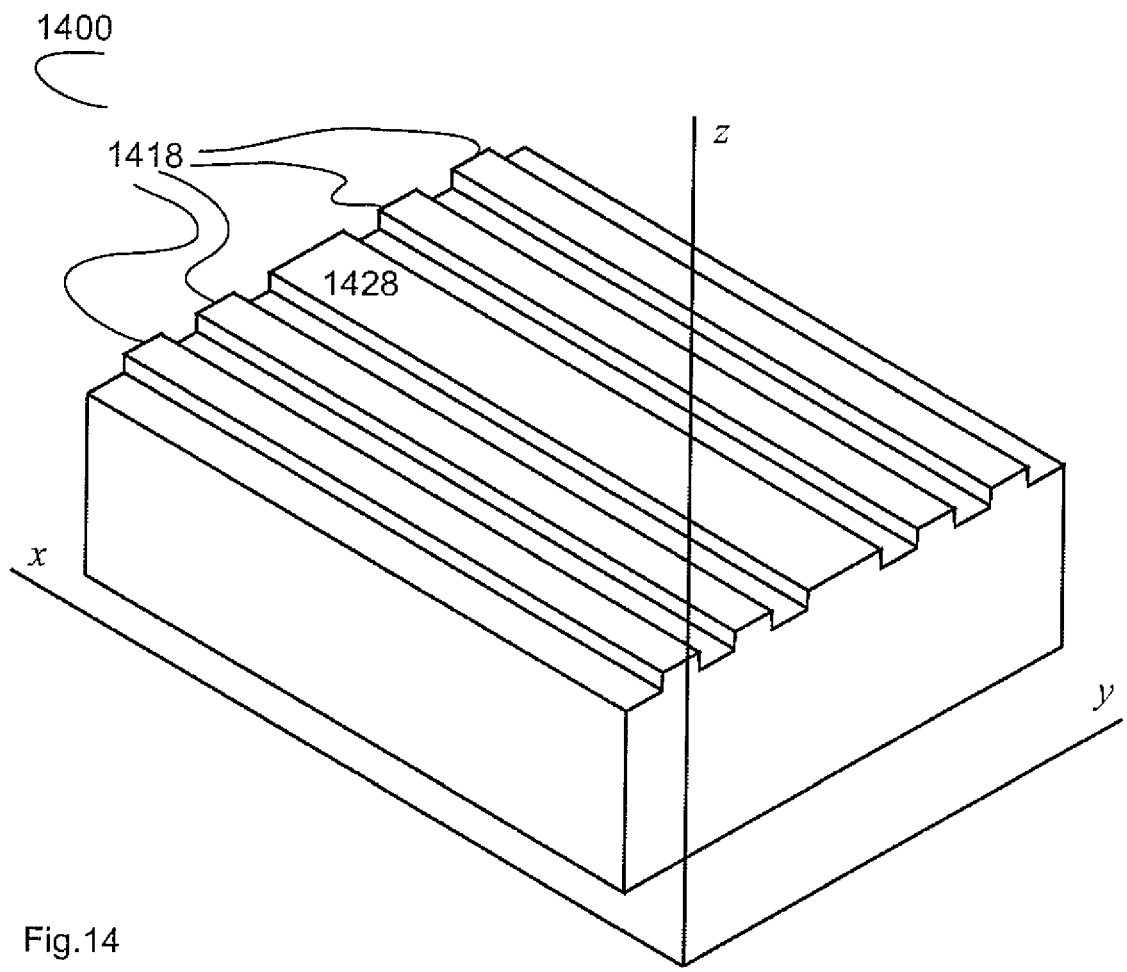

There are different ways to create a localizing optical defect. FIG. 14(a) illustrates one of the possibilities. The laser (1400) comprises a periodic array of identical ridges (1418), and one ridge (1428) broader than the others. A broader ridge creates a localizing optical defect capable to localize lateral optical modes.

FIG. 14(b) shows schematically a prospective view of the same device (1400).

Figure 15:
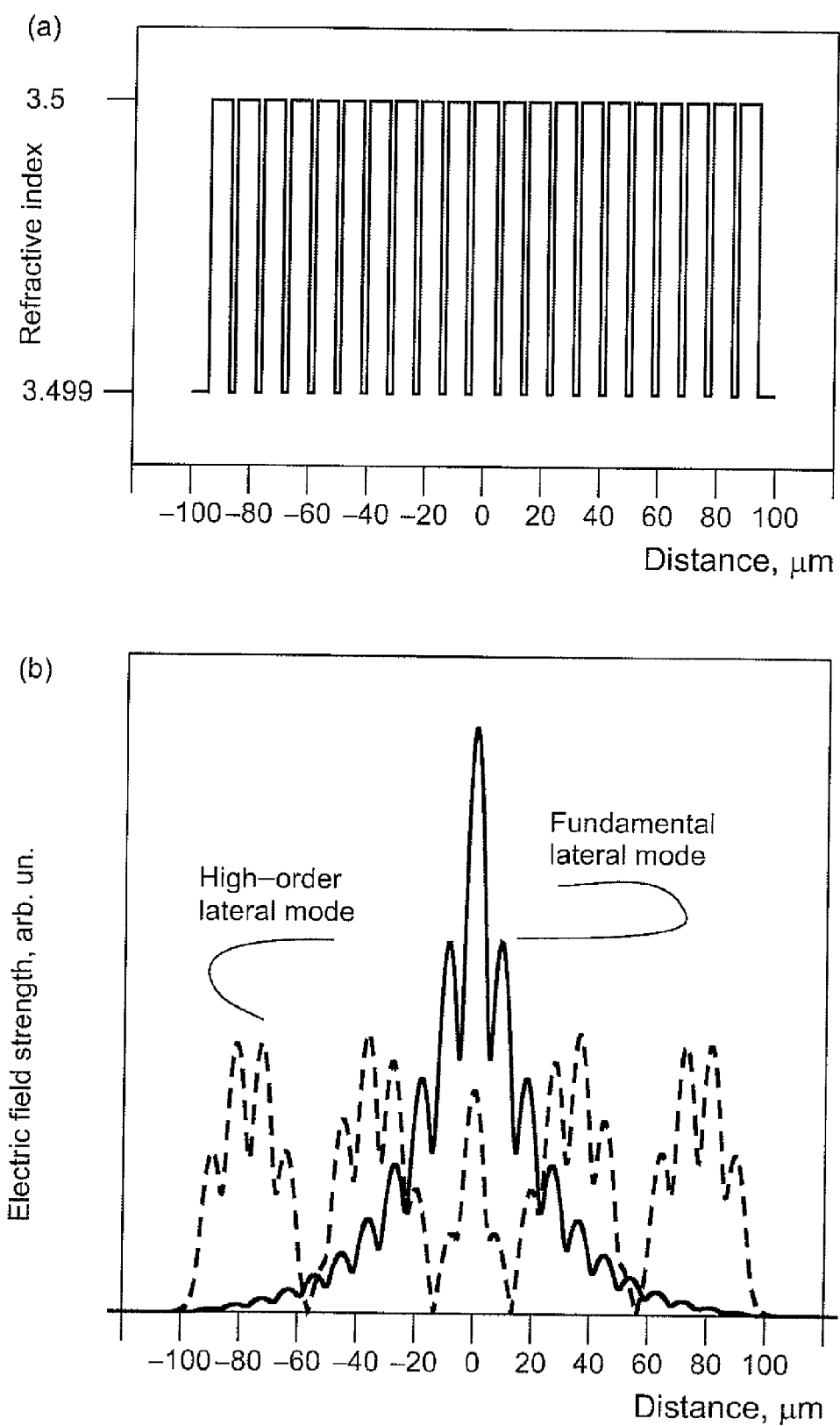
FIG. 15(a) shows schematically an effective one-dimensional refractive index profile referring to the lateral photonic band crystal of FIG. 14(a) containing an optical defect.
FIG. 15(b) shows schematically the spatial profile of the fundamental lateral optical mode and a high order lateral optical mode in the effective one dimensional profile of FIG. 15(a).

FIGS. 15(a) and 15(b) illustrate the mechanism of the selection of the lateral optical modes. Basic properties of the lateral photonic band crystal of the present disclosure can be illustrated by a simple one-dimensional modeling. The vertical waveguide defines a vertical optical mode, and the effective refractive index of the optical mode is a function of the "y" coordinate in the lateral plane. Thus, the optical modes in a one-dimensional profile in the lateral plane mimic the real behavior of the lateral optical modes in a three-dimensional structure. An exact modeling requires solving two-dimensional or three-dimensional Maxwell's equations.

FIG. 15(a) shows schematically a one-dimensional profile of the effective refractive index showing an optical defect realizing as a central region of high refractive index broader than the neighboring regions of high refractive index. This mimics a broader central ridge shown in FIGS. 14(a) and 14(b). FIG. 15(b) shows schematically the spatial profile of the optical field in the fundamental lateral mode and in one of the high order lateral modes. In particular, the absolute value of the electric field strength is plotted. FIG. 14(b) shows that the fundamental lateral optical mode is localized at the optical defect and decays away from the optical defect, whereas the high order mode is extended throughout the entire lateral photonic band crystal. Correspondingly, the intensity of the fundamental lateral optical mode at the optical defect is higher than the intensity of the high order lateral optical mode. Then, if the contact is mounted only on the central ridge (1428), the active region is pumped only in the area underneath the central ridge, i.e. in the region of the optical defect. Correspondingly, the optical gain occurs only in the optical defect, and the optical confinement factor of the fundamental lateral optical mode in the gain region is higher than the optical confinement factor of all high order lateral optical modes. This promotes a single lateral mode lasing of the laser containing a lateral photonic band crystal formed of ridges. Thus, employing a concept of the vertical mode selection disclosed in co-pending patent applications, namely U.S. patent application Ser. Nos. 11/453,980, filed Jun. 16, 2006, entitled "EXTERNAL CAVITY OPTOELECTRONIC DEVICE" and U.S. patent application Ser. No. 11/648,551, filed Jan. 3, 2007, entitled "OPTOELECTRONIC DEVICE AND METHOD OF MAKING SAME", in combination with the lateral mode selection due to lateral photonic band crystal, allows a single vertical single lateral mode lasing from effectively a broad area laser. This enables a high power semiconductor diode laser having a single vertical mode single lateral mode lateral beam having a narrow vertical divergence and a narrow lateral divergence. Thus, a broad array of stripes is capable to emit laser light in a single coherent lateral optical mode. This device can be called a field coupled laser array.

In a different embodiment of the present invention, the injection current is applied to a few ridges in the region of the optical defect. In one another embodiment, an optical defect is formed by a few ridges. In yet another embodiment, an optical defect is formed by one or a few ridges which are higher than the rest of the ridges. In a further embodiment, dielectric is selectively deposited on one or a few ridges forming an optical defect capable to localize the fundamental lateral optical mode. And further embodiments are possible using various realization of an optical defect in a lateral photonic crystal, wherein such optical defect is capable to localize the fundamental lateral optical mode.

Figure 16:
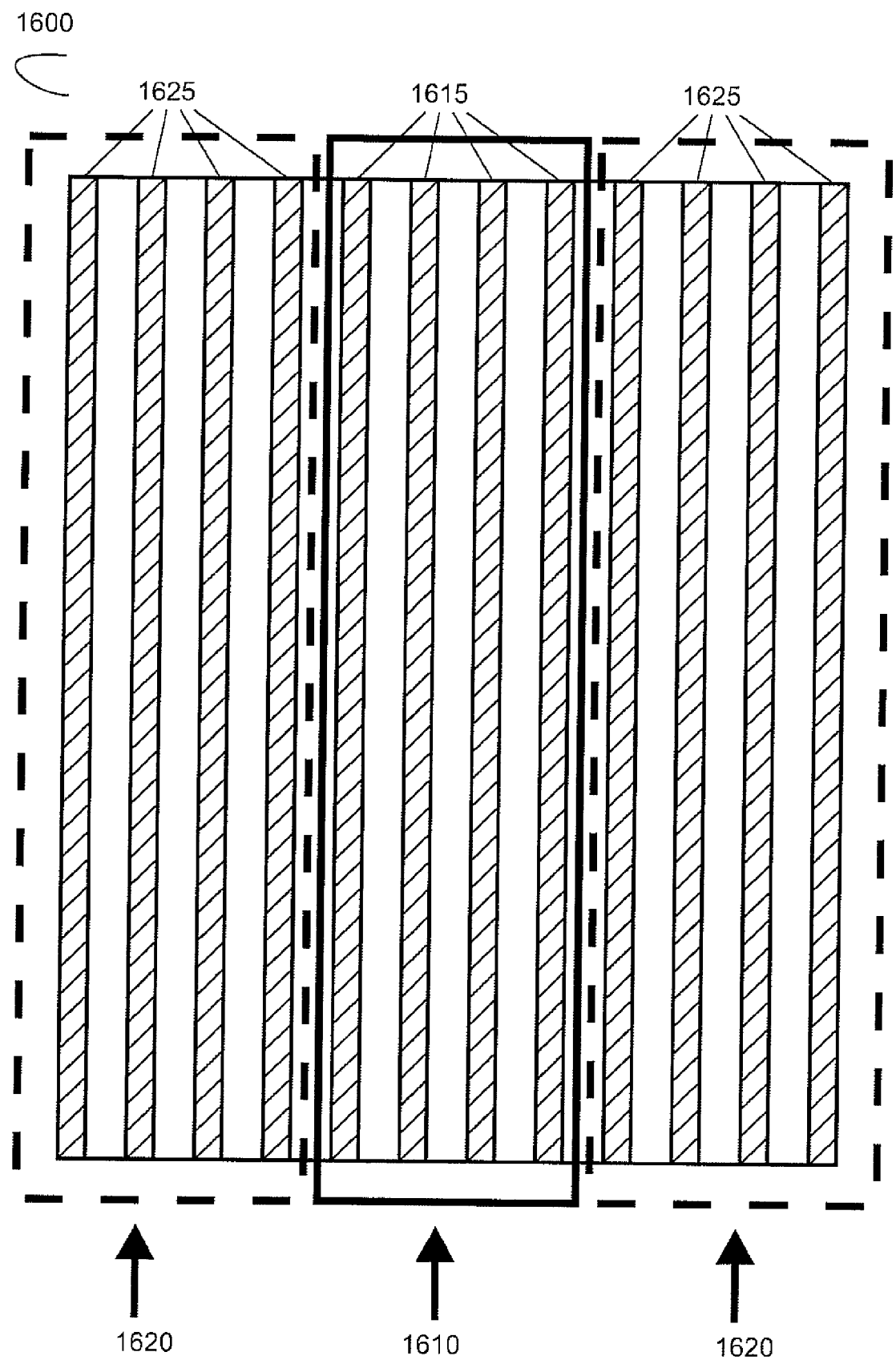
FIG. 16. Top view on a lateral photonic band crystal formed by stripe ridge, according to one embodiment of the present invention, wherein an optical defect in a lateral photonic band crystal is formed by selective pumping in a certain region, and not pumping outside this region.

Another group of embodiments employs lateral photonic band crystal, wherein the shape and the width of all ridges are the same, and the optical defect is formed just by selective pumping of the active medium. FIG. 16 shows schematically a top view on a laser (1600) in accordance with yet another embodiment of the present invention. A periodic array of stripes is fabricated on top of the laser structure. Contacts are preferably mounted on all the stripes. However, only a certain region (1610) is pumped, i.e. a forward bias is applied only to a certain set of stripes (1615), or, at least this region is predominantly pumped, i.e. the optical gain in the central region (1610) is higher than in the neighboring regions (1620). The neighboring regions (1620) are not pumped, i.e. a forward bias is not applied to the stripes (1625). Then the recombination current flows mostly through a certain set of stripes (1615), and optical gain is generated in the active medium predominantly in the pumped region. Thus, the light is, at least predominantly, generated in the pumped region, and optical mode can leak out of the pumped region to unpumped or weakly pumped region or regions.

Figure 17:
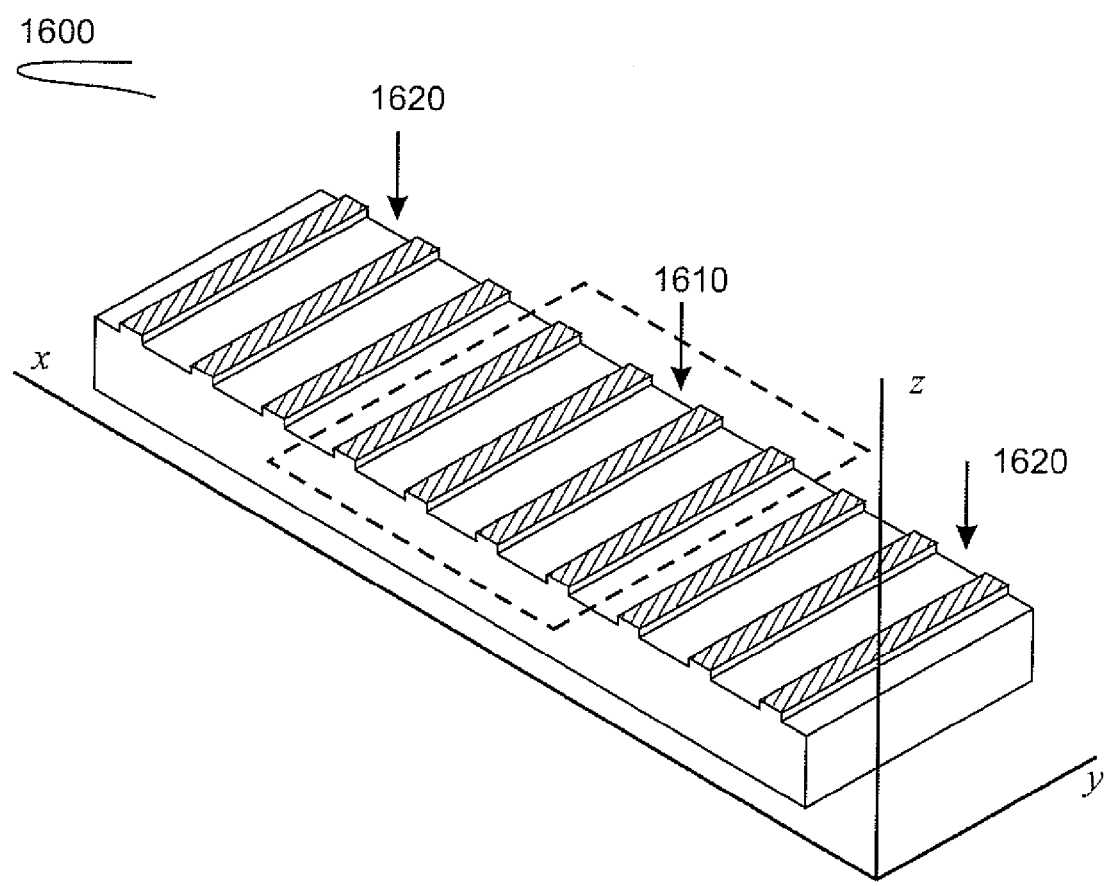
FIG. 17. Prospective view on an edge-emitting laser with a lateral photonic band crystal with an optical defect formed by selective pumping in a certain region, according to the embodiment of FIG. 16.

FIG. 17 shows schematically a prospective view of the same laser as in FIG. 16, in which only a part of the stripes are pumped.

Figure 18:
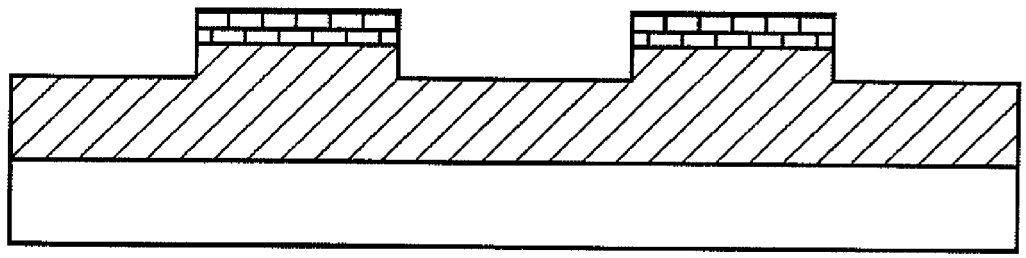
FIG. 18(a). Lateral photonic band crystal according to one of the embodiments of the present invention, wherein metal contacts are mounted on top of ridge stripes.
FIG. 18(b). Lateral photonic band crystal according to one of the embodiments of the present invention, wherein dielectric is deposited between contact pads.
FIG. 18(c). Lateral photonic band crystal according to one of the embodiments of the present invention, wherein metal is deposited on top of the dielectric forming the metal contact over the entire top surface.
FIG. 18(d). Lateral photonic band crystal according to one of the embodiments of the present invention, wherein metal deposit covers the entire top surface upon the contact annealing.
Figure 18:
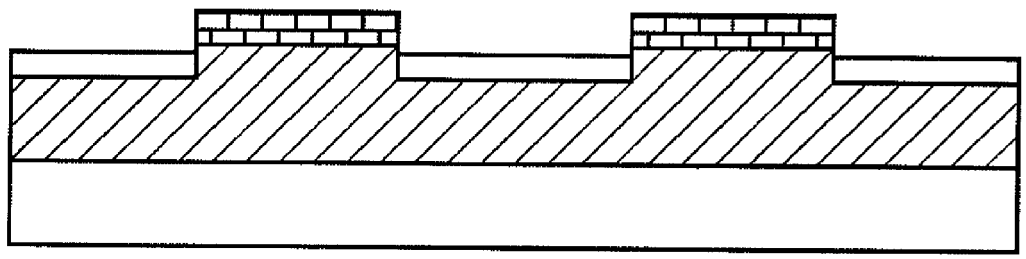
Figure 18:
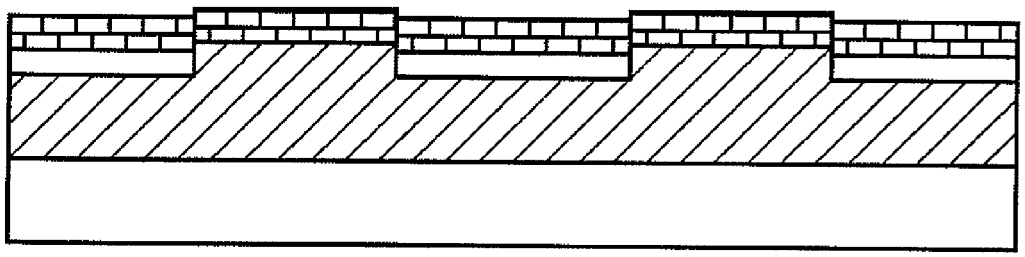
Figure 18:
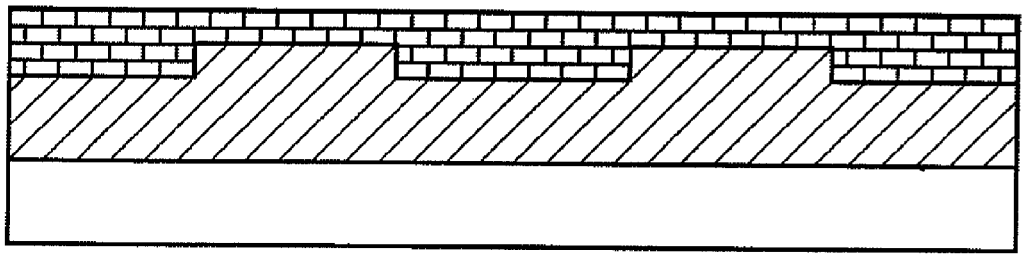

FIGS. 18 (a) through (d) represent different possible embodiments of the present invention. FIG. 18(a) shows a central pumped part of the laser or gain chip, in which metal contacts are deposited on top of the ridge stripes. FIG. 18(b) shows a laser, in which dielectric is additionally deposited in between contact pads. FIG. 18(c) shows a laser, in which deposited metal form a continuous contact covering both the ridge stripes and dielectric insertions. FIG. 18(d) refers to a laser, in which metal is deposited on top of ridge stripes, and annealed. Then the metal contact covers the whole surface.

The filtering of the high-order modes is realized by leaking of the emission from predominately pumped central part to predominantly unpumped edge part or parts of the device. We note that the edge part can be partly pumped either by current spreading in the contact and cladding layers or by photo-pumping due to the propagation of the light in the thick waveguide structure. It is important however, that the overall gain in the edge regions, either due to less efficient pumping, or more pronounced absorption or scattering is lower in this part of the device.

Figure 19:
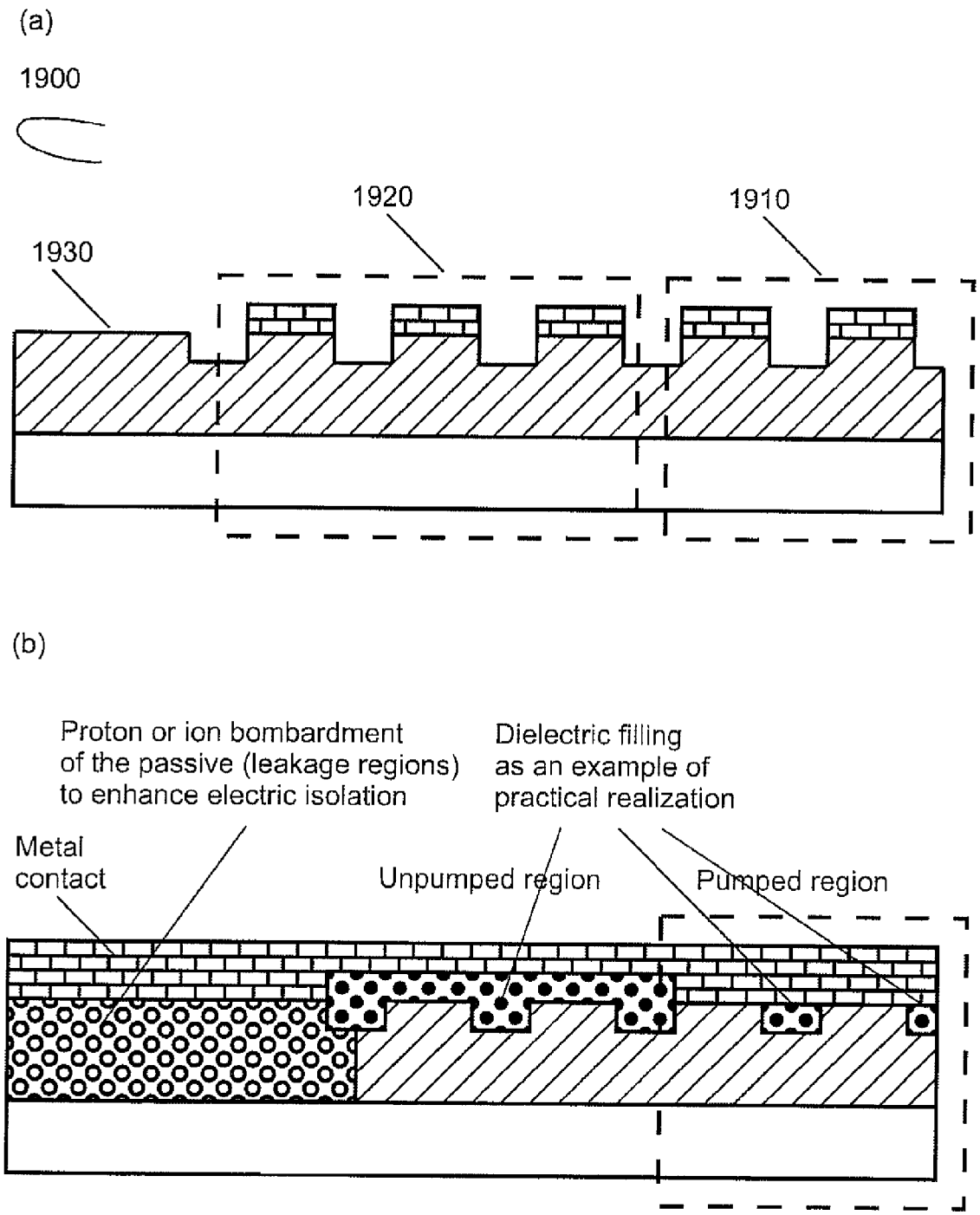
FIG. 19(a). Edge of a lateral photonic band crystal, according to one of the embodiments of the present invention, wherein an unpumped broad ridge stripe forms a medium for mode leakage from the lateral photonic band crystal part (both pumped and predominantly pumped).
FIG. 19(b). Edge of a lateral photonic band crystal, according to one of the embodiments of the present invention, wherein proton or ion bombardment is used to prevent current spreading and form unpumped region for mode leakage from the lateral PBC part (both pumped and predominantly pumped) . . . .

FIG. 19(a) shows an edge of a stripe structure on the top surface of a laser (1900), according to one of the embodiments of the present invention. An end stripe (1930) has either a larger width or a larger height, or both, to provide an efficient leakage of the optical modes. The edge stripes (1920) of the lateral photonic band crystal structure have lower gain as compared to the central part (1910) due to stronger absorption or weaker pumping.

FIG. 19(b) shows an edge of the stripe structure on the top of a laser, according to yet another embodiment of the present invention. The metal contact covers the entire surface. The ion or proton bombardment is used to prevent current spreading to certain regions of the active medium. Thus, ion or proton bombardment forms unpumped regions, into which optical modes leaks. FIG. 19(b) shows also dielectric insertions, used in this particular embodiment.

Ridge stripes, dielectric insertions, metal contacts, etc. form a particular profile of the dielectric function of the medium. Particular shape of the ridges and metal contacts, dielectric insertions, regions subject to ion and proton bombardment determine particular profile of current spreading. Inhomogeneous current spreading results in inhomogeneous pumping of the active medium. Thus, the active medium may contain stronger or weaker pumped regions. Current contributes to the dielectric function of the active medium. For example, current density exceeding the transparency threshold current density generates locally an optical gain in the active medium, i.e., the imaginary part of the dielectric function becomes negative, $$\mathrm{Im}\,\epsilon < 0. \tag{1a}$$

Unpumped regions of the active medium remain absorbing, i.e.

$$\mathrm{Im}\,\epsilon > 0. \tag{1b}$$

As the real part and imaginary part of the dielectric function are interconnected via Kramers-Kronig relationship, inhomogeneous pumping results also in spatial modulation of the real part of the dielectric function and, thus, in the modulation of the refractive index. This modulation additionally contributes to the modulation forced by stripes shape.

Moreover, if an array of stripes is ideally periodic, as shown in FIG. 16, the selective pumping of some of the stripes and not pumping of the other stripes is the only reason for an optical defect. The pumped region in FIG. 16 plays a role of the optical defect in a lateral photonic band crystal.

It should be noted here that metal contacts can be deposited also on the ridge stripes which are not pumped. One of the objectives to do such is to control the strength of the optical defect. In order to obtain a narrow lateral beam, one needs an optical mode extended in the lateral direction "y" over a large distance. This can be done, if the modulation of the effective refractive index is not very strong, which can be achieved, if the pumped and unpumped regions of the structure do not differ too much. A second objective to deposit metal contacts on all stripes is to enhance selectively the absorption of the optical modes in the metal contact, which is particularly pronounced in the embodiment of FIG. 18(d).

In another embodiment of the present invention, metal contacts are deposited only on the stripes in the pumped region. We note that by positioning of the contact and dielectric layers it is possible to affect gain and losses in different lateral modes differently. For example, when the region between the ridges is strongly pumped the predominantly single-lobe fundamental mode will lase due to the higher optical confinement factor. As opposite, in case the regions between the stripes are weakly pumped, high order mode with oscillating intensity profile having nodes in regions between the stripes will be selected for lasing. In both cases undesired parasitic lateral modes will be removed by the lateral photonic band crystal leakage effect.

Figure 20:
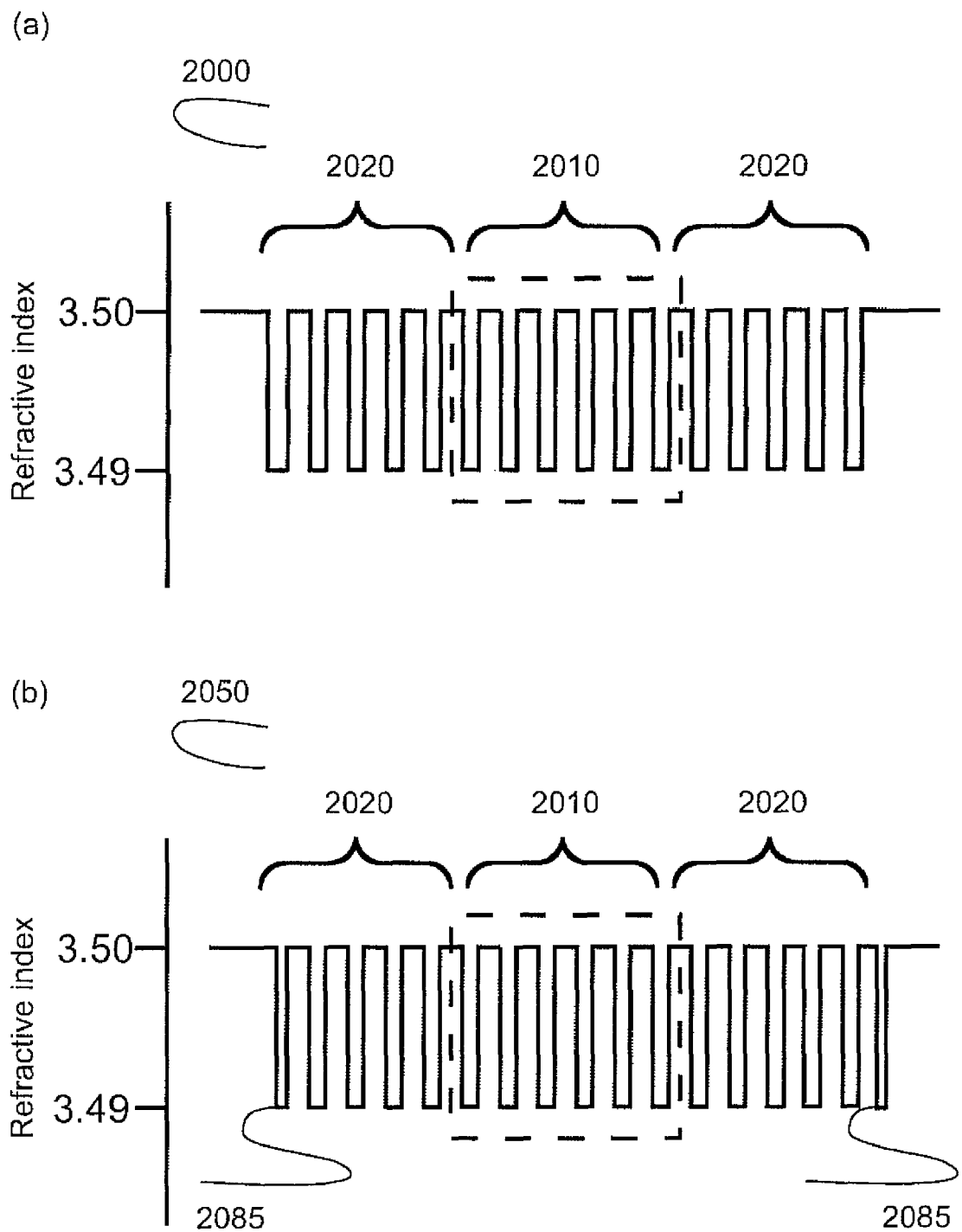
FIG. 20(a). Effective one-dimensional refractive index profile for a lateral photonic band crystal, according to one of the embodiments of the present invention, with leakage of the optical modes into neighboring region.
FIG. 20(b). Effective one-dimensional refractive index profile for a lateral photonic band crystal, according to one of the embodiments of the present invention, where special design of layers at the edges of the photonic band crystal enhances the selectivity of modes in leakage loss.

A few further embodiments, in which the lateral photonic band crystal is formed specifically by selective pumping show how the optical defect can allow an efficient filtration of the lateral optical modes. Principles of the lateral optical mode selection can again be illustrated by a simple one-dimensional modeling. FIG. 20(a) shows schematically an effective refractive index profile (2000) in the "y" direction in the lateral plane. The optical defect (2010) can localize lateral optical modes, which leak to the leaky regions (2020) on the left-hand-side and on the right-hand-side from the optical defect.

FIG. 20(b) refers to yet another embodiment of the present invention. It shows schematically an effective refractive index profile (2050) in the "y" direction in the lateral plane. The defect is a periodic sequence of alternating layers having a higher and a lower refractive index. The periodicity is intentionally broken at the edges of the defect, where the layers (2085) have a different, preferably a smaller thickness than the corresponding layers throughout the entire optical defect. In a particular embodiment of FIG. 20(b), the layers with a lower refractive index at the edges of the optical defect are thinner than the layers with the same index in the rest of the optical defect. The special selection of the transition layers can be done to enhance the selectivity of the optical modes in leakage loss.

Figure 21:
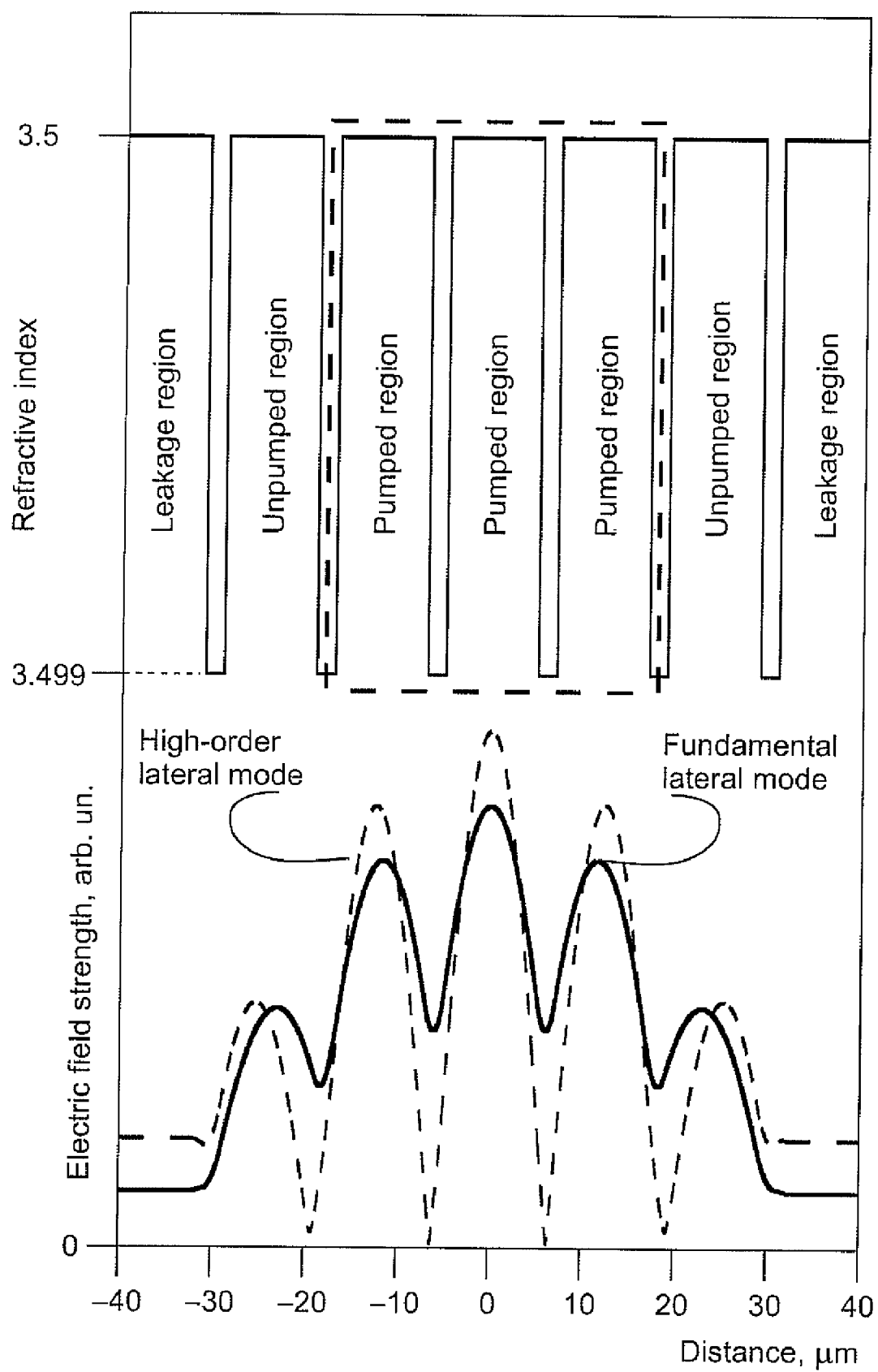
FIG. 21. Effective one-dimensional refractive index profile and spatial profile of two lateral optical modes for a lateral photonic band crystal of one of the embodiments of the present invention.

FIG. 21 shows schematically the profile of the effective refractive index in the "y" lateral direction (top panel) and the spatial profile of the two optical modes (lower panel). The central part of the structure has predominantly higher optical gain due to higher pumping or lower loss. The absolute value of the electric field strength is plotted. Optical modes calculated for a one-dimensional profile of the refractive index mimic the lateral optical modes in the real structure. The fundamental lateral mode has a lower intensity of the optical field in the leaky region than a high-order mode, thus illustrating a lower leakage loss of the fundamental mode.

Figure 22:
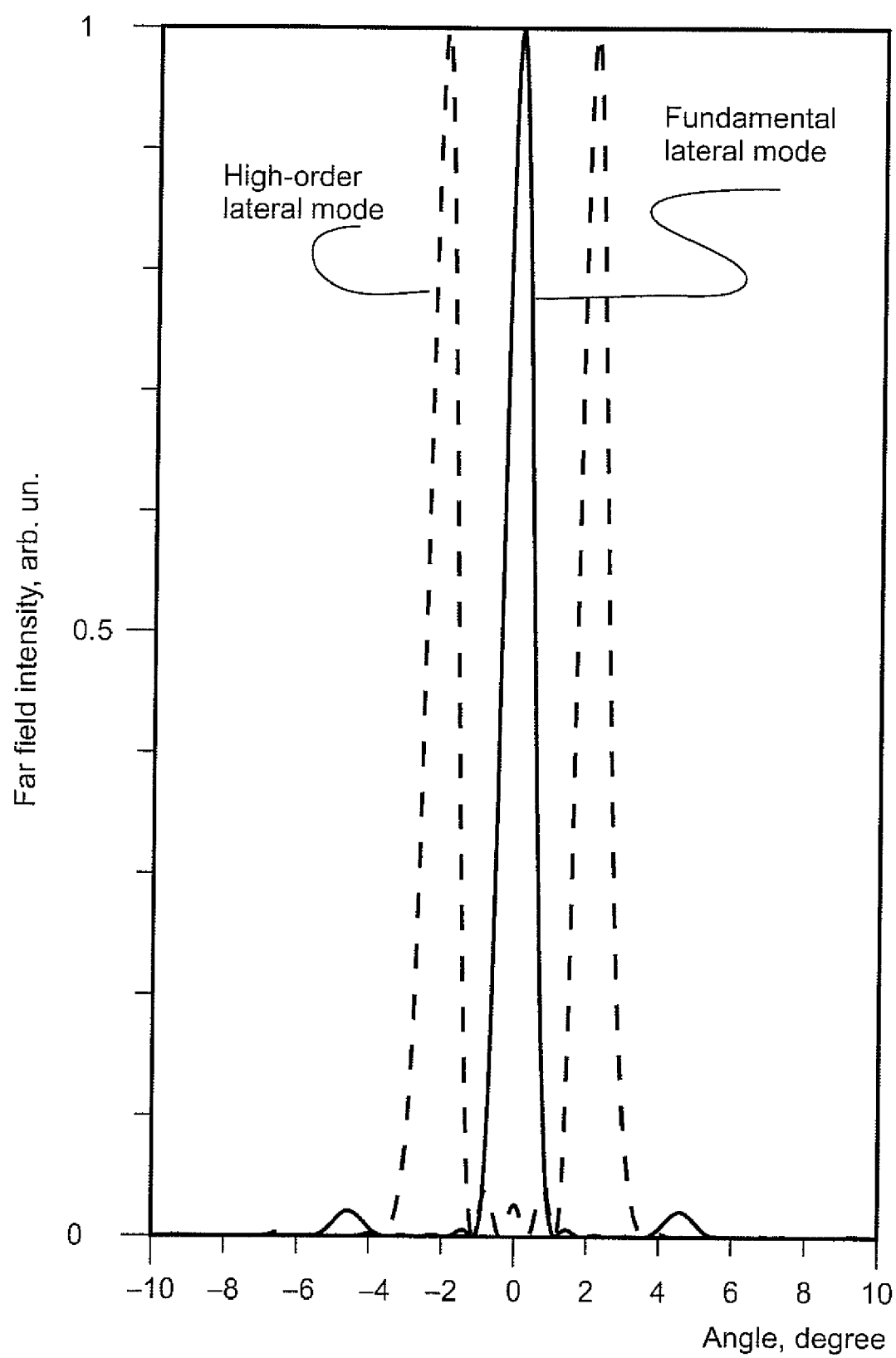
FIG. 22. Lateral far field profile of the two lateral optical modes of FIG. 21.

FIG. 22 shows the lateral far field profile of the two optical modes of FIG. 21. 96% of the whole intensity of the light emitted in the fundamental mode is concentrated in a narrow central lobe. Thus, effective selectivity of the lateral optical modes can allow lasing in a single lateral optical mode with a narrow single-lobe far field. Since the width of the lateral photonic band crystal can well be about 100 to 300 micrometers, the lateral far field pattern contains extremely narrow lobe, below one degree full width at half maximum.

Figure 23:
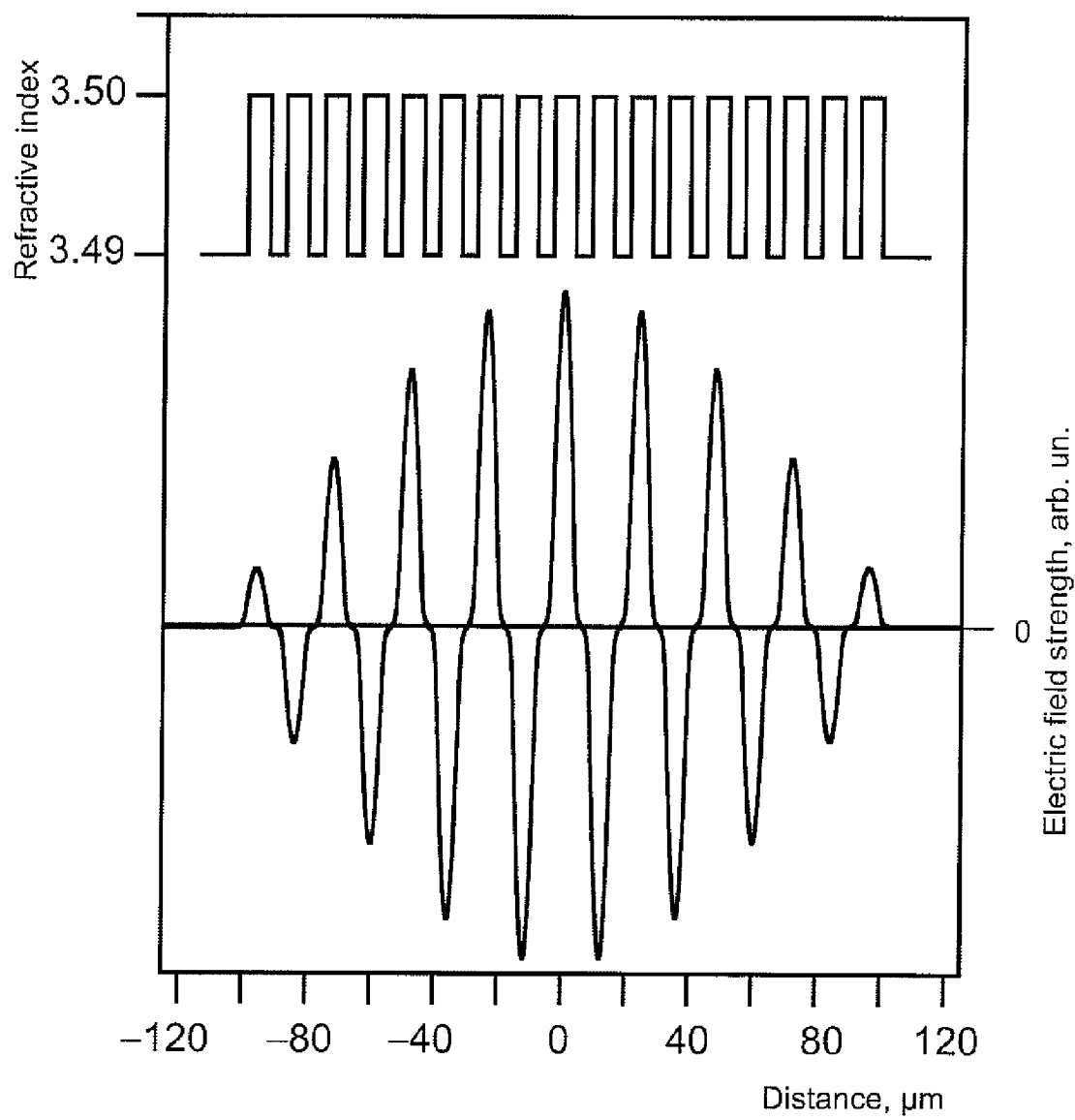
FIG. 23. Effective one-dimensional refractive index profile of a lateral photonic band crystal and a spatial electric field strength profile of the antisymmetric lateral optical mode, according to one of the embodiments of the present invention.

Depending on the particular shape of the ridge stripes, another embodiment of the present invention is possible, in which the current spreading profile has such shape that the parts of the active medium underneath the ridge stripes are pumped, whereas parts of the active medium in between the stripes are unpumped and thus absorbing. Therefore, the lateral optical modes, the intensity of which does not vanish in the absorbing regions will exhibit high absorption loss. FIG. 23 shows one high-order antisymmetric lateral optical mode, which has nodes of the electric field in all absorbing regions. The profile of the effective refractive index (top panel) and the electric field strength (bottom panel) are plotted. This mode is not absorbing, and the lasing will occur in this antisymmetric mode.

Figure 24:
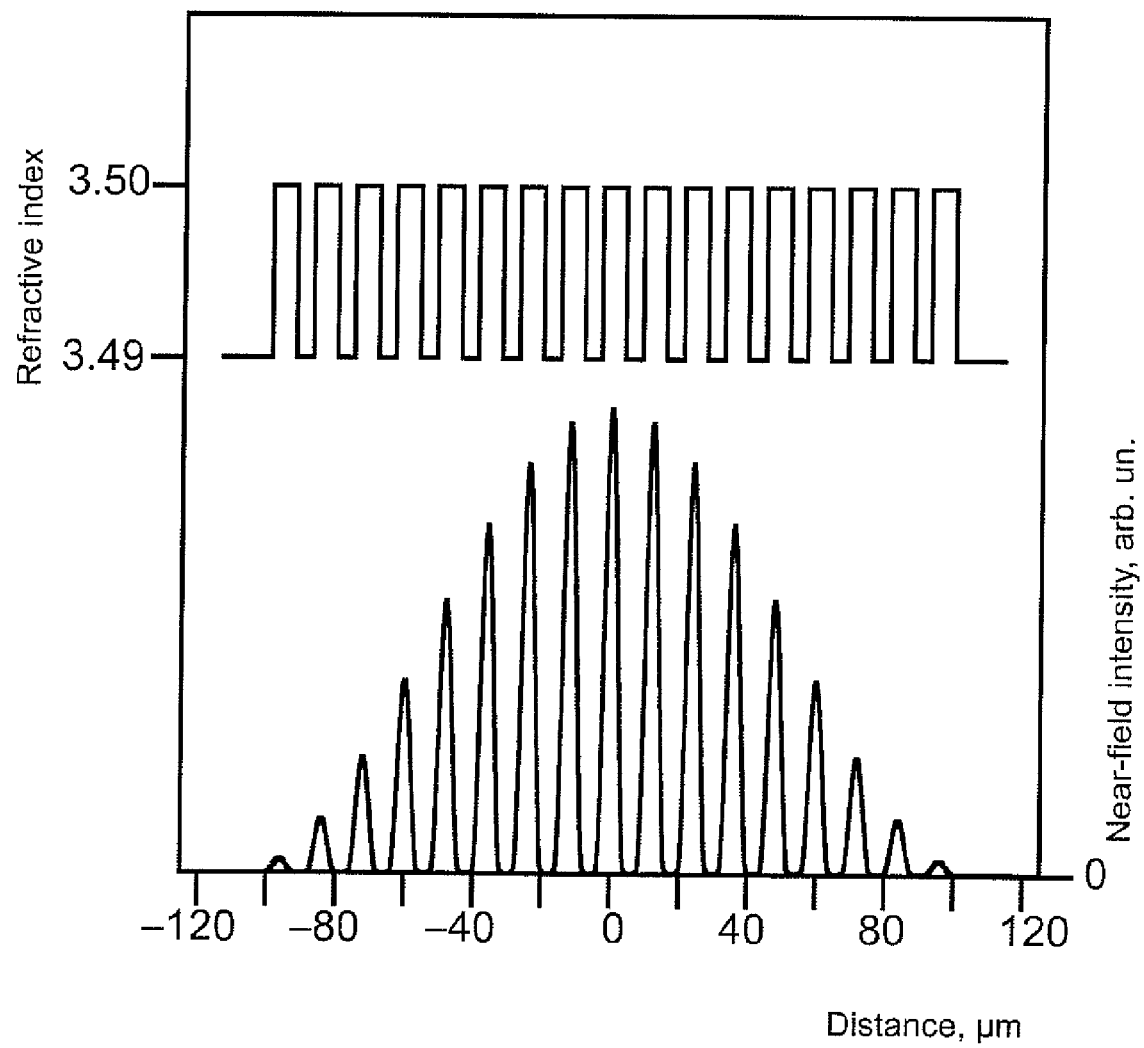
FIG. 24. Effective refractive index profile of FIG. 23 and the spatial intensity profile of the antisymmetric lateral optical mode of FIG. 23.

FIG. 24 shows the effective refractive index profile (same as in FIG. 23) and the intensity profile of the antisymmetric lateral optical mode.

Figure 25:
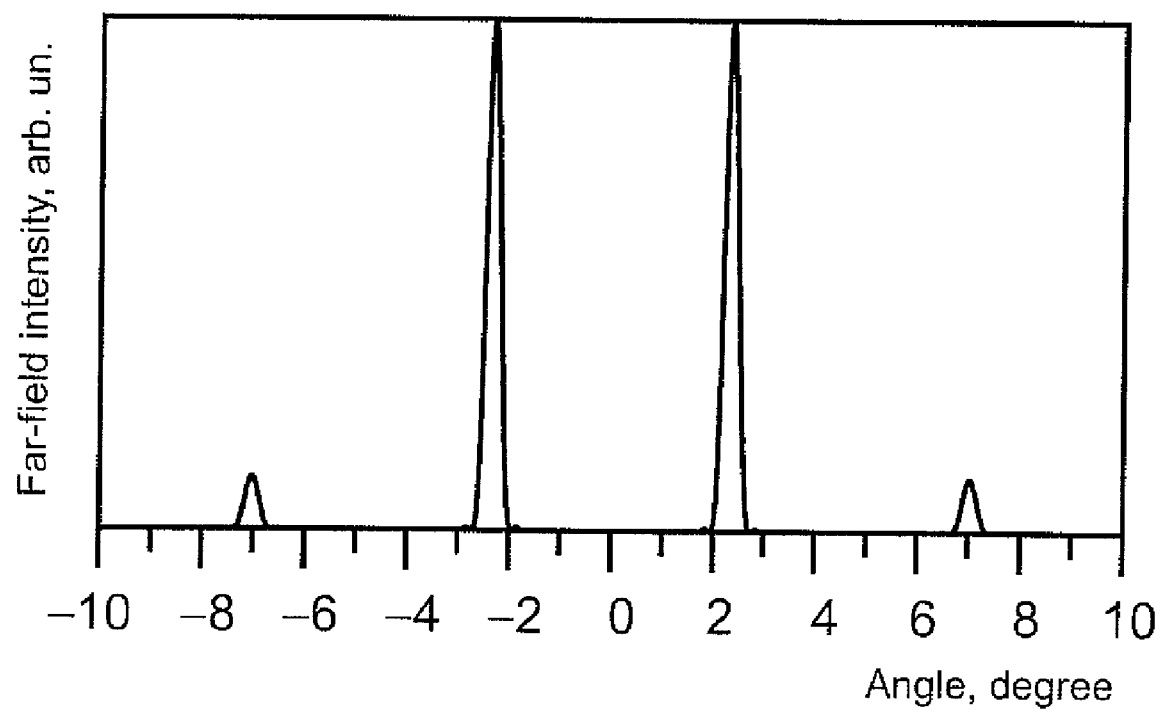
FIG. 25. Lateral far-field profile of the lateral optical mode of FIGS. 22 and 23.

FIG. 25 shows the far field profile of the antisymmetric optical mode. Practically the entire far field intensity of the antisymmetric mode is concentrated in two symmetric narrow lobes. A particular advantage of this mode is that the symmetric two-lobe pattern is focusable.

Further high-order modes have a much higher leakage loss and will be filtered out. To design such a structure, however, one should make such a refractive index profile that the active high-order mode is not filtered out itself and the leakage loss for it is designed to be reasonably low.

Figure 26:
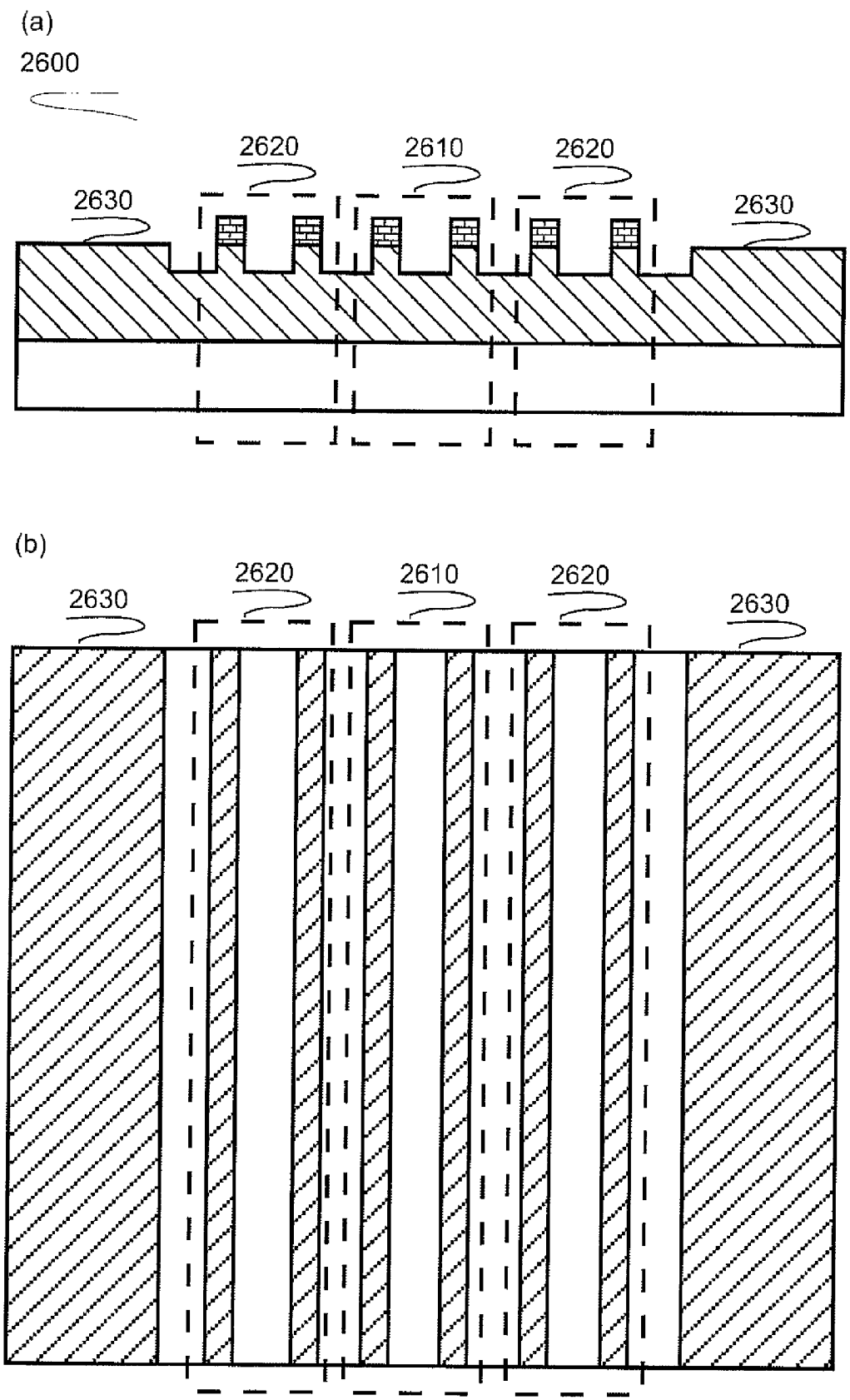
FIG. 26(a). View from the facet on an edge-emitting laser, on top of which a lateral photonic band crystal with leaky regions is formed, according to one of the embodiments of the present invention.
FIG. 26(b). Top view of the laser of FIG. 26(a). Only the central part of the lateral photonic band crystal structure is pumped or predominantly pumped.

FIG. 26(a) shows schematically a view from the facet on a laser (2600) with lateral photonic band crystal created by a periodic array of stripes and having on the left hand side and on the right hand side broad leaky regions (2630), into which optical modes can leak. The central region (2610) is preferably pumped, whereas the regions (2620) are preferably only weakly pumped or unpumped.

FIG. 26(b) shows schematically a top view of the same structure (2600).

Figure 27:
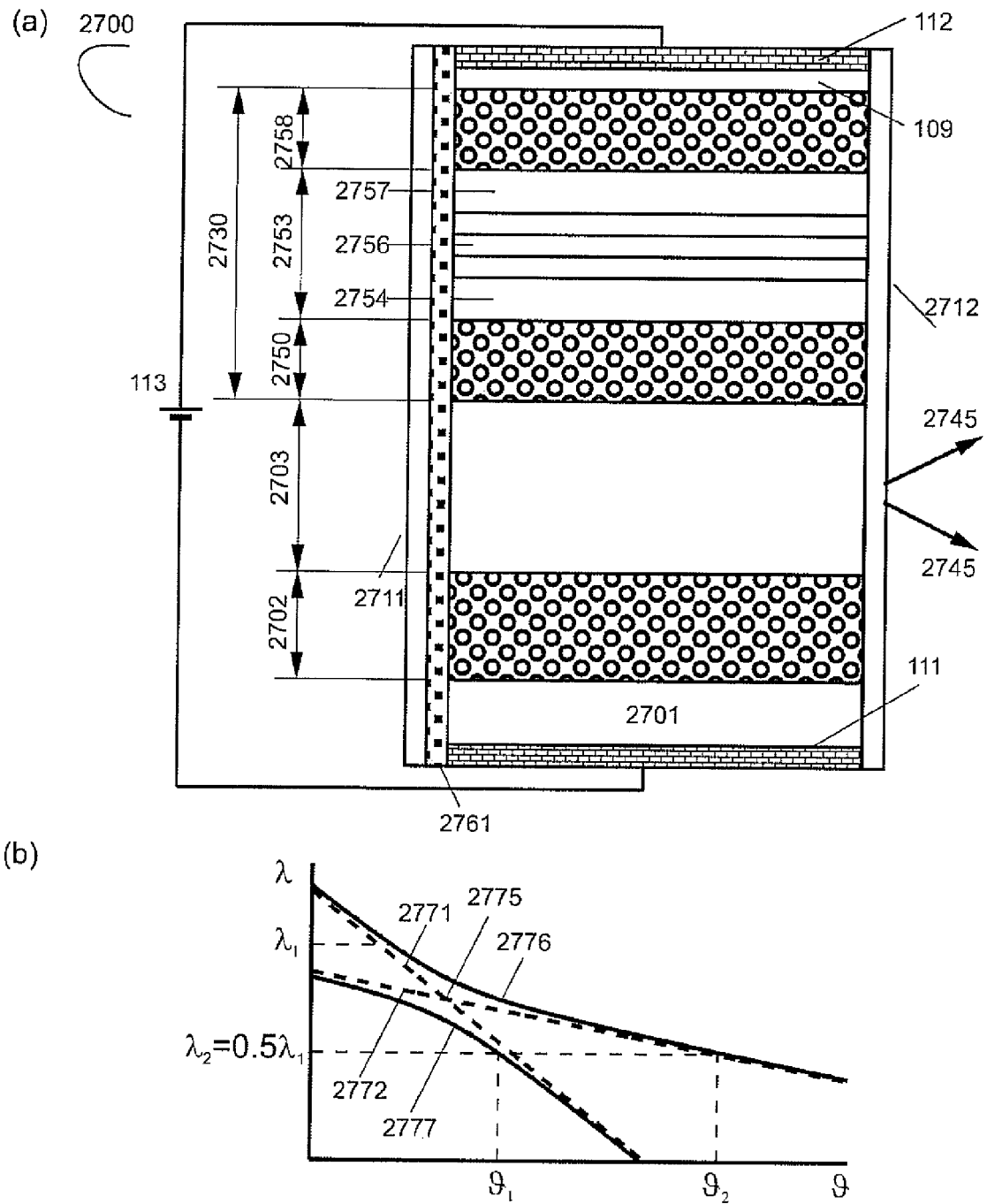
FIG. 27(a) shows a schematic illustration of an apparatus for generating wavelength-stabilized light according to yet another embodiment of the present invention, wherein second harmonic generation occurs in the material of the cavities, and light at the second harmonics is preferably emitted.
FIG. 27(b) illustrates a schematic diagram of the dispersion curves of two coupled cavities of a device of the embodiment of FIG. 27(a).

The physical mechanism of the selection of the vertical optical modes in the lasers of the present invention based on the phase matching effect in coupled cavity geometry allows a novel all-epitaxial apparatus for second harmonic generation, which does not include any external mirrors or external optically non-linear crystals. FIG. 27(a) illustrates schematically an apparatus (2700) for generating wavelength-stabilized laser radiation according to a further embodiment of the present invention. The apparatus (2700) is grown epitaxially on a substrate (2701) and comprises a first reflector (2758), a first cavity (2753), a second reflector (2750), a second cavity (2703), and a third reflector (2702). Reflectors in the present embodiment are realized as evanescent reflectors, or just cladding layers.

The apparatus (2700) operates as follows. The active region (2756) located in the first cavity (2753) generates optical gain when a forward bias (113) is applied. Light is generated in the spectral region determined by the gain spectrum of the active region (2756). The material of the cavity (2753) is a non-linear optical material, capable to generate a higher harmonic of light. Preferably, the material of the cavity (2753) is capable to generate a second harmonic of light. Thus, if the active region (2756) generates a first harmonic of light at a wavelength $\lambda_1$, this light can be partially or completely transformed into light at a second harmonic at the wavelength $\lambda_2=0.5\lambda_1$. Non-linear optical properties are present in most of conventional semiconductor materials, particular in III-V semiconductor materials or III-V semiconductor alloys, including but not limited to GaAs, AlAs, InP, GaP, GaSb, GaN, AlN, and alloys of these materials. As the bulk symmetry of III-V semiconductor materials does not include the center of inversion, these materials are capable to generate a second harmonic of light. All layers of the apparatus (2700), apart from the active region (2756) are formed of materials transparent for both the first and the second harmonics of light. However, the active region (2756), formed preferably by quantum wells, quantum wires, quantum dots or their combination, when generate light at a first harmonic at a wavelength $\lambda_1$, is usually absorbing the second harmonic of light at the second harmonic at a wavelength $\lambda_2=0.5\lambda_1$. This hinders extraction of the second harmonic of light from a conventional optoelectronic device.

The apparatus (2700) overcomes this problem. The cavities (2753) and (2703), and the reflectors (2758), (2750), and (2702) are selected as follows. The dispersion curve of an optical mode confined solely in the first cavity (2753) showing the wavelength as a function of a tilt angle θ is depicted in FIG. 27(b) as a dashed curve (2771). This mode corresponds to a situation where the evanescent reflector (2750) is sufficiently thick such that no interaction between the first cavity (2753) and the second cavity (2703) occurs. The dispersion curve of an optical mode confined solely in the second cavity (2703) is depicted in FIG. 27(b) as a dashed curve (2772). The curves (2771) and (2772) intersect at a point (2775). If the reflector (2750) has a medium or small thickness, the interaction between the optical modes confined in the two cavities occurs, resulting in anti-crossing of the dispersion curves. The dispersion curves shown by the solid lines (2776) and (2777) refer to the combined optical modes in the coupled cavities (2753) and (2703). The wavelength of the first harmonic of light generated by the active region (2756) is marked $\lambda_1$. The apparatus (2700) is preferably selected such that the dispersion curve of the combined optical mode (2777) at the wavelength of the first harmonic $\lambda_1$ is located close to the dispersion curve of the optical mode (2771) referring to an isolated first cavity (2053). It means that this optical mode is located mainly in the first cavity (2053). At the wavelength of the second harmonic $\lambda_2=0.5\lambda_1$ two optical modes exist in the apparatus (2700), a first mode having an effective angle $\vartheta$, and a second mode having an effective angle $\vartheta$. The dispersion curve of the combined optical mode (2776) at the wavelength of the second harmonic $\lambda_2=0.5\lambda_1$ is close to the dispersion curve of the optical mode (2772) referring to an isolated second cavity (2703). It means that the second combined optical mode at the wavelength of the second harmonic is located mainly in the second cavity (2703). This mode is then only weakly absorbed by the active region (2756). An effective selection between two combined optical modes at the wavelength of the second harmonic of light can be realized in one of the following ways.

A first method of selection is as follows. The spatial profile of the combined optical mode at larger effective angles, i.e. the profile of the second combined optical mode related to the dispersion curve (2776) has a smaller number of nodes of the optical field, i.e. of the electric field (for transversal electric modes) or of the magnetic field (for transverse magnetic modes), than the profile of the mode related to the dispersion curve (2777). Due to a different position of the nodes of the two combined modes at the second harmonic of light, the non-linear transformation coefficient of the light at a first harmonic to the first optical mode at a second harmonic is preferably made significantly smaller than the non-linear transformation coefficient of the transformation of light to the second optical mode at a second harmonic, despite the fact that the second mode at the wavelength of the second harmonic of light is mainly located in the second cavity.

A second method of selection is based on positioning the active region (2756) in a node of the optical field of one of the modes at the wavelength of the second harmonic. Then this mode is not absorbed by the active region (2756). As the first mode has a larger number of nodes than the second mode at the second harmonic, then the first mode is preferably selected.

A third method of selection is based on different conditions for constructive and destructive interference of the two optical modes at the wavelength of the second harmonic. The apparatus (2700) is preferably selected such that phase matching needed for lasing occurs for the second mode at the second harmonic of light and does not occur for the first mode at the second harmonic of light. A combination of these methods can be used for selection of the optical mode at the second harmonic which is not absorbed by the active region (2756). Three or more coupled cavities can be introduced. One or more, or all reflectors can be realized as multilayer interference reflectors (MIRs).

The apparatus (2700) has preferably an antireflecting coat (2712) deposited on the front facet and an antireflecting coat (2711) deposited on the rear facet. Both these coats reduce or prevent the emission of light at the first harmonic. Further, a highly reflecting coat (2761) for the second harmonic of light is preferably deposited on the rear facet, to ensure the emission of light at the second harmonic (2745) through the front facet only.

The apparatus (2700) generates preferably a wavelength-stabilized laser light at the second harmonic. Another embodiment is possible, where an apparatus generates laser light at the second harmonic, whereas the laser light is not wavelength-stabilized.

Non-linear optical effects in III-V semiconductors can be enhanced if the structure is epitaxially grown on a vicinal or a high-index substrate. Then quantum insertions in the active region can form arrays of quantum wires or dots, and not only quantum wells.

Figure 6:
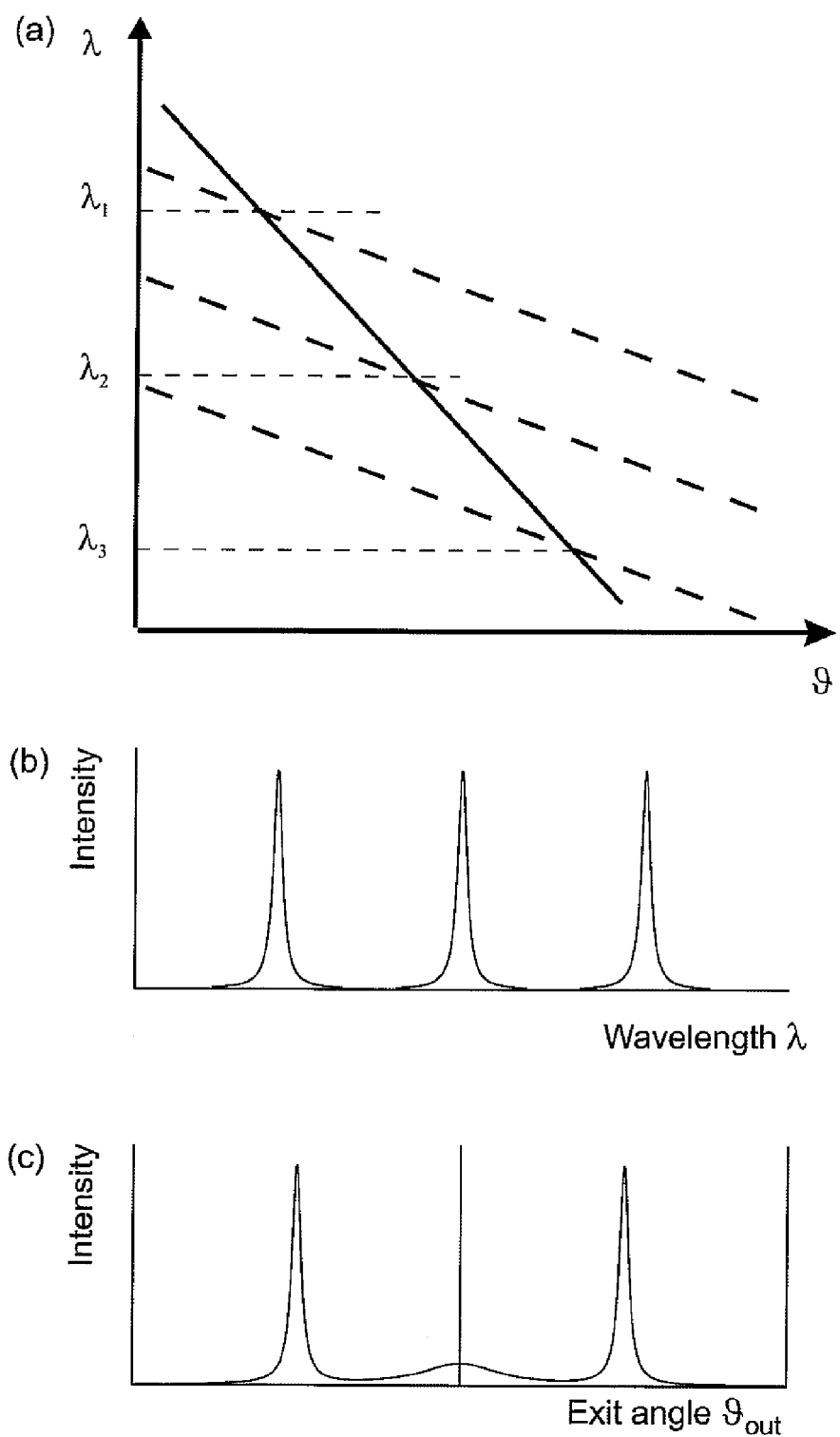
FIG. 6(a) shows the dispersion law curves corresponding to the tilted optical modes of two coupled cavities illustrating wavelength-stabilized operation of the apparatuses of the present invention.
FIG. 6(b) shows a schematic representation of an emission spectrum of a device of FIG. 5(b).
FIG. 6(c) shows a schematic representation of a far field pattern of a device of FIG. 5(b).
Figure 28:
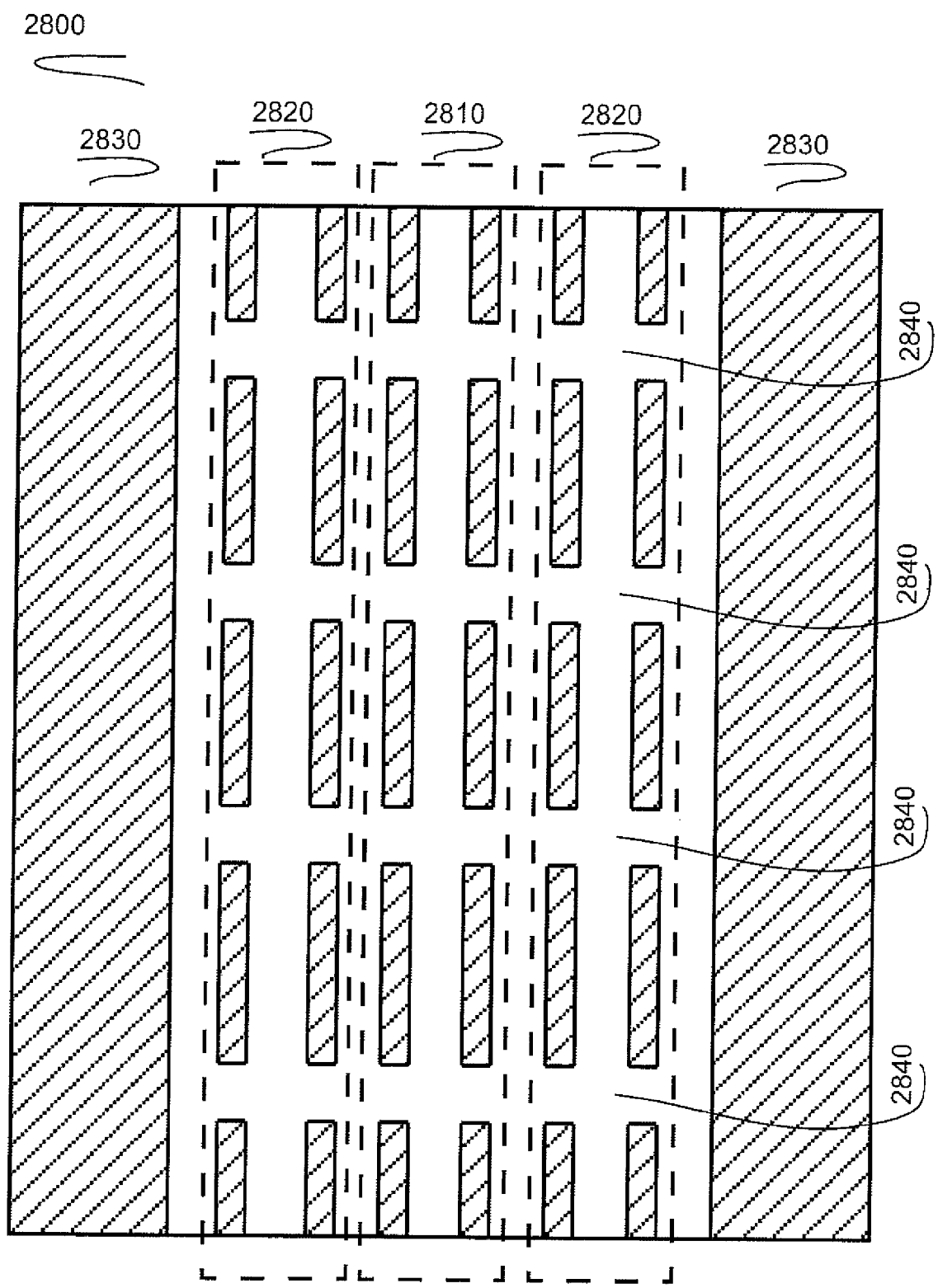
FIG. 28. Top view of a laser with a two-dimensional lateral photonic band crystal, according to one of the embodiments of the present invention, where the modulation of stripes in the longitudinal direction is used for wavelength stabilization. Only the central part of the lateral photonic band crystal structure is pumped or predominantly pumped FIG. 29. Top view of a laser with a two-dimensional lateral photonic band crystal, according to one of the embodiments of the present invention, where the modulation of stripes in the longitudinal direction is used for wavelength stabilization, and modulated stripes form a tilted two-dimensional pattern. Only the central part of the photonic band crystal structure is pumped or predominantly pumped FIG. 30. Top view of a laser with a flared design of a lateral photonic band crystal. Only the central part of the photonic band crystal structure is pumped or predominantly pumped.

The operation principles of the lasers of the present invention, which includes the selection of the vertical optical modes based on the phase matching criterion, also includes wavelength selectivity, as illustrated in FIGS. 6(*a*) and 6(*b*). The patterning of the surface allows to enhance the wavelength selectivity. FIG. 28 shows a top view on a laser (2800) with a lateral two-dimensional photonic band crystal formed of stripe ridges. The modulation in the transversal ("y") direction, perpendicular to the lateral propagation of light includes a strongly pumped region (2810), weakly pumped or unpumped regions (2820), and leaky regions (2830). Periodic modulation in the longitudinal ("x") direction includes breaks (2840) in the stripes, and this modulation creates a distributed feedback. The two-dimensional lateral photonic band crystal allows a single lateral mode wavelength-stabilized lasing, with enhanced wavelength selectivity.

Figure 29:
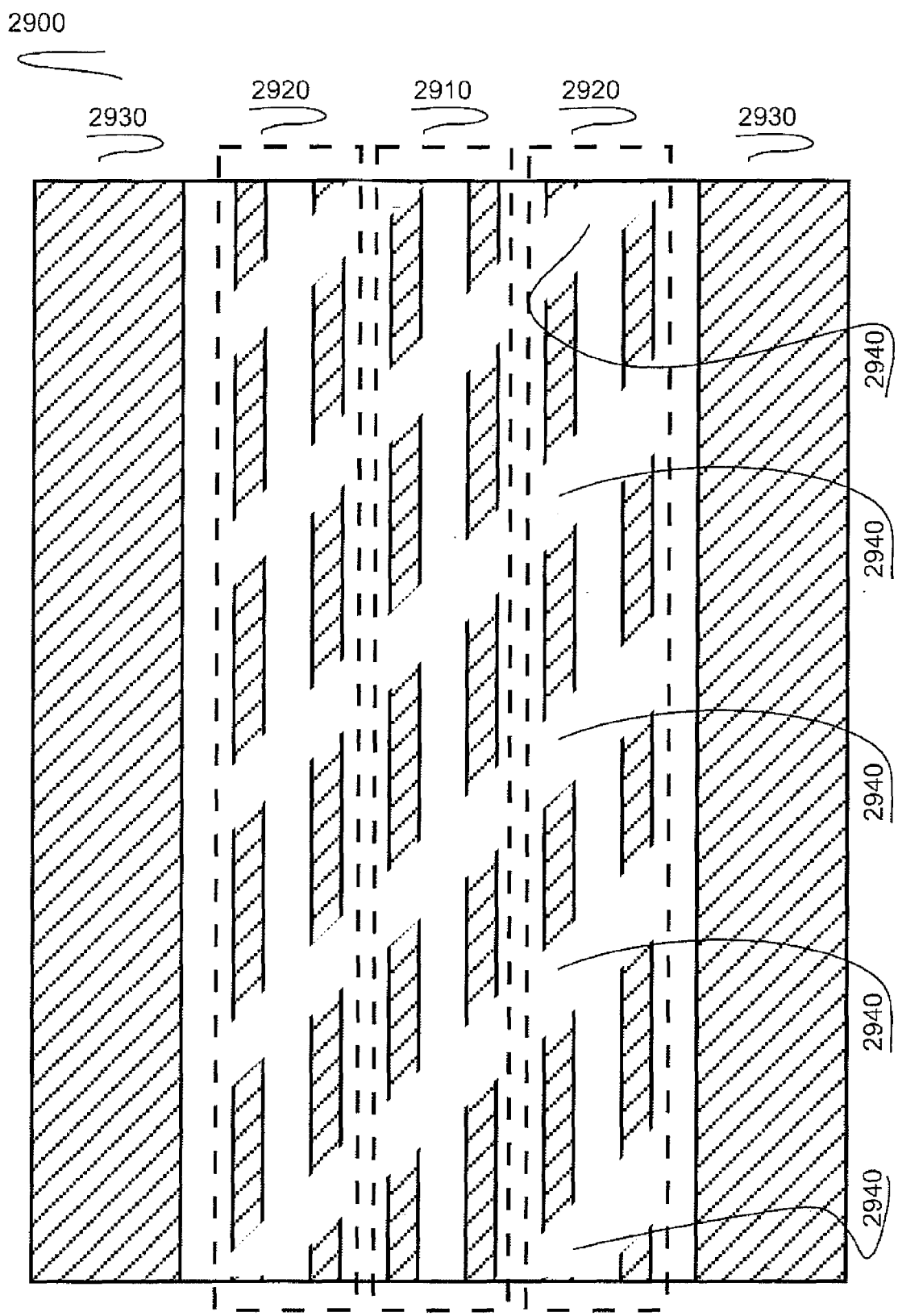

FIG. 29 shows a top view of a laser (2900) with a lateral two-dimensional photonic band crystal according to yet another embodiment of the present invention. The modulation in the transversal ("y") direction, perpendicular to the lateral propagation of light includes a strongly pumped region (2910), weakly pumped or unpumped regions (2920), and leaky regions (2930). The sequence of breaks (2940) in the stripes is forms not a rectangular (like in FIG. 28), but a tilted pattern. Again the two-dimensional lateral photonic band crystal allows a single lateral mode wavelength-stabilized lasing, with enhanced wavelength selectivity. The tilted angle is selected to obtain better wavelength selectivity.

Figure 30:
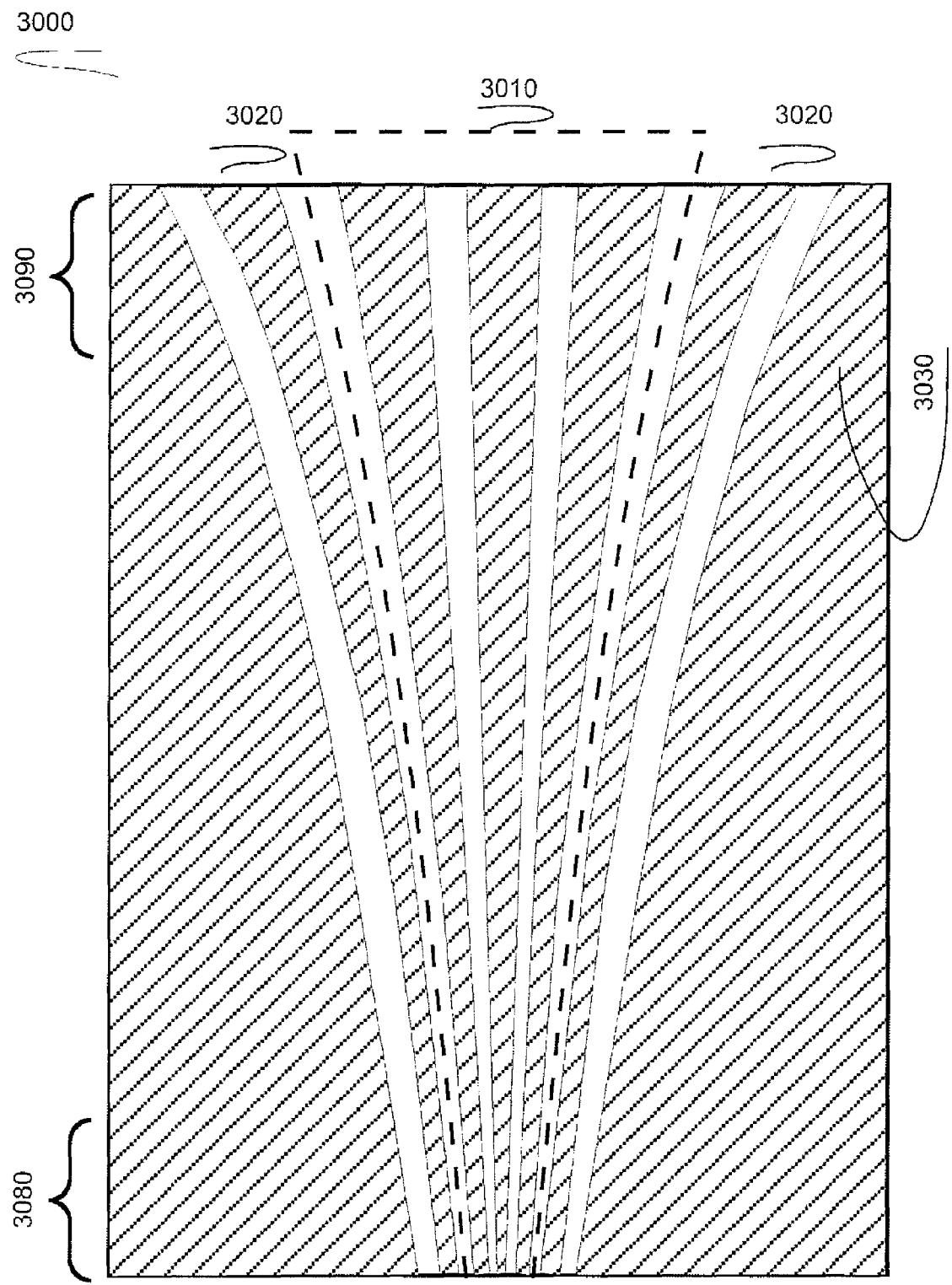

FIG. 30 shows a top view on a laser (3000), wherein the ridge pattern is flared. The lateral photonic band crystal in a narrow part (3080) allows a single lateral mode lasing, and this mode propagates to a part (3090) where the lateral photonic band crystal is broad, which allows a high power single lateral mode operation. The central part (3010) of the lateral photonic band crystal is preferably strongly pumped, whereas the neighboring regions (3020) are preferably unpumped, or weakly pumped. The regions (3030) are unpumped leaky regions.

One another embodiment of the present invention is possible, where the processing used in the formation of a lateral photonic band crystal includes not only the top cladding layer, but also a part of the waveguide. In yet another embodiment of the present invention, a multilayer structure operates as a top cladding layer, and this multilayer structure is selectively etched in the process of the formation of the lateral photonic band crystal. In all these cases one can define a top cladding layer such that i) all processing affects only the top cladding layer, and the waveguide remains untouched, and ii) the top cladding layer can be either a single epitaxial layer, or a multilayer structure.

Under this definition, the active medium is located within the waveguide and is not affected by the processing of the top cladding layer. One another embodiment is possible, wherein the active medium is etched through. This is not preferred in the case of quantum well laser, as etching creates a high defect density, wherein defects act as centers of non-radiative recombination severely deteriorating the optical performance of the device. In the case of quantum dot laser, the active medium can be etched through, and the device can still operate. Thus, one can describe the device of the present disclosure as a device wherein the active region is located either within the waveguide, or within the top cladding layer.

One can also define the vertical extension of the vertical optical mode as a distance at which 90% of the optical power is concentrated.

Though the above described embodiments allow obtaining broad area, single-lateral mode lasers having a narrow lateral beam divergence, these approaches have certain limitations.

The broader is the laser, the broader is the lateral photonic band crystal, the larger is the number of lateral optical modes, and the weaker is the mode discrimination. Moreover, for extremely broad area lasers, very tough requirements on technological tolerance arise. The inevitable variations of the stripe widths and depths can create parasitic localization potential for optical modes, apart from selected optical defect of the lateral photonic band crystal, thus deteriorating the operation of the device. Practically feasible are lasers with pumped laser area up to 200-300 micrometers. Such broad area lasers, or field coupled laser arrays, are capable to emit a single mode laser light having an output power up to 10 W continuous wave operation.

Figure 31:
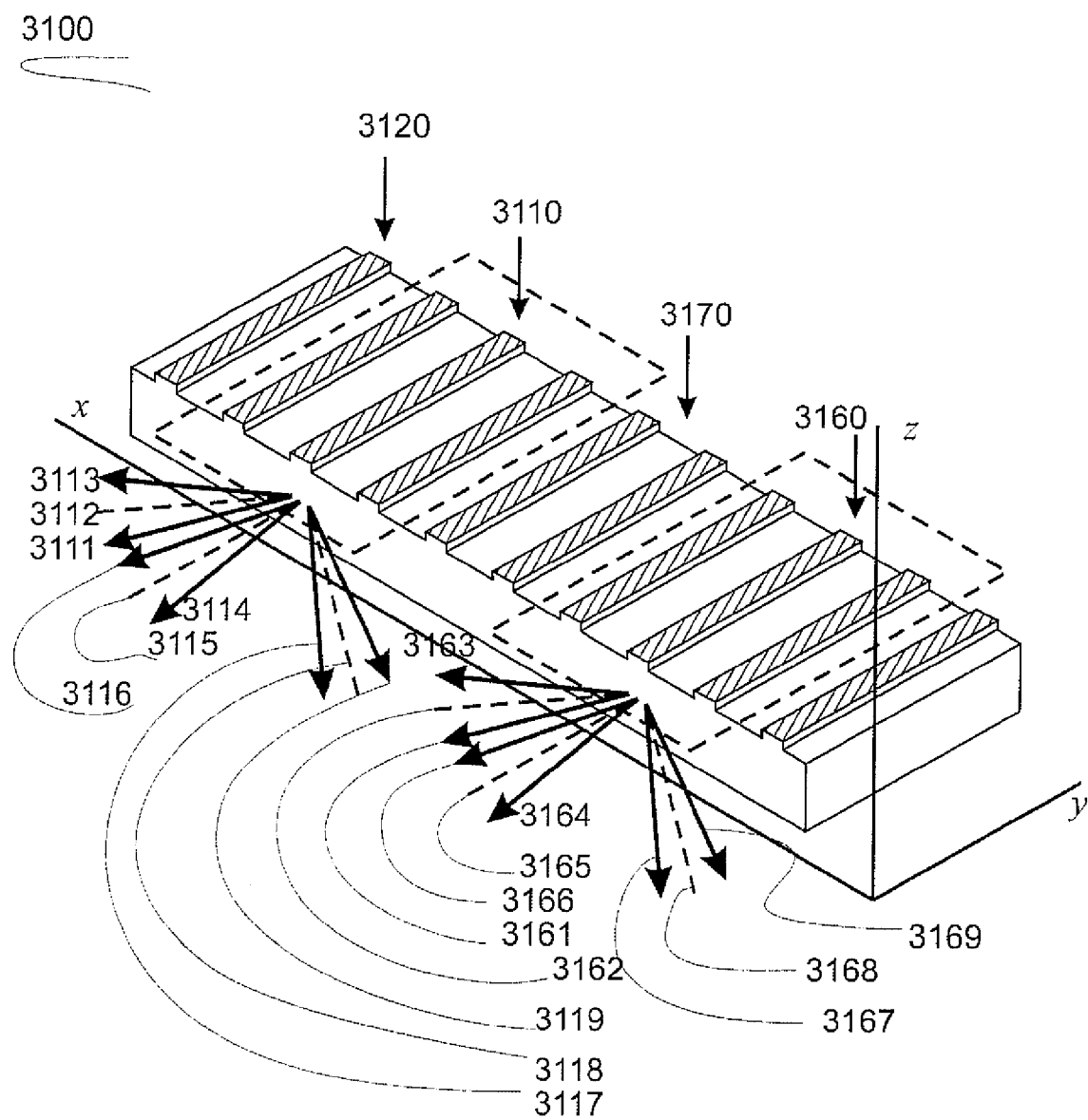
FIG. 31. Schematic diagram showing a prospective view of an array of uncoupled gain chips based on lateral photonic band crystals, according to one embodiment of the present invention.

In order to achieve even higher output power in a single lateral mode with a narrow lateral beam divergence, lasers or laser systems with even broader pumped area are needed. Further embodiments of the present invention focus on solving this problem. FIG. 31 shows a schematic diagram showing a prospective view of a laser bar (3100) of uncoupled lasers based on lateral photonic band crystals, according to one embodiment of the present invention. The lasers are processed on a single epitaxial wafer. A lateral photonic band crystal is fabricated on top of the laser structure. The lateral photonic band crystal comprises at least two pumped regions separated by an unpumped leaky region. FIG. 31 shows a first pumped region (3110) and a second pumped region (3160). The structure comprises preferably a plurality of pumped regions, preferably at least five. Each two neighboring pumped regions are separated by an unpumped leaky region. Two of the unpumped leaky regions (3120) and (3170) are shown in FIG. 31. A region neighboring to the first pumped region on the side opposite to a second pumped region is preferably also an unpumped leaky region. A region neighboring to the last pumped region on the side opposite to a first pumped region is preferably also an unpumped leaky region.

When the array of lasers operates, each pumped region on the background of the neighboring unpumped regions acts as an optical defect in the lateral photonic band crystal, and each of the pumped regions emits light in a single lateral optical mode. As the vertical far field of the laser of the present invention typical contains two vertical lobes, as shown in FIG. 5 and FIG. 8, and the lateral far field of a single field coupled array contains typically three lateral lobes (as shown in FIG. 22), each of the pumped field coupled arrays, (3110), (3160) and others emits light in six lobes. This is shown in FIG. 31. Concerning laser light emitted by the field coupled laser array (3110), the emitted beams projected on the (xy) plane form three lines. The central line (3115) is formed by the projection of the central beam directed downwards (3114) and the central beam directed upwards (3116). One side line (3112) is formed by the projection of the side beam directed downwards (3111) and the side beam directed upwards (3113). Another side line (3118) is formed by the projection of the side beam directed downwards (3117) and the side beam directed upwards (3119).

Similarly, the field coupled laser array (3160) emits laser light in six lobes. The emitted beams projected on the (xy) plane form three lines. The central line (3165) is formed by the projection of the central beam directed downwards (3164) and the central beam directed upwards (3166). One side line (3162) is formed by the projection of the side beam directed downwards (3161) and the side beam directed upwards (3163). Another side line (3168) is formed by the projection of the side beam directed downwards (3167) and the side beam directed upwards (3169).

However, optical fields generated by the different pumped regions, e.g. (3110) and (3160) are not coupled. It means that, although each of the pumped regions emits a single lateral optical mode of the laser light, a bar as a whole operates in a multi-mode regime, similar to the case of filamentation. It is possible to obtain a higher power from the laser bar (3100) shown in FIG. 31 than from a single laser, like one shown in FIG. 17. However, light emitted from the laser bar (3100) will not be single-mode. In order to obtain a single lateral mode light from the whole array, additional means are needed.

Figure 32:
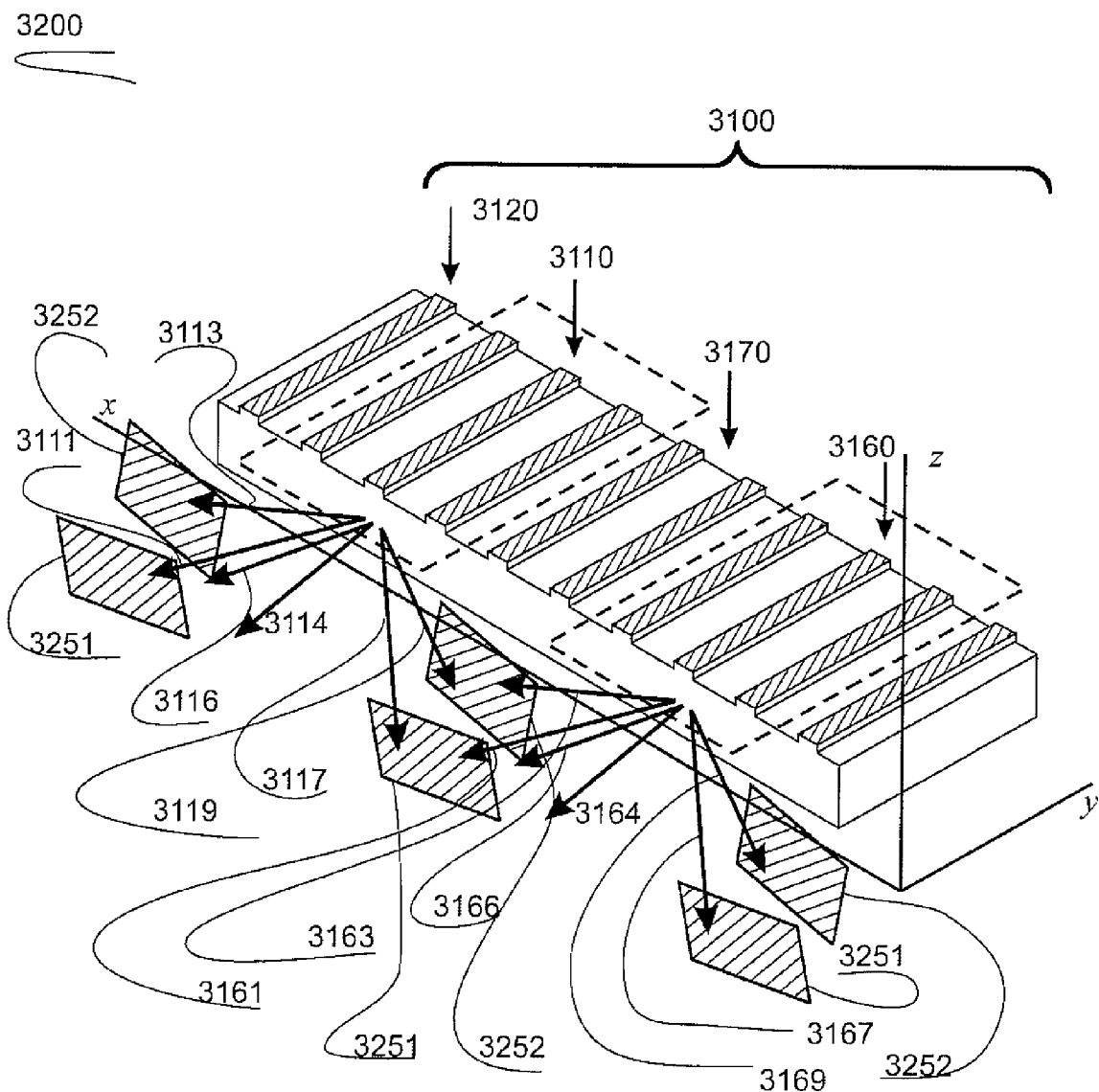
FIG. 32. Schematic diagram showing a prospective view of a system comprising an array of gain chips formed on a single bar and an array of external mirrors forming a single lateral mode of the emitted laser light, according to another embodiment of the present invention.

FIG. 32 shows a schematic diagram showing a prospective view of a system (3200) comprising an array of gain chips formed on a single laser bar (3100) and an array of external mirrors, according to another embodiment of the present invention. External mirrors are placed such that light emitted from the neighboring pumped regions in the side lobes of the far-field pattern impinge on the same mirror. In FIG. 32, light emitted by the first pumped region (3110) in the side lobe (3117) and light emitted by the second pumped region in the side lobe (3161) impinge on the same external mirror (3251) in the set of external mirrors. As each array of gain chips emits light in the vertical direction both downwards and upwards, the system (3200) comprises two sets of external mirrors. The bottom set of external mirrors (3251) couples light emitted by the neighboring arrays of gain chips downwards. For example, one of the mirrors from the bottom set (3251) couples light in the side lobe (3117) emitted downwards by the array (3110) and light in the side lobe (3161) emitted downwards by the array (3160). The top set of external mirrors (3252) couples light emitted by the neighboring array of gain chips upwards. For example, one of the mirrors from the top set (3252) couples light in the side lobe (3119) emitted upwards by the array (3110) and light in the side lobe (3163) emitted upwards by the array (3160).

Each of the gain chips forming the bar of FIG. 32 is preferably set such that without external mirrors, the losses are sufficiently high, and each of the gain chips operates not as a laser, but as a light-emitting diode. In the preferred embodiment of the present invention this is achieved by depositing an antireflecting coat on a front facet of the array. The antireflecting coat increases the optical output loss referring either to the central lobes, or the side lobes, or both. The external mirrors are preferably selected such that they are not transparent or only weakly transparent for light impinging on the mirrors at a tilt angle, wherein the tilt angle refers to the side lobes of the far-field pattern of each single pumped region. The external mirrors are preferably formed of multilayer dielectric structures.

The external mirrors combine two functionalities. First, the mirrors reduce the optical output loss. Second, the mirrors provide a positive feedback between the neighboring pumped regions. Preferably, the mirrors are selected such that the positive feedback occurs and the optical output loss is significantly reduces such that the overall gain overcomes the overall loss only for one lateral optical mode which is the lateral fundamental optical mode for the whole bar consisting of gain chips. Thus, the system comprising an array of gain chips combined with an array of external mirrors is capable to emit coherent laser light in a single lateral optical mode achieving a very high output power. As the array provides a very narrow lateral far field, it also provides a very high output power density.

Thus, the laser bar (3200) emitting laser light in a single coherent lateral optical mode may be considered as a field coupled laser bar.

A laser bar of the embodiment of FIG. 32 can consist of a plurality of gain chips. The only limitation is that all gain chips are formed on a single epitaxial wafer. Thus, a natural limitation on an overall width of a laser array of the embodiment of FIG. 32 is set by the diameter of the epitaxial wafer. For three-inch wafers, this diameter is about 7.6 centimeters. Thus, it is possible to define that the preferred width of the laser array of the embodiment of FIG. 32 is up to 10 centimeters. The field coupled laser bar of such dimensions is capable to emit laser light at the output power up to 100 W continuous wave operation, thus realizing ultra high power ultra high brightness laser system.

In a further embodiment of the present invention, a lateral photonic band crystal on top of each of the gain chips is a two-dimensional photonic band crystal. Lateral periodicity in the direction of light propagation acts as distributed feedback, thus enhancing wavelength stabilization of the emitted laser light.

Figure 33:
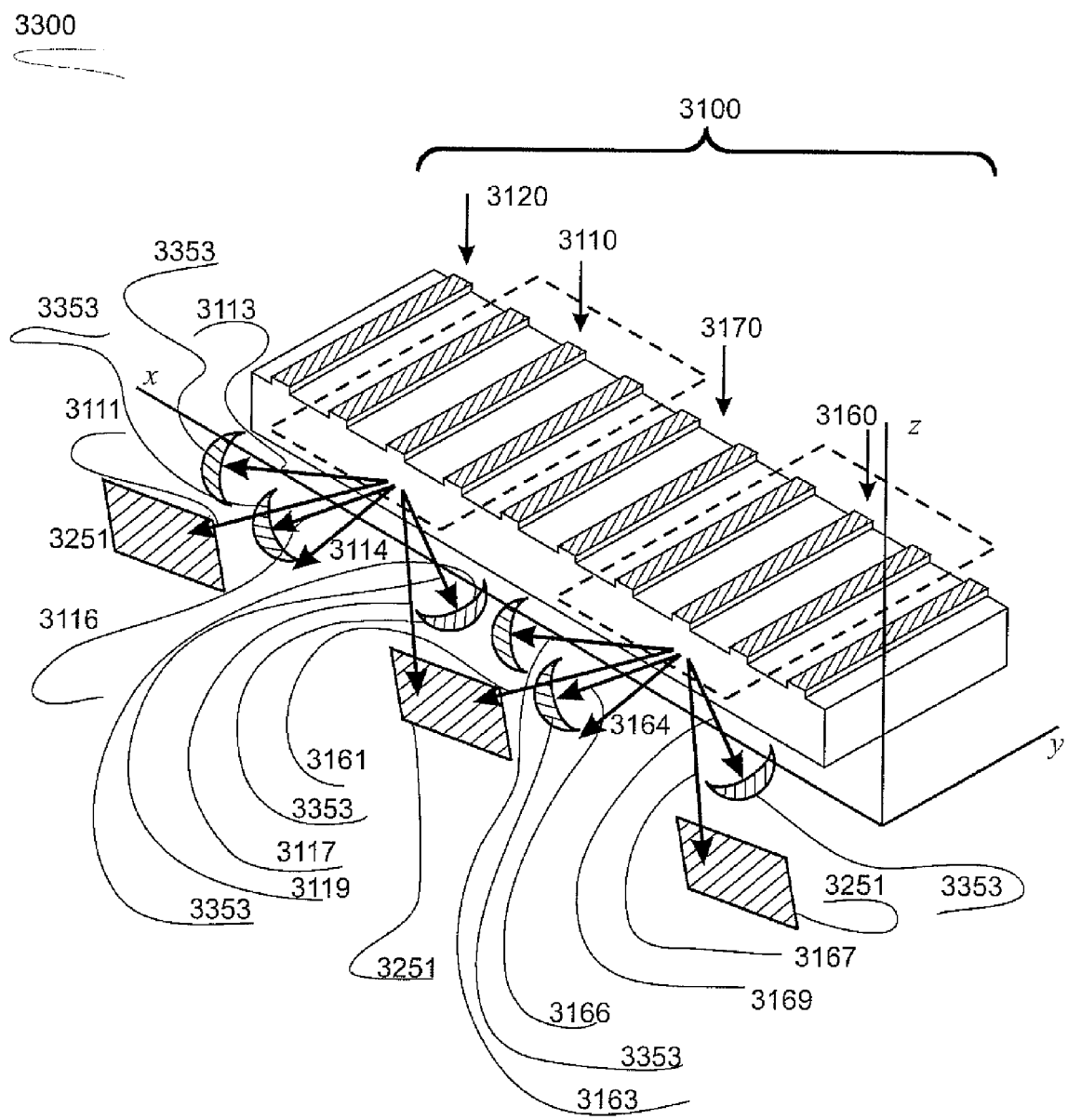
FIG. 33. Schematic diagram showing a prospective view of a system comprising an array of gain chips formed on a single bar and an array of external mirrors forming a single lateral mode of the emitted laser light, according to yet another embodiment of the present invention.

FIG. 33 shows a schematic diagram shows a prospective view on a system (3300) comprising a laser bar (3100) and an array of external mirrors, according to yet another embodiment of the present invention. A set of collecting mirrors (3353) is included, and light emitted by each array of gain chip in upward direction impinges on a collecting mirror (3353) and is reflected back to the array. Thus, light emitted by the array (3110) in the lobes (3113), (3116), and (3119) as well as light emitted by the array (3160) in the lobes (3613), (3616), and (3619) impinge on collecting mirrors (3353) and are reflect back to the gain chips. Light emitted by neighboring array of the gain chips in downward direction is coupled by the set of external mirrors (3251). Thus, as shown in FIG. 33, light emitted by the array (3110) in the side lobe (3117) and light emitted by the array (3160) in the side lobe (3161) impinge on the same external mirror of the set (3251). Thus, a field couple laser bar is formed which emits laser light in a single lateral optical mode.

Figure 34:
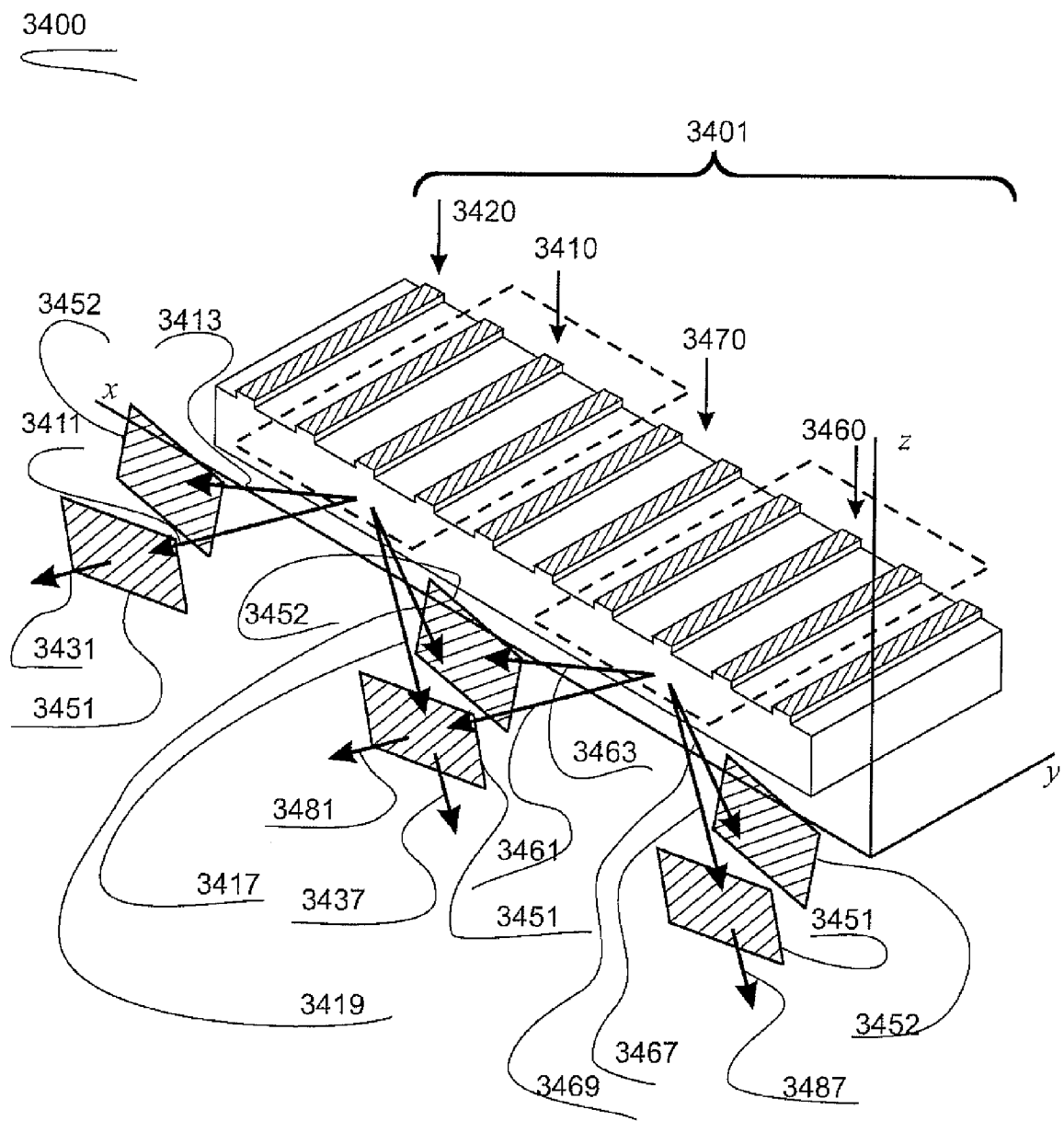
FIG. 34. Schematic diagram showing a prospective view of a system comprising an array of gain chips formed on a single bar and an array of external mirrors forming a single lateral mode of the emitted laser light, according to a further embodiment of the present invention.

FIG. 34 shows a schematic diagram showing a prospective view of a system (3400) comprising an array of gain chips formed on a single bar (3401) and an array of external mirrors (3451) and (3452), according to yet another embodiment of the present invention. The gain chips of the array (3400) are processed on a single epitaxial wafer, thus FIG. 34 shows one bar. A lateral photonic band crystal is fabricated on top of the laser structure. The lateral photonic band crystal comprises at least two pumped regions separated by an unpumped leaky region. FIG. 34 shows a first pumped region (3410) and a second pumped region (3460). The structure comprises preferably a plurality of pumped regions, preferably at least five. Each two neighboring pumped regions are separated by an unpumped leaky region. Two of the unpumped leaky regions (3420) and (3470) are shown in FIG. 34. A region neighboring to the first pumped region on the side opposite to a second pumped region is preferably also an unpumped leaky region. A region neighboring to the last pumped region on the side opposite to a first pumped region is preferably also an unpumped-leaky region.

When the array of gain chips operates, each pumped region on the background of the neighboring unpumped regions acts as an optical defect in the lateral photonic band crystal, and each of the pumped regions emits light in a single lateral optical mode. The spacing between ridges, particularly the parts of the active region between the ridges act as absorbers. Then each of the lasers formed by separate pumped regions in FIG. 34, emits light in an oscillating lateral optical mode of FIG. 23, which has a two-lobe lateral far-field pattern of FIG. 25. As the vertical far field of the laser of the present invention typical contains two vertical lobes, as shown in FIG. 5 and FIG. 8, each of the pumped field coupled arrays, (3410), (3460) an others emits light in four lobes. This is shown in FIG. 34. Concerning laser light emitted by the field coupled laser array (3410), it emits light in a side lobe (3411) directed downwards, in a side lobe (3413) directed upwards, in a side lobe (3417) directed downwards, and in a side lobe (3419) directed upwards.

Similarly, the field coupled laser array (3460) emits laser light also in four lobes. It emits light in a side lobe (3461) directed downwards, in a side lobe (3463) directed upwards, in a side lobe (3467) directed downwards, and in a side lobe (3469) directed upwards.

The system (3400) contains two sets of external mirrors. External mirrors (3451) of a first set are placed such that light emitted from the neighboring pumped regions in the side lobes directed downwards impinge of the same mirror. In FIG. 34, light emitted by the first pumped region (3410) in the side lobe (3417) and light emitted by the second pumped region (3460) in the side lobe (3461) impinge on the same external mirror from the set (3451).

External mirrors (3452) of a second set are placed such that light emitted from the neighboring pumped regions in the side lobes directed upwards impinge on the same mirror. In FIG. 34, light emitted by the first pumped region (3410) in the side lobe (3419) and light emitted by the second pumped region (3460) in the side lobe (3463) impinge on the same external mirror from the set (3452).

Each of the gain chips forming the bar (3400) of FIG. 34 is preferably set such that without external mirrors, the losses are sufficiently high, and each of the gain chips operates not as a laser, but as a light-emitting diode. In the embodiment of the present invention of FIG. 34 this is achieved by depositing an antireflecting coat on a front facet of the laser array. The external mirrors (3451) of the first set of external mirrors are selected to be semi-transparent for the tilted light impinging on the external mirrors at an angle corresponding to the side lobes of the far-field pattern of each single pumped region. The external mirrors are preferably formed of multilayer dielectric structures. Light transmitted through the external mirrors (3451) is shown as beams (3431), (3481), (3437), (3489). The external mirrors (3452) of the second set are selected to be non-transparent, so that no light comes through the mirrors (3452). Mirrors (3452) provide additional optical coupling between neighboring pumped regions.

The external mirrors reduce the optical output loss and provide coupling of the optical light between neighboring pumped regions. Preferably, the mirrors are selected such that the positive feedback occurs and the optical output loss is significantly reduces such that the overall gain overcomes the overall loss only for a single lateral optical mode extended throughout the entire array of lasers. This is an oscillating lateral optical mode, and the lateral far field pattern of this mode is a two-lobe pattern. Thus, the system comprising an array of gain chips and an array of external mirrors is capable to emit coherent laser light in a single lateral optical mode achieving a very high output power. As the array of gain chips provides a very narrow lateral far field in each of the two lobes, it also provides a very high output power density.

In another embodiment of the present invention, a set of collecting mirrors is introduced such that each light beam emitted upwards is reflected back to a corresponding gain chip. Light beams emitted downwards by the neighboring gain chips are optically coupled by external mirrors.

In yet another embodiment of the present invention, both the external mirrors coupling light emitted downwards and external mirrors coupling light emitted upwards are semi-transparent, such that the entire laser bar emits light in four lobes.

Figure 35:
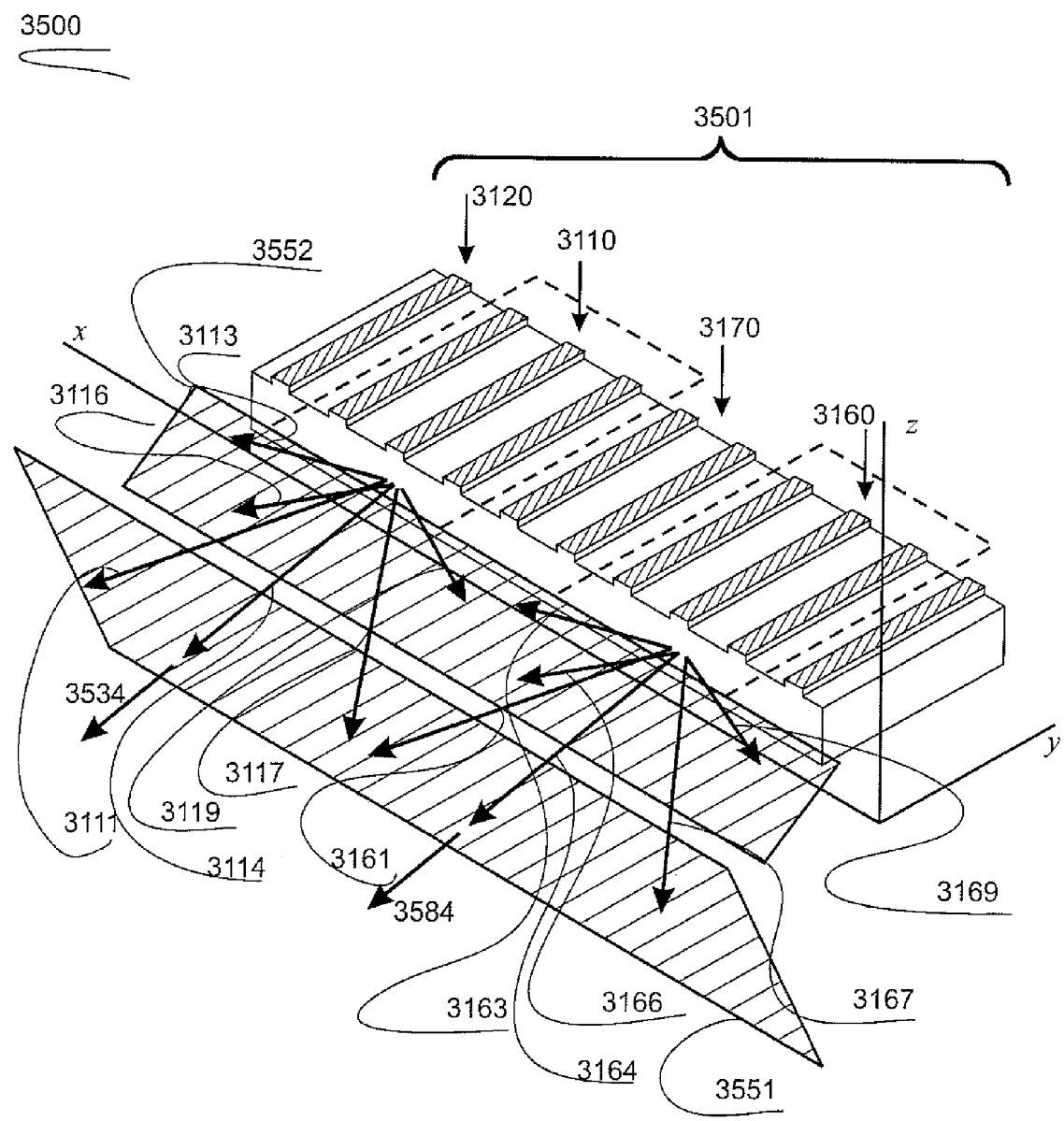
FIG. 35. Schematic diagram showing a prospective view of a system comprising an array of gain chips formed on a single laser bar and two external mirrors forming a single lateral mode of the emitted laser light, according to another embodiment of the present invention.

FIG. 35 shows a schematic diagram showing a prospective view of a system (3500) comprising an array of gain chips formed on a single laser bar (3501) and two external mirrors, (3551) and (3552) according to a further embodiment of the present invention. The gain chips are processed on a single epitaxial wafer, thus FIG. 35 shows one bar. A lateral photonic band crystal is fabricated on top of the structure. The lateral photonic band crystal comprises at least two pumped regions separated by an unpumped leaky region. Two pumped regions (3110) and (3160) are shown in FIG. 35. The system (3500) comprises preferably a plurality of pumped regions, preferably at least five. Each two neighboring pumped regions are separated by an unpumped leaky region. Two unpumped regions (3120) and (3170) are shown. A region neighboring to the first pumped region on the side opposite to a second pumped region is preferably also an unpumped leaky region. A region neighboring to the last pumped region on the side opposite to a first pumped region is preferably also an unpumped leaky region.

When the array of gain chips operates, each pumped region on the background of the neighboring unpumped regions acts as an optical defect in the lateral photonic band crystal, and each of the pumped regions emits light in one lateral optical mode.

The far field of the light emitted by each pumped region contains, similarly to the embodiment of FIG. 32, six lobes. Light emitted in three lobes downwards impinges on a first external mirror (3551). It is shown in FIG. 35, that light emitted by the first pumped region (3110) in the three lobes directed downwards, (3111), (3114), and (3117), and light emitted by the second pumped region (3160) in the three lobes directed downwards, (3161), (3164), and (3167), impinge on the first external mirror (3551). Light emitted in the three lobes directed upward impinges on a second external mirror (3552). It is shown in FIG. 35, that light emitted by the second pumped region (3160) in the three lobes directed upwards, (3113), (3116), and (3119), and light emitted by the second pumped region (3160) in the three lobes directed upwards, (3163), (3166), and (3169), impinge on the second external mirror (3552).

Both the first external mirror (3551) and the second external mirror (3552) are preferably extended such that light emitted from each pumped region on the laser bar (3500) impinges on one of the external mirrors. Each of the gain chips forming the array of FIG. 35 is preferably set such that without external mirrors, the losses are sufficiently high, and each of the gain chips operates not as a laser, but as a light-emitting diode. In the embodiment of the present invention of FIG. 35 this is achieved by depositing an antireflecting coat on a front facet of the array.

The first external mirror (3551) is preferably selected such that it is not transparent or only weakly transparent for light impinging on the mirrors at a tilt angle, wherein the tilt angle refers to the side lobes of the far-field pattern of each single pumped region, e.g. side lobes (3111), (3117), (3611), (3617), and is semi-transparent for the light impinging at a normal incidence (3114) and (3164). The light beam (3114) is partially transmitted (3534) through the external mirror (3551). The light beam (3164) is partially transmitted (3584) through the external mirror (3551). The external mirror (3551) is preferably formed of a multilayer dielectric structure.

The second external mirror (3552) is preferably selected such that it is not transparent for both the light impinging on the mirror at a tilt angle, where the tilt angle refers to the side lobes of the far-field pattern of each single pumped region, e.g. side lobes (3113), (3119), (3163), (3169), and for the light impinging at a normal incidence (3116) and (3166). The external mirror (3552) is preferably formed of a multilayer structure.

The external mirrors combine two functionalities. First, the mirrors reduce the optical output loss. Second, the mirrors provide a positive feedback between the neighboring pumped regions. Preferably, the mirrors are selected such that the positive feedback occurs and the optical output loss is significantly reduces such that the overall gain overcomes the overall loss only for the single lateral optical mode which is the lateral fundamental optical mode for the whole array of lasers. Thus, the system comprising an array of gain chips and an external mirror is capable to emit coherent laser light in a single lateral optical mode achieving a very high output power. As the array of provides a very narrow lateral far field, it also provides a very high output power density. Particular selection of the external mirrors (3551) and (3552) allows obtaining a single-lobe emission from the field coupled laser bar (3500).

Figure 36:
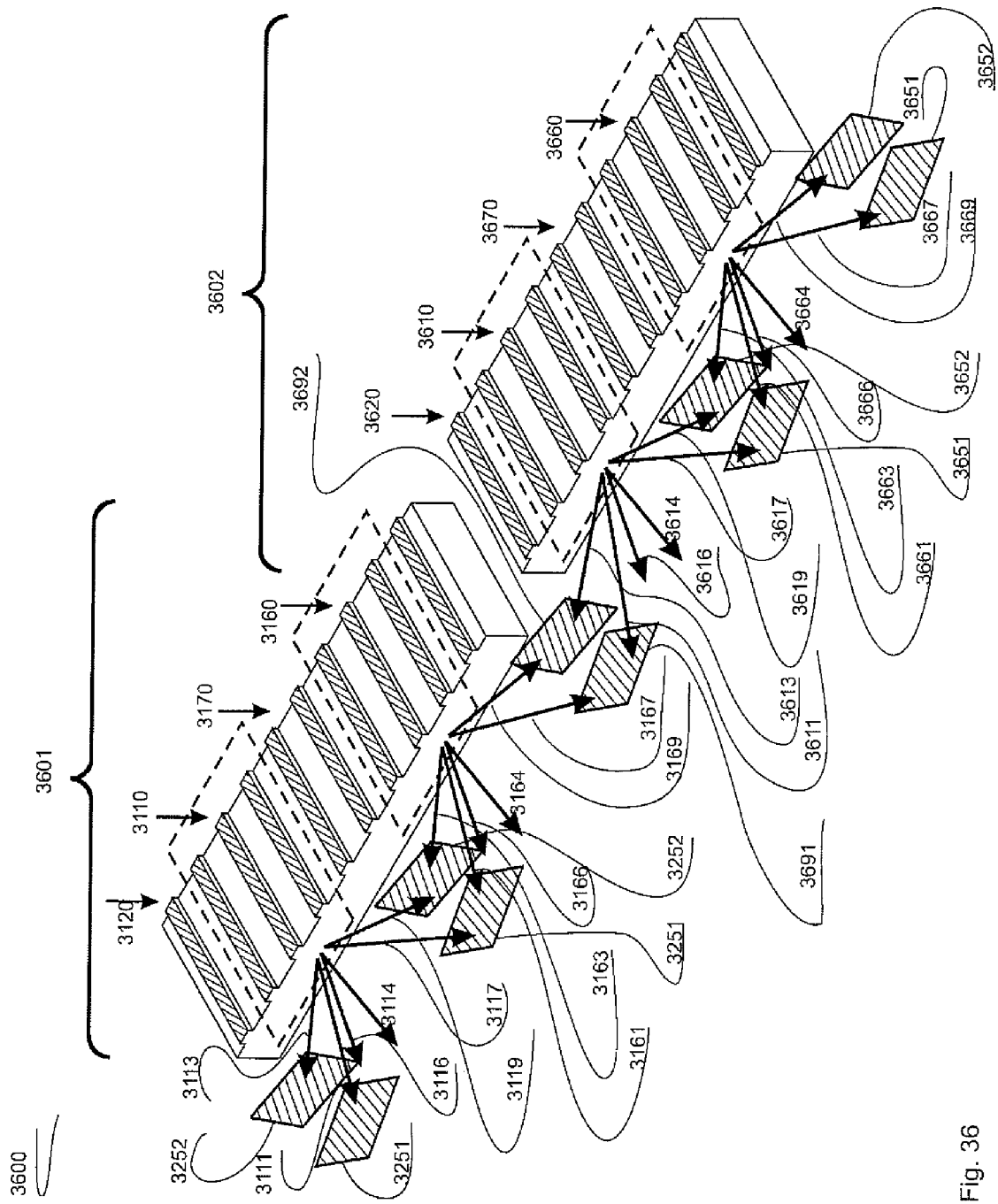
FIG. 36. Schematic diagram showing a prospective view of a system comprising a lateral array of multiple bars and an array of external mirrors forming a single lateral mode of the emitted laser light, according to one another embodiment of the present invention.

FIG. 36 shows a schematic diagram showing a prospective view of a system (3600) comprising an array of multiple bars of lasers and an array of external mirrors forming a single lateral mode of the emitted laser light, according to another embodiment of the present invention. The system of the embodiment of FIG. 36 comprises multiple, at least two bars, each of which further comprises an array of lasers formed on a separate epitaxial wafer. Each laser bar is similar to the embodiment of FIG. 32.

Two bars (3601) and (3602) are shown in FIG. 36. On the first array (3601), two pumped regions (3110) and (3160) and two unpumped regions (3120) and (3170) are shown. The pumped region (3110) emits light in three lobes directed downwards, (3111), (3114), and (3117) and three lobes directed upwards, (3113), (3116), and (3119). The pumped region (3160) emits light in three lobes directed downwards, (3161), (3164), and (3167) and three lobes directed upwards, (3163), (3166), and (3169).

Light, emitted by from the neighboring pumped regions in the downward side lobes, is coupled via external mirrors (3251). It is shown in FIG. 36, that light emitted from the pumped region (3110) in the side lobe (3117) and light emitted from the pumped region (3160) in the side lobe (3161) impinge on the same external mirror (3251).

Light, emitted by from the neighboring pumped regions in the upwards side lobes, is coupled via external mirrors (3252). It is shown in FIG. 36, that light emitted from the pumped region (3110) in the side lobe (3119) and light emitted from the pumped region (3160) in the side lobe (3163) impinge on the same external mirror (3252).

Similarly, on the first array (3602), two pumped regions (3610) and (3660) and two unpumped regions (3620) and (3670) are shown. The pumped region (3610) emits light in three lobes directed downwards, (3611), (3614), and (3617) and three lobes directed upwards, (3613), (3616), and (3619). The pumped region (3660) emits light in three lobes directed downwards, (3661), (3664), and (3667) and three lobes directed upwards, (3663), (3666), and (3669).

Light, emitted by from the neighboring pumped regions in the downward side lobes, is coupled via external mirrors (3651). It is shown in FIG. 36, that light emitted from the pumped region (3610) in the side lobe (3617) and light emitted from the pumped region (3660) in the side lobe (3661) impinge on the same external mirror (3651).

Light, emitted by from the neighboring pumped regions in the upwards side lobes, is coupled via external mirrors (3652). It is shown in FIG. 36, that light emitted from the pumped region (3610) in the side lobe (3619) and light emitted from the pumped region (3660) in the side lobe (3663) impinge on the same external mirror (3652).

The system (3600) comprises, in addition to the external mirrors coupling the light emitted by the neighboring pumped regions on the same bar, further external mirrors coupling light emitted by the pumped regions located on different, but neighboring bars. In FIG. 36, two external mirrors are shown that couple light emitted by one pumped region on the first bar and one pumped region on the second bar. Light emitted by the pumped region (3160) on the first bar (3601) in the downward side lobe (3167) and light emitted by the pumped region (3610) on the second bar (3602) in the downward side lobe (3611) impinge on the same external mirror (3691). Light emitted by the pumped region (3160) on the first bar (3601) in the upward side lobe (3169) and light emitted by the pumped region (3610) on the second bar (3602) in the upward side lobe (3613) impinge on the same external mirror (3692).

The external mirrors are selected such that the positive feedback occurs and the optical output loss is significantly reduces such that the overall gain overcomes the overall loss only for the single lateral optical mode which is the lateral fundamental optical mode for the whole system comprising a plurality of bars. Thus, the system is capable to emit coherent laser light in a single lateral optical mode achieving a very high output power. As the system of laser bars provides a very narrow lateral far field, it also provides a very high output power density.

The overall width of the laser array of the embodiment of FIG. 36 is no longer limited by the diameter of a single epitaxial wafer. The extension of such array can be up to 10 meters or more. Such systems are capable to emit laser light in a single vertical single lateral mode at output power up to 1 kW continuous wave operation.

Figure 37:
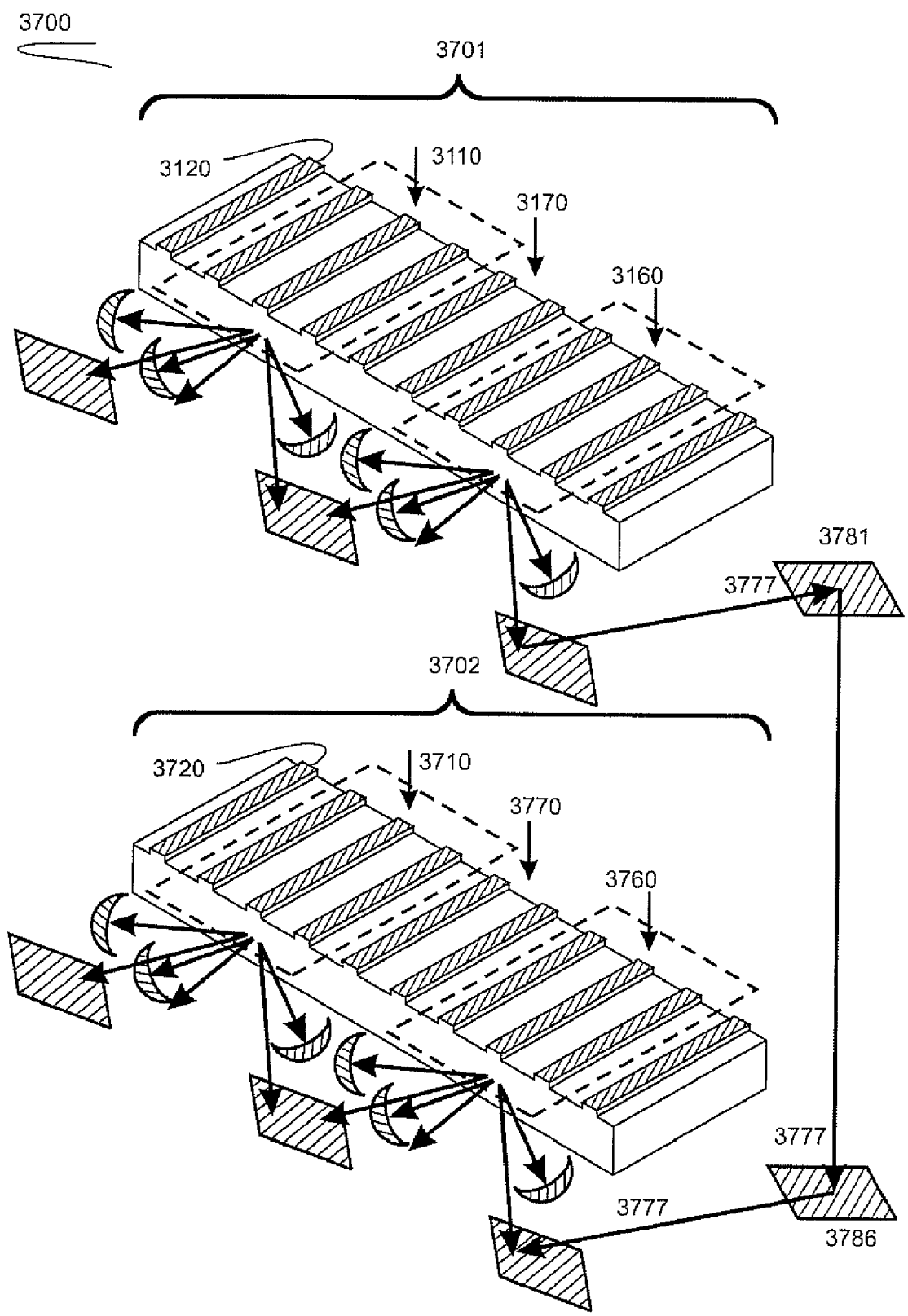
FIG. 37. Schematic diagram showing a prospective view of a system comprising a stack of multiple bars and an array of external mirrors forming a single mode of the emitted laser light, according to yet another embodiment of the present invention.

FIG. 37 shows a schematic diagram showing a prospective view of a system comprising a stack (3700) of multiple bars of gain chips and an array of external mirrors forming a single vertical single lateral mode of the emitted laser light, according to yet another embodiment of the present invention. The system (3700) of the embodiment of FIG. 37 comprises multiple, at least two bars, each of which further comprises an array of gain chips formed on a separate epitaxial wafer. Two bars (3701) and (3702) are shown in FIG. 37. Each array of gain chips is similar to the embodiment of FIG. 33. On the first bar (3701), two pumped regions (3110) and (3160) and two unpumped regions (3120) and (3170) are shown. On the second bar (3702), two pumped regions (3710) and (3760), and two unpumped regions (3720) and (3770) are shown. Light emitted by each gain chip in an upward direction impinges on a collecting mirror and is reflected back. Light emitted by the neighboring chips in side downward lobes impinges on the same external mirror, thus providing an optical coupling between neighboring chips.

The system (3700), comprises, in addition to the external mirrors coupling the light emitted by the neighboring pumped regions on the same bar, further specially selected external mirrors coupling light emitted by the pumped regions located on different, but neighboring bars forming the stack. In FIG. 13 two external mirrors (3781) and (3786) are shown that couple light emitted by one pumped region on the first bar and one pumped region on the second bar. The optical path (3777) of light connecting-two neighboring bars (3701) and (3702) is shown schematically. The external mirrors are selected such that the positive feedback occurs and the optical output loss is significantly reduces such that the overall gain overcomes the overall loss only for the single optical mode. This is preferably both the lateral fundamental optical mode and the vertical fundamental mode for the whole system comprising a plurality of bars forming a stack. Thus, the system is capable to emit coherent laser light in a single optical mode achieving a very high output power. Such stacks are capable to emit laser light in a single vertical single lateral mode at output power up to 1 kW continuous wave operation. As the laser stack provides an ultra-narrow lateral far field, as well as an ultra-narrow narrow vertical far field, it also provides a very high output power density, enabling an ultrahigh brightness laser system.

A further embodiment of the present invention is possible, wherein a plurality of stacks of the laser bars is further optically coupled in the lateral plane by means of additional sets of external mirrors. Such an embodiment combines those of FIGS. 36 and 37. The laser system is capable to emit coherent laser light in a single optical mode achieving even a higher output power.

In another embodiment of the present invention, each of the optoelectronic devices forming a laser system further comprises a lateral photonic band crystal formed of lateral flared waveguides, as is described in the embodiment of FIG. 30. An additional set of external mirrors provides the positive feedback for the fundamental lateral optical mode of the entire system, thus allowing the system to emit coherent single lateral mode laser light.

A further embodiment of the present invention is possible, wherein each gain chip emits light not in a single lateral optical mode, but in a plurality of lateral modes. The different lateral optical modes have different effective angles at which light impinges on the external mirrors. External mirrors are selected such that the reflectivity is sensitive to the angle of incidence of impinging light, and the positive feedback sufficient for the lasing, occurs only for one lateral optical mode of the laser system.

It should be emphasized once again that the effective interaction between stripes and the formation of the coherent optical field across the entire laser structure and, moreover, across the entire array of lasers, and, moreover, across the entire array of laser bars requires preferably a broad vertical waveguide emitting light in a single vertical optical mode. In the embodiments described so far the vertical waveguide comprises at least two coupled cavities, and the vertical mode selection is due to phase matching conditions which are met for one vertical optical mode only. Other embodiments of the present invention are possible a broad vertical waveguide is just a large optical cavity having a thickness preferably larger than three times the wavelength of light in the vacuum and having a high refractive index, the cavity being sandwiched between a bottom cladding layer and a top cladding layer, wherein both cladding layers have refractive indices lower than that of the cavity. The bottom cladding layer ensures an effective decay of the vertical optical mode such that it has only a negligible intensity in the substrate. Substrate is contiguous to the bottom cladding layer from the side opposite to the waveguide. Bottom contact is mounted on the back side of the substrate, which is opposite to the bottom cladding layer. A lateral photonic band crystal is formed on the top cladding layer by means of lithography including selective etching, deposition of dielectric and/or metal, annealing etc.

In yet another embodiment of the present invention, a broad vertical waveguide of each gain chip emits light in a plurality of vertical optical modes, and selection of a single vertical mode is provided by external mirrors.

One another embodiment of the present invention is possible, where the processing used in the formation of a lateral photonic band crystal includes not only the top cladding layer, but also a part of the waveguide. In yet another embodiment of the present invention, a multilayer structure operates as a top cladding layer, and this multilayer structure is selectively etched in the process of the formation of the lateral photonic band crystal. In all these cases one can define a top cladding layer such that i) all processing affects only the top cladding layer, and the waveguide remains untouched, and ii) the top cladding layer can be either a single epitaxial layer, or a multilayer structure.

Under this definition, the active medium is located within the waveguide and is not affected by the processing of the top cladding layer. One another embodiment is possible, wherein the active medium is etched through. This is not preferred in the case of quantum well laser, as etching creates a high defect density, wherein defects act as centers of non-radiative recombination severely deteriorating the optical performance of the device. In the case of quantum dot laser, the active medium can be etched through, and the device can still operate. Thus, one can describe the device of the present disclosure as a device wherein the active region is located either within the waveguide, or within the top cladding layer.

One can also define the vertical extension of the vertical optical mode as a distance at which 90% of the optical power is concentrated.

Figure 38:
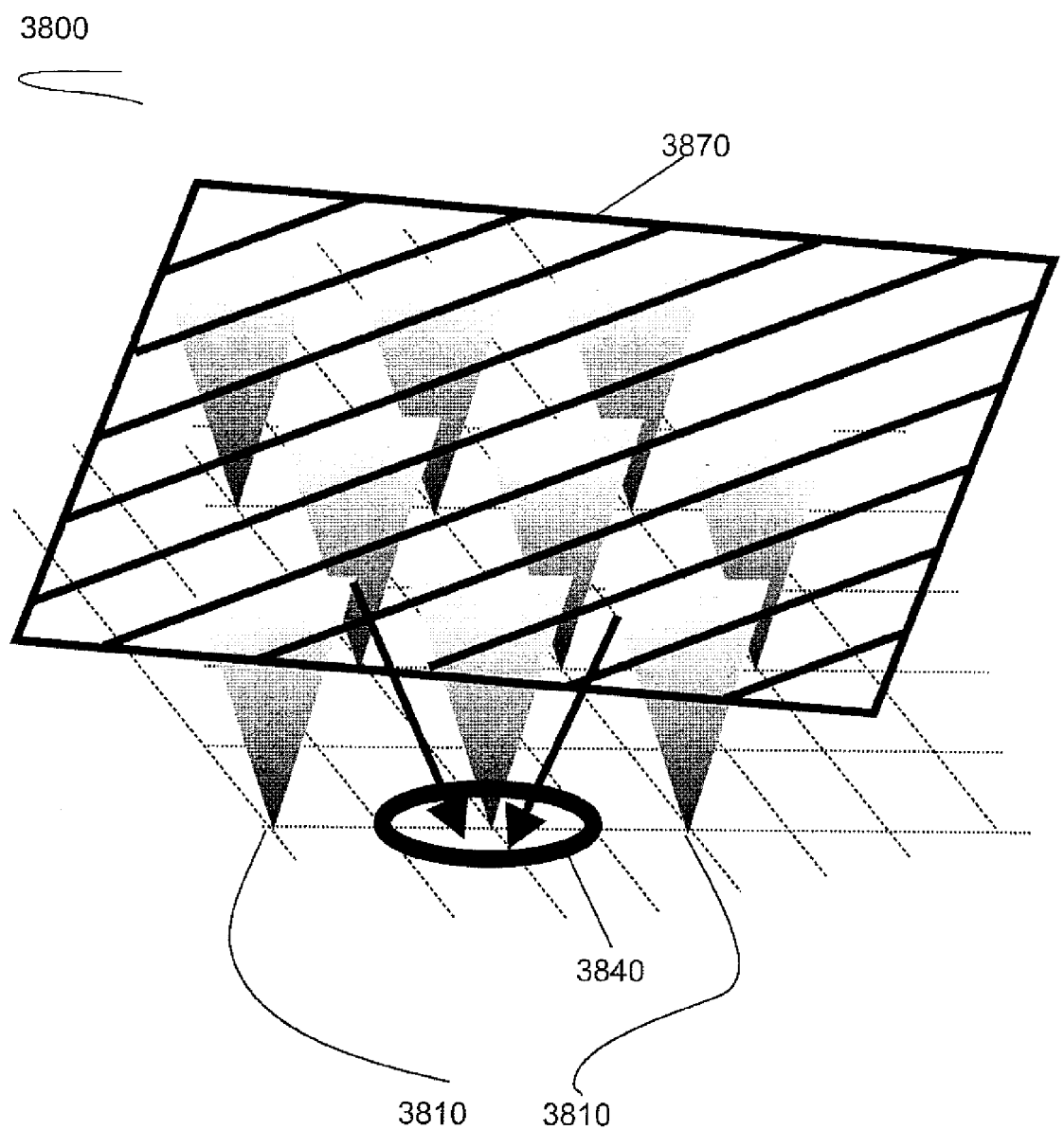
FIG. 38. Schematic diagram showing a prospective view of a system comprising a two-dimensional array of gain chips, each of which has a broad output optical aperture, and an external mirror forming a single lateral mode of the emitted laser light, according to a further embodiment of the present invention.

In further embodiments of the present invention, the external mirror or external mirrors couple optically not a one-dimensional, but a two-dimensional array of gain chips. FIG. 38 shows a schematic diagram showing a prospective view of a system comprising a two-dimensional array of gain chips (3810), each of which has a broad output optical aperture (3840), and an external mirror (3870). Preferably the output optical aperture is broader than three times the wavelength of the emitted light in the vacuum. The gain chips can be realized as an array of stacked laser bars. In another embodiment, the gain chips are realized as vertical cavity surface emitting lasers. In yet another embodiment, the gain chips are realized as resonant cavity light emitting diodes.

The gain chips and the external mirror are selected such that the positive feedback necessary for lasing occurs for only one optical mode of the array. This promotes a single mode lasing from an extremely broad array of gain chips.

Thus, the system comprising an array of gain chips and an external mirror is capable to emit coherent laser light in a single lateral optical mode achieving a very high output power. As the array of gain chips provides a very narrow lateral far field, it also provides a very high output power density.

In another embodiment of the present invention, each of the gain chips forming an array operates as a superluminescent light emitting diode. In yet another embodiment of the present invention, each of the gain chips operates as a diode laser. In the latter embodiment, an external mirror or an array of external mirrors provides the positive feedback such, that the minimum optical loss occurs for only one optical mode of entire system, thus providing lasing in a single optical mode.

In yet another embodiment of the present invention, a plurality of external mirrors is set such that the lasing occurs in only a single mode of a two-dimensional array of gain chips.

In a further embodiment of the present invention, a system comprises a one-dimensional array of vertical cavity surface-emitting lasers, or a one-dimensional array of resonant cavity light-emitting diodes, and an array of external mirrors, all selected such that the system provides a single mode laser light.

In another embodiment of the present invention, a two-dimensional array of multiple bars of gain chips comprises bars, stacked in the vertical direction. An array of external mirrors preferably comprises external mirrors placed in the planes located between the planes of the neighboring bars. A broad vertical waveguide, enabling selection of a single vertical mode is also preferred for this embodiment. It is also preferred, that each optoelectronic device emits light having a two-lobe or a three-lobe vertical far field pattern, to ensure an efficient coupling between optoelectronic devices located in the neighboring planes.

In the U.S. Pat. No. 6,928,099, entitled "APPARATUS FOR AND METHOD OF FREQUENCY CONVERSION", filed Feb. 19, 2003, issued Aug. 9, 2005, by the inventors of the present invention, wherein this patent is incorporated herein by a reference, a laser having a broad vertical waveguide is suggested for use as a source of a primary light in intracavity frequency conversion system. An advantage is using a narrow beam to obtain a high optical power density in the non-linear crystal. The same advantage exists also for narrow lateral beam lasers of the present disclosure, based on a lateral photonic band crystal. Thus, a single-lateral mode laser based on a lateral photonic band crystal can operate effectively as a source of a primary light in an intracavity frequency conversion system.

Figure 39:
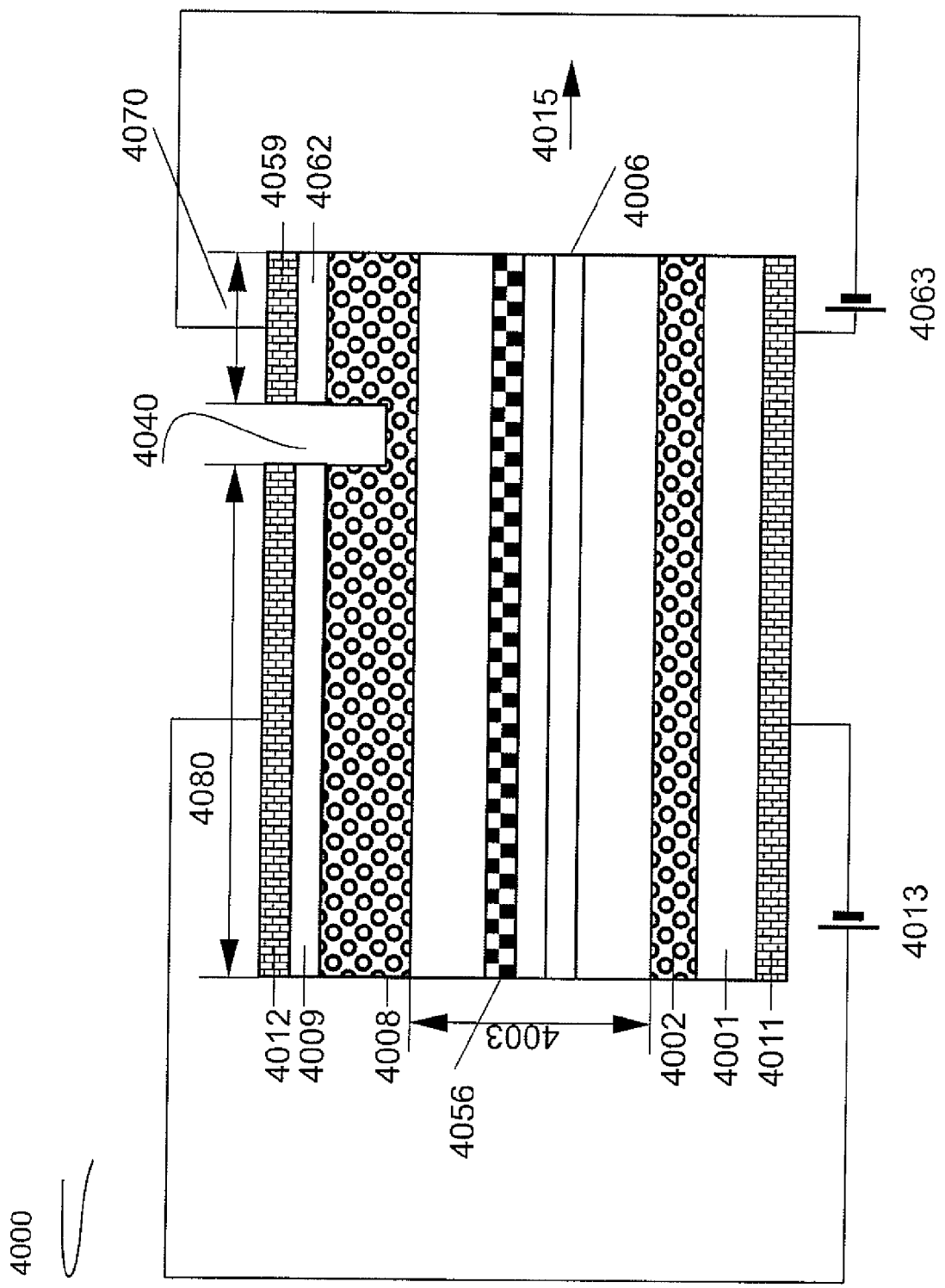
FIG. 39. Schematic cross-sectional view of a laser employing electrooptical modulation of the wavelength of the emitted laser light, for speckle reduction, according to yet another embodiment of the present invention.

High-power diode laser and laser systems providing a narrow beam, both vertical and lateral, can be used as light sources for red-green-blue (RGB) modules for projection television. In this case one of the major problems for application of high-power narrow beam lasers in TV remains speckle. To obtain a high-quality light source for TV, certain means for speckle reduction are of high importance. The present invention suggests using electrooptical effect for speckle reduction. The laser (4000) of the embodiment of FIG. 39 additionally comprises an electrooptical modulator. The laser (4000) is grown epitaxially on a substrate (4001) and comprises a bottom cladding layer (4002), a waveguide (4003), a top cladding layer (4008), and a contact layer. The waveguide further comprises an active region (4006) and a modulator region (4056). The bottom contact (4011) is mounted on the back side of the substrate (4001).

The laser (4000) comprises an active section (4080) and a modulator section (4070). The two sections are separated by a trench (4040) formed by the etching of a contact layer, and partial etching of the top cladding layer. The top contact is mounted separately in the two sections. The contact (4012) is mounted on the contact layer (4009) in the active section (4080), and a contact (4062) is mounted on the contact layer (4059) in the modulator section (4070).

The device (4000) operates as follows. In the active section (4070), a forward bias (4013) is applied to the active medium. In the modulator section (4080), a reverse bias (4063) is applied to the active medium. The modulator (4056) is selected such that under reverse bias refractive index is modulated due to electrooptical effect. Then, the wavelength of the longitudinal optical modes which corresponds to the resonance wavelengths of the Fabri-Pérot resonator also changes. The laser operates at such a current that the modulator section is made transparent enough by the absorption saturation effect at the lasing wavelength. Modulating the bias voltage in the modulator section results in frequency modulation of the wavelength of emitted laser light. The coherence of the emitted laser light remains high resulting in efficient frequency conversion and thus, in efficient generating of green and blue optical signals. At the same time changes in the wavelength within the wavelength acceptance range of the non-linear crystal will cause corresponding reduction of the laser speckle effect due to the eye-averaging effect.

Figure 40:
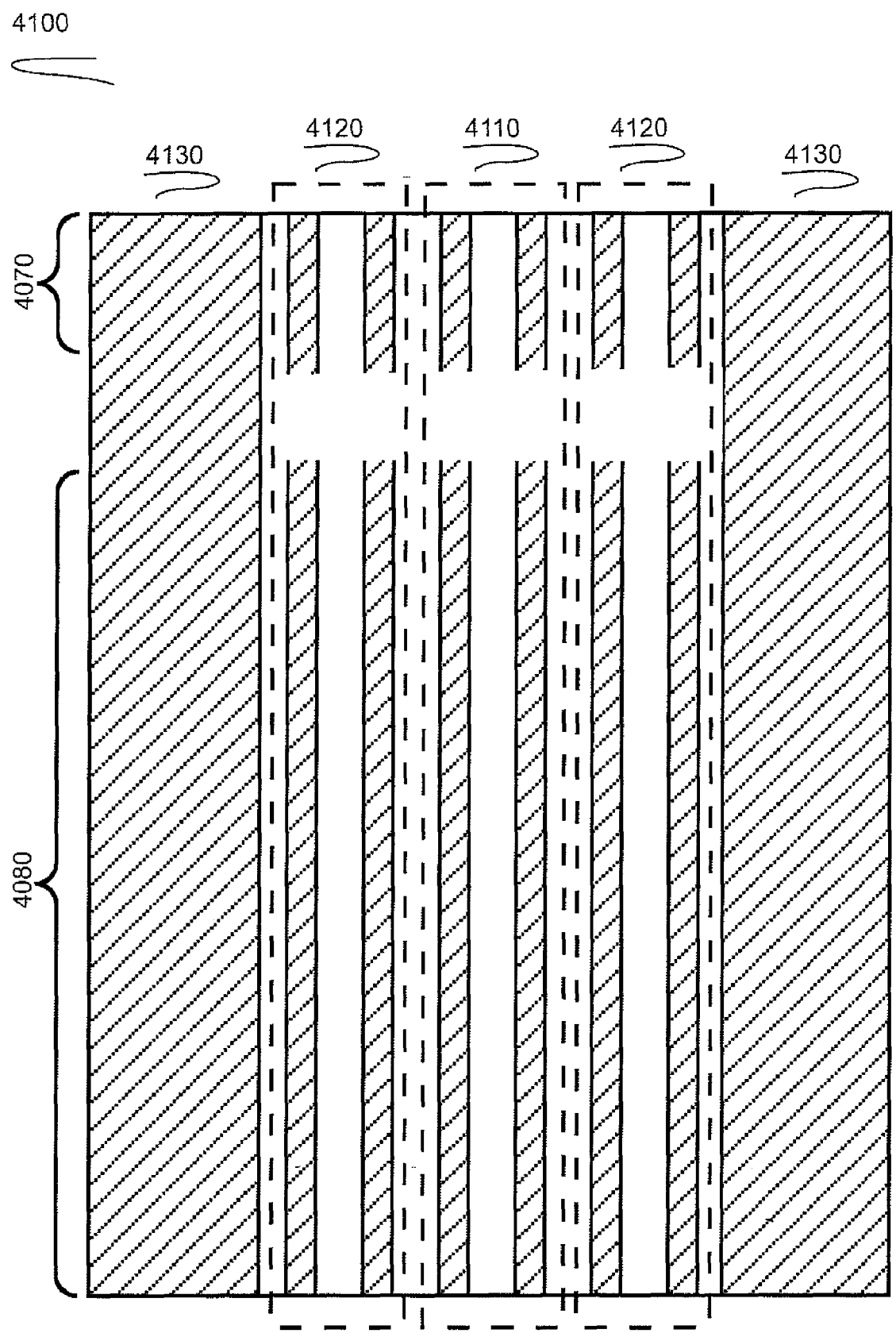
FIG. 40. Top view of a laser of the embodiment of FIG. 39.

In order to enhance the output laser power, the concept illustrated in FIG. 40 can be employed in a laser having a broad vertical waveguide and coupled cavity geometry enabling the vertical mode selection based on the phase matching conditions, combined with the lateral mode selection based on a lateral photonic band crystal. FIG. 40 shows schematically a top view of the laser (4100) comprising an electrooptical modulator, showing a lateral photonic band crystal on top of the laser, where (4110) is a pumped section, (4120) marks unpumped sections, and (4130) denotes side leaky regions. The laser of this embodiment allows high power single vertical mode single lateral mode operation and, at the same time, an effective speckle reduction.

In yet another embodiment of the present invention, additional set of epitaxial layers form the modulator section. Preferably the modulator is formed by multiple quantum wells, in which the exciton absorption peak under zero bias is located from the high-energy (short wavelength) side from the photon energy corresponding to the wavelength of the emitted laser light. Then, upon an applied reverse bias, electrooptical effect occurs. In quantum wells electrooptical effect manifests itself as Quantum Confined Stark Effect. Variation of the refractive index of the modulator results in frequency modulation of the wavelength of the emitted laser light, which leads to speckle reduction.

One another embodiment of the present invention is possible, where a lateral photonic band crystal and an optical defect are formed on the top surface of a light-emitting diode, and the optical defect is formed by selective pumping of the active medium. If the lateral photonic band crystal and the optical defect are selected properly, a single lateral mode radiation from the light-emitting diode is possible.

And yet another embodiment of the present invention is possible, wherein a light-emitting diode operates as a superluminescent light-emitting diode.

An optoelectronic device operating as a light emitting diode or as a superluminescent light emitting diode typically operates in a multimode regime. The selection of a preferred vertical mode and the selection of a preferred lateral mode can occur also in this case, which means that a major part of the emitted optical power is emitted in the preferred mode. The mode selection may be considered an effective one, if at least eighty percent of the total optical power is emitted in the preferred optical mode.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable subcombination.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the feature set out in the appended claims.

What is claimed is:

1. A semiconductor optoelectronic device, comprising:
   a vertical waveguide comprising:
     a first cavity;
     a first reflector located at a first side of said first cavity;
     a second reflector located at a second side of said first cavity opposite to said first reflector;
     at least one second cavity located at a side of said second reflector opposite to said first cavity; and
     at least one third reflector located at a side of said at least one second cavity opposite to said first cavity;
   a light-generating element capable of generating optical gain when an injection current is injected into said light-generating element when a forward bias is applied, wherein said light-generating element is located in a position selected from a group consisting of:
     a position within said first cavity;
     a position within said first reflector; and
     a position within said second reflector;
   a substrate, wherein a relative positioning of said vertical waveguide and said substrate is selected from three alternatives:
     said at least one second cavity is the substrate and said at least one third reflector is a back surface of the substrate;
     said at least one second cavity is a single layer or a multilayer epitaxial structure and said at least one third reflector is the substrate; and
     said at least one second cavity is a single layer or a multilayer epitaxial structure, said at least one third reflector is a single layer or a multilayer epitaxial structure, and the substrate is located contiguous to said vertical waveguide;
   a lateral waveguide formed on said vertical waveguide on a side opposite to the substrate, wherein said lateral waveguide ensures refractive index modulation in at least one of two directions in the lateral plane;
   means for injecting said injection current to said light-generating element,
   wherein light generated in said light-generating element propagates in said first cavity and partially leaks to said at least one second cavity through said second reflector;
   wherein light leaked to said at least one second cavity propagates in said second cavity, is reflected by said at least one third reflector, propagates in said at least one second cavity, and returns back to said first cavity through said second reflector;
   wherein interference between light propagating in said first cavity and light returning from said at lease one second cavity occurs;
   wherein phase matching conditions determine one selected vertical optical mode or a few selected vertical optical modes;
   wherein said vertical waveguide is a broad waveguide having a thickness exceeding three times the wavelength of light in a vacuum;
   wherein a major part of the optical power is emitted in said one or a few selected vertical optical modes;
   wherein said major part of the optical power emitted in said one or a few selected vertical optical modes is above eighty percent;
   wherein said lateral waveguide is a broad waveguide having a width exceeding five times the wavelength of light in a vacuum;

wherein said lateral waveguide is selected such that a major part of the optical power is emitted in one selected lateral optical mode or in a few selected lateral optical modes; and wherein said major part of the optical power emitted in said one selected lateral optical mode or a few selected lateral optical modes is above eighty percent.

2. The semiconductor optoelectronic device of claim 1, wherein said means for injecting said injection current to said light-generating element include a set of contacts including:
   a bottom contact located on a back side of the substrate; and
   a top contact mounted on the side of said vertical waveguide opposite to the substrate, wherein said top contact is mounted by one of the following methods:
      selective mounting of said top contact; and
      mounting of said top contact on an entire top surface of said vertical waveguide, wherein said set of contacts provides injection current to said light-generating element, when a forward bias is applied.

3. The semiconductor optoelectronic device of claim 1, wherein the semiconductor optoelectronic device is selected from a group consisting of:
   a light-emitting diode;
   a superluminescent light-emitting diode;
   a gain chip; and
   a diode laser.

4. The semiconductor optoelectronic device of claim 1, wherein the one or a few selected vertical optical modes comprises one selected vertical optical mode.

5. The semiconductor optoelectronic device of claim 4, wherein the one selected vertical optical mode is a fundamental vertical optical mode.

6. The semiconductor optoelectronic device of claim 1, wherein the one or a few selected lateral optical modes comprises one selected lateral optical mode.

7. The semiconductor optoelectronic device of claim 6, wherein the one selected lateral optical mode is a fundamental lateral optical mode.

8. The semiconductor optoelectronic device of claim 1, wherein said lateral waveguide further comprises:
   at least one pumped region, wherein optical gain is generated in said light-generating element in said at least one pumped region, when a forward bias is applied; and
   at least one unpumped region, wherein the light-generating element in said at least one unpumped region remains absorbing, when a forward bias is applied.

9. The semiconductor optoelectronic device of claim 8, wherein said light in said one or a few selected lateral optical modes returning back to said first cavity overlaps with said at least one pumped region stronger than said light in the rest of the lateral optical modes.

10. The semiconductor optoelectronic device of claim 8, wherein phase matching conditions between light propagating along said lateral waveguide within said at least one pumped region, and light leaking in the lateral plane to said at least one unpumped region, reflected back and returning to said at least one pumped region, are met for one or a few selected lateral optical modes.

11. The semiconductor optoelectronic device of claim 1, wherein said lateral optical waveguide further comprises:
   a lateral photonic band crystal formed on a top of said vertical waveguide, wherein said lateral photonic band crystal ensures refractive index modulation in at least one of two directions in the lateral plane; and
   an optical defect of said lateral photonic band crystal.

12. The semiconductor optoelectronic device of claim 11, wherein said refractive index modulation in at least one of two directions in the lateral plane is modulation in one direction.

13. The semiconductor optoelectronic device of claim 12, wherein said modulation in one direction is a periodic modulation.

14. The semiconductor optoelectronic device of claim 13, wherein said periodic modulation is provided by a means selected from a group consisting of:
   a) formation of a periodic sequence of ridge stripes;
   b) depositing metal contacts on a top of ridge stripes;
   c) depositing dielectric between ridge stripes;
   d) selective diffusion of impurity;
   e) selective ion implantation;
   f) selective annealing of the device; and
   g) any combination and repetition of a) through f).

15. The semiconductor optoelectronic device of claim 12, wherein said one selected lateral optical mode has an advantage with respect to other lateral optical modes in a feature selected from a group of features consisting of:
   a) a larger optical confinement factor;
   b) a larger model gain;
   c) a smaller leakage loss;
   d) a smaller absorption loss; and
   e) any combination of a) through d).

16. The semiconductor optoelectronic device of claim 12, further comprising:
   a leakage reservoir formed on the top of said vertical waveguide on at least en-one side from said lateral photonic band crystal with a predominantly pumped central part.

17. The semiconductor optoelectronic device of claim 16, wherein said leakage reservoir is formed by a means selected from a group consisting of:
   formation of a broad ridge without a contact; and
   using proton or ion bombardment, thus creating an electrically insulating area under said leakage reservoir, in which injection current does not flow through said light-generating layer.

18. The semiconductor optoelectronic device of claim 12, wherein said refractive index modulation in one direction is periodic except in at least one region of said lateral photonic band crystal, wherein said region is selected specially to enhance leakage loss of all lateral optical modes except said one selected lateral optical mode.

19. The semiconductor optoelectronic device of claim 15, wherein said one selected lateral optical mode is a fundamental lateral optical mode.

20. The semiconductor optoelectronic device of claim 19, wherein a lateral far-field pattern of said fundamental lateral optical mode is a predominantly single-lobe pattern, and wherein at least eighty percent of the emitted optical power is concentrated within said single-lobe.

21. The semiconductor optoelectronic device of claim 15, wherein said one selected lateral optical mode is a high-order lateral optical mode.

22. The semiconductor optoelectronic device of claim 21, wherein a far-field pattern of said high-order lateral optical mode is a predominantly two-lobe pattern, and wherein at least eighty percent of the emitted optical power is concentrated within said two lobes.

23. The semiconductor optoelectronic device of claim 3, wherein the semiconductor optoelectronic device operates as a primary light source for an intracavity frequency conversion system.

24. The semiconductor optoelectronic device of claim 10, wherein said refractive index modulation in at least one of two directions in the lateral plane is modulation in two directions, and wherein said semiconductor optoelectronic device operates as a wavelength-stabilized distributed feedback laser.

25. The semiconductor optoelectronic device of claim 2, further comprising:
an electrooptical modulator element capable of modulating the wavelength of the emitted laser light, when an additional bias is applied to said electrooptical modulator element.

26. The semiconductor optoelectronic device of claim 25, wherein said modulation of the wavelength of the emitted laser light is used for speckle reduction.

27. The semiconductor optoelectronic device of claim 3, wherein the semiconductor optoelectronic device operates as a wavelength stabilized semiconductor diode laser.

28. A optoelectronic device, comprising:
a vertical waveguide further comprising:
a first cavity;
a first reflector located at a first side of said first cavity;
a second reflector located at a second side of said first cavity opposite to said first reflector;
at least one second cavity located at a side of said second reflector opposite to said first cavity; and
at least one third reflector located at a side of said second cavity opposite to said first cavity; and
b) a light-generating element capable of generating primary light when an injection current is injected into said light-generating element when a forward bias is applied, wherein said light-generating element is located in a position selected from a group consisting of:
a position within said first cavity;
a position within said first reflector;
a position within said second reflector;
a position at a boundary between said first cavity and said first reflector; or
a position at a boundary between said first cavity and said second reflector; and
a substrate, where the wherein a relative positioning of said vertical waveguide and said substrate is selected from three alternatives:
said at least one second cavity is the substrate and said at least one third reflector is a back surface of the substrate;
said at least one second cavity is a single layer or a multilayer epitaxial structure and said at least one third reflector is the substrate; and
said at least one second cavity is a single layer or a multilayer epitaxial structure, said at least one third reflector is a single layer or a multilayer epitaxial structure, and the substrate is located contiguous to said vertical waveguide;
a non-linear element capable of frequency conversion; and
means for injecting said injection current to said light-generating element, wherein said means for injecting includes a set of contacts including
a bottom contact located on a back side of the substrate; and
a top contact mounted on a side of said vertical waveguide opposite to the substrate, wherein said non-linear element capable of frequency conversion is a material of at least one layer comprising said vertical waveguide.

29. The semiconductor optoelectronic device of claim 28, wherein at least one optical mode of said vertical waveguide at a wavelength obtained via frequency conversion of said generated primary light has a low loss such that said semiconductor optoelectronic device is capable of emitting light at the wavelength obtained via frequency conversion.

30. The semiconductor optoelectronic device of claim 29, further comprising:
a rear facet;
a front facet;
a highly reflecting coat for primary light on said rear facet;
a highly reflecting coat for primary light on said front facet; and
a highly reflecting coat deposited on said rear facet for light at the wavelength obtained via frequency conversion of said generated primary light.

31. The semiconductor optoelectronic device of claim 29, wherein said wavelength obtained via frequency conversion of said generated primary light is the wavelength of a second harmonic of said generated primary light.

32. A semiconductor laser system, comprising:
an array of semiconductor optoelectronic devices further comprising at least two semiconductor optoelectronic devices, wherein said array of semiconductor optoelectronic devices is selected from a group consisting of:
a one-dimensional array, wherein said one-dimensional array defines one direction of the array; and
a two-dimensional array, wherein said two-dimensional array defines two directions of the array,
wherein said semiconductor optoelectronic devices are capable to emit of emitting light;
wherein at least one of said semiconductor optoelectronic devices comprises a broad vertical waveguide;
wherein said broad vertical waveguide has a thickness exceeding three times the wavelength of light in a vacuum; and
wherein said array of semiconductor optoelectronic devices emits light such that light emitted by a first of said at least two semiconductor optoelectronic devices is not coherent with light emitted by a second of said at least two semiconductor optoelectronic devices; and
at least one external mirror, wherein said array of semiconductor optoelectronic devices and said at least one external mirror are selected such that said semiconductor laser system emits coherent laser light in a single optical mode defined in said one direction or said two directions of said array of semiconductor optoelectronic devices.

33. The semiconductor laser system of claim 32,
wherein at least one of said semiconductor optoelectronic devices comprises a broad lateral waveguide; and
wherein said broad lateral waveguide has a width exceeding at least five times the wavelength of the emitted light in a vacuum.

34. The semiconductor laser system of claim 32, wherein said array of semiconductor optoelectronic devices is a one-dimensional array of semiconductor optoelectronic devices.

35. The semiconductor laser system of claim 34, wherein a far-field pattern of said coherent laser light in said coherent optical mode in said one direction of the array is selected from a group consisting of:
a single-lobe pattern, wherein at least eighty percent of the output optical power is concentrated in said single lobe;
a two-lobe pattern, wherein at least eighty percent of the output optical power is concentrated in said two lobes; and
a three-lobe pattern, wherein at least eighty percent of the output optical power is concentrated in said three lobes.

36. The semiconductor laser system of claim 35,
wherein a beam divergence of said coherent laser light in said single optical mode in said single lobe in said one direction of the array or in each of said two single lobes in said one direction of the array or in each of said three single lobes in said one direction of the array does not exceed two degrees; and wherein said beam divergence is defined as the full width at half maximum.

37. The semiconductor laser system of claim 32, wherein said array of semiconductor optoelectronic devices is a two-dimensional array of semiconductor optoelectronic devices.

38. The semiconductor laser system of claim 37, wherein the far-field pattern of said coherent laser light in said single optical mode is selected from a group consisting of:
  a single-lobe far field pattern, wherein at least eighty percent of the output optical power is concentrated in said single lobe; and
  a multi-lobe pattern, selected from a group consisting of:
    a two-lobe far field pattern;
    a three-lobe far field pattern;
    a four-lobe pattern; and
    a six-lobe far field pattern, wherein at least eighty percent of the output optical power is concentrated in said number of lobes.

39. The semiconductor laser system of claim 38, wherein a beam divergence of said coherent laser light in said single optical mode in said single lobe in each of said two directions of the array or in each of said number of lobes of said multi-lobe pattern in each of said two directions of the array does not exceed two degrees; and
  wherein said beam divergence is defined as the full width at half maximum.

40. The semiconductor laser system of claim 32, wherein at least one semiconductor optoelectronic device of the at least two semiconductor optoelectronic devices comprises:
  an edge-emitting semiconductor optoelectronic device.

41. The semiconductor laser system of claim 40, wherein said edge-emitting semiconductor optoelectronic device is selected from a group consisting of:
  an edge-emitting light-emitting diode;
  an edge-emitting superluminescent light-emitting diode;
  an edge-emitting gain chip;
  an edge-emitting diode laser;
  an edge-emitting tilted cavity diode laser; and
  a distributed feedback edge-emitting diode laser.

42. The semiconductor laser system of claim 40, wherein said broad vertical waveguide of said edge-emitting semiconductor optoelectronic device comprises:
  a first cavity;
  a first reflector located at a first side of said first cavity;
  a second reflector located at a second side of said first cavity opposite to said first reflector;
  at least one second cavity located at a side of said second reflector opposite to said first cavity; and
  at least one third reflector located at a side of said second cavity opposite to said first cavity, wherein said edge-emitting semiconductor optoelectronic device further comprises:
  a light-generating element capable of generating optical gain when an injection current is injected into said light-generating element when a forward bias is applied, wherein said light-generating element is located in a position selected from a group consisting of:
    a position within said first cavity;
    a position within said first reflector; and
    a position within said second reflector; and
  a substrate, wherein a relative positioning of said vertical waveguide and said substrate is selected from three alternatives:
    said at least one second cavity is the substrate and said at least one third reflector is a back surface of the substrate;
    said at least one second cavity is a single layer or a multilayer epitaxial structure and said at least one third reflector is the substrate; and
    said at least one second cavity is a single layer or a multilayer epitaxial structure, said at least one third reflector is a single layer or a multilayer epitaxial structure, and the substrate is located contiguous to said vertical waveguide; and
  a lateral waveguide formed on said vertical waveguide on the side opposite to the substrate, wherein said lateral waveguide ensures refractive index modulation in at least one of two directions in the lateral plane;
  means for injecting said injection current into said light-generating element, wherein said means for injecting includes a set of contacts including:
    a bottom contact located on a back side of the substrate; and
    a top contact mounted on a side of said vertical waveguide opposite to the substrate,
  wherein light generated in said light-generating element propagates in said first cavity and partially leaks to said at least one second cavity through said second reflector;
  wherein light leaked to said at least one second cavity propagates in said at least one second cavity, is reflected by said at least one third reflector, propagates in said at least one second cavity and returns back to said first cavity through said second reflector;
  wherein interference between light propagating in said first cavity and light returning from said at least one second cavity occurs;
  wherein phase matching conditions determine one selected vertical optical mode or a few selected vertical optical modes;
  wherein a major part of the optical power is emitted in said one or a few selected vertical optical modes;
  wherein said major part of the optical power emitted in said one or a few selected vertical optical modes is above eighty percent;
  wherein said lateral waveguide is a broad waveguide having a width exceeding five times the wavelength of light in a vacuum;
  wherein said lateral waveguide is selected such that a major part of the optical power is emitted in one selected lateral optical mode or a few selected lateral optical modes; and
  wherein said major part of the optical power emitted in said one selected lateral optical mode or a few selected lateral optical modes is above eighty percent.

43. The semiconductor laser system of claim 42, wherein said modulation of the refractive index in at least one of two directions in the lateral plane is provided by a means selected from a group consisting of:
  i) formation of a sequence of ridge stripes;
  ii) depositing metal contacts on a top of ridge stripes;
  iii) depositing dielectric between ridge stripes;
  iv) selective diffusion of impurity;
  v) selective ion implantation;
  vi) selective annealing the device; and
  vii) any combination and repetition of i) through vi).

44. The semiconductor laser system of claim 43, wherein said refractive index modulation in at least one of two directions in the lateral plane is modulation in one direction.

45. The semiconductor laser system of claim 44, wherein said modulation in one direction is a periodic lateral photonic band crystal comprising a lateral optical defect.

46. The semiconductor laser system of claim 45, wherein said lateral optical defect is formed by a means selected from a group consisting of:
   formation of a refractive index profile in the lateral plane capable of localizing lateral optical modes; and
   selective pumping of said lateral waveguide by injecting current into said light-generating element within a part of said lateral waveguide.

47. The semiconductor laser system of claim 46,
   wherein said lateral photonic band crystal is formed by a periodic sequence of ridges; and
   wherein said lateral optical defect comprises at least one ridge, that is broader than the ridges of said lateral photonic band crystal.

48. The semiconductor laser system of claim 42, wherein the one or a few selected vertical optical modes comprises one selected vertical optical mode.

49. The semiconductor laser system of claim 48, wherein the one selected vertical optical mode is a fundamental vertical optical mode.

50. The semiconductor laser system of claim 42, wherein the one or a few selected lateral optical modes comprises one selected lateral optical mode.

51. The semiconductor laser system of claim 50, wherein the one selected lateral optical mode is a fundamental lateral optical mode.

52. The semiconductor laser system of claim 50, wherein said one selected lateral optical mode has an advantage with respect to other lateral optical modes in a feature selected from a group of features consisting of:
   a) a larger optical confinement factor;
   b) a larger modal gain;
   c) a smaller leakage loss;
   d) a smaller absorption loss; and
   e) any combination of a) through d).

53. The semiconductor laser system of claim 45, wherein said lateral waveguide further comprises a leakage reservoir formed on a top of a top cladding layer on at least one side from said lateral photonic band crystal with a predominantly pumped central part.

54. The semiconductor laser system of claim 53, wherein said leakage reservoir is formed by a means selected from a group consisting of:
   formation of a broad ridge without a contact; and
   using proton or ion bombardment, thus creating an electrically insulating area under said leakage reservoir, in which injection current does not flow through said light-generating element.

55. The semiconductor laser system of claim 51, wherein a lateral far-field pattern of said fundamental lateral optical mode is a predominantly single-lobe pattern, and wherein at least eighty percent of the optical power emitted by said at least one optoelectronic device in said fundamental lateral optical mode is concentrated within said single lobe.

56. The semiconductor laser system of claim 50, wherein said single lateral optical mode is a high-order lateral optical mode.

57. The semiconductor laser system of claim 56, wherein a lateral far-field pattern of said high-order lateral optical mode is a predominantly two-lobe pattern, and wherein at least eighty percent of the optical power emitted by said at least one optoelectronic device in said one lateral optical mode is concentrated within said two lobes.

58. The semiconductor laser system of claim 32, wherein all semiconductor optoelectronic devices forming said array of semiconductor optoelectronic devices are located on a single epitaxial wafer.

59. The semiconductor laser system of claim 32, wherein all semiconductor optoelectronic devices forming said array of semiconductor optoelectronic devices are located on at least two different epitaxial wafers.

60. The semiconductor laser system of claim 59, wherein all said semiconductor optoelectronic devices forming said array of semiconductor optoelectronic devices located on said at least two different epitaxial wafers are located in one geometrical plane.

61. The semiconductor laser system of claim 59, wherein a first of at least two different epitaxial wafers and a second of at least two different epitaxial wafers form a stack.

62. The semiconductor laser system of claim 42,
   wherein said refractive index modulation in at least one of two directions in the lateral plane is modulation in two directions, and
   wherein said semiconductor optoelectronic device emits wavelength-stabilized light, such that said semiconductor laser system operates as a wavelength-stabilized laser system.

63. The semiconductor laser system of claim 32, wherein the semiconductor laser system operates as a primary light source for frequency conversion system.

64. The semiconductor laser system of claim 63, wherein said frequency conversion system is an intracavity frequency conversion system.

65. The semiconductor optoelectronic device of claim 1, wherein said light-generating element is positioned within said first cavity at a position immediately at an inner surface of said first reflector.

66. The semiconductor optoelectronic device of claim 1, wherein said light-generating element is positioned within said first cavity at a position immediately at an inner surface of said second reflector.

67. The semiconductor optoelectronic device of claim 28, wherein said light-generating element is positioned within said first cavity at a position immediately at an inner surface of said first reflector.

68. The semiconductor optoelectronic device of claim 28, wherein said light-generating element is positioned within said first cavity at a position immediately at an inner surface of said second reflector.

69. The semiconductor laser system of claim 42, wherein said light-generating element is positioned within said first cavity at a position immediately at an inner surface of said first reflector.

70. The semiconductor laser system of claim 42, wherein said light-generating element is positioned within said first cavity at a position immediately at an inner surface of said second reflector.

* * * * *